United States Patent
Rohena et al.

(10) Patent No.: US 12,099,386 B2
(45) Date of Patent: Sep. 24, 2024

(54) THERMAL MANAGEMENT SYSTEM FOR ELECTRONIC DEVICE

(71) Applicant: MAGIC LEAP, INC., Plantation, FL (US)

(72) Inventors: Guillermo Padin Rohena, Coral Springs, FL (US); Adam Carl Wright, Ft. Lauderdale, FL (US); William Chow, Boca Raton, FL (US); Gary Quartana, Jr., Parkland, FL (US); Humberto Eduardo Garcia, Davie, FL (US); Jose Felix Rodriguez, Hialeah, FL (US); Matthew Thomas Hull, Parkland, FL (US); Paul Daniel Lindquist, Plantation, FL (US)

(73) Assignee: MAGIC LEAP, INC., Plantation, FL (US)

( * ) Notice: Subject to any disclaimer, the term of this patent is extended or adjusted under 35 U.S.C. 154(b) by 310 days.

(21) Appl. No.: 16/519,716

(22) Filed: Jul. 23, 2019

(65) Prior Publication Data
US 2020/0033921 A1    Jan. 30, 2020

Related U.S. Application Data

(60) Provisional application No. 62/702,831, filed on Jul. 24, 2018.

(51) Int. Cl.
*G06F 1/20* (2006.01)
*G05B 15/02* (2006.01)
(Continued)

(52) U.S. Cl.
CPC ............ *G06F 1/206* (2013.01); *G05B 15/02* (2013.01); *G06F 1/203* (2013.01);
(Continued)

(58) Field of Classification Search
None
See application file for complete search history.

(56) References Cited

U.S. PATENT DOCUMENTS

| 1,921,218 A | 8/1933 | Colby |
| 4,385,911 A | 5/1983 | Popeil et al. |

(Continued)

FOREIGN PATENT DOCUMENTS

| CN | 104566757 A | 4/2015 |
| CN | 105190450 A | 12/2015 |

(Continued)

OTHER PUBLICATIONS

Invitation to Pay Additional Fees for PCT Application No. PCT/US2019/043001, mailed Sep. 18, 2019.
(Continued)

*Primary Examiner* — Mohammad Ali
*Assistant Examiner* — Saad M Kabir
(74) *Attorney, Agent, or Firm* — Seed IP Law Group LLP

(57) ABSTRACT

Various embodiments relate to a thermal management system for an electronic device, such as an augmented reality or virtual reality device. The thermal management system can comprise an active cooling mechanism in various embodiments to dynamically or actively cool components of the device, for example, by adjust fan speeds of a fan assembly. In some embodiments, a hardware shutdown mechanism can be provided to shut down the device if software-based thermal management devices are inoperable. In some embodiments, the air flow into and/or within the electronic device can be adjusted to cool various components of the device.

20 Claims, 43 Drawing Sheets

(51) Int. Cl.
 H02H 1/00 (2006.01)
 H02H 5/04 (2006.01)
 H05K 7/20 (2006.01)

(52) U.S. Cl.
 CPC ............ H02H 1/0007 (2013.01); H02H 5/04 (2013.01); H05K 7/20172 (2013.01); H05K 7/20209 (2013.01)

(56) References Cited

U.S. PATENT DOCUMENTS

| | | | |
|---|---|---|---|
| 5,914,629 | A | 6/1999 | Maki |
| 5,993,060 | A | 11/1999 | Sakurai |
| 6,349,864 | B1 | 2/2002 | Lee |
| 6,561,762 | B1 | 5/2003 | Horng et al. |
| 6,850,221 | B1 | 2/2005 | Tickle |
| 7,961,471 | B2 | 6/2011 | Odanaka et al. |
| 8,712,598 | B2 * | 4/2014 | Dighde .................. G06F 1/206 700/300 |
| 9,081,426 | B2 | 7/2015 | Armstrong |
| 9,215,293 | B2 | 12/2015 | Miller |
| 9,348,143 | B2 | 5/2016 | Gao et al. |
| 9,417,452 | B2 | 8/2016 | Schowengerdt et al. |
| 9,470,906 | B2 | 10/2016 | Kaji et al. |
| 9,547,174 | B2 | 1/2017 | Gao et al. |
| 9,671,566 | B2 | 6/2017 | Abovitz et al. |
| 9,740,006 | B2 | 8/2017 | Gao |
| 9,791,700 | B2 | 10/2017 | Schowengerdt et al. |
| 9,851,563 | B2 | 12/2017 | Gao et al. |
| 9,857,591 | B2 | 1/2018 | Welch et al. |
| 9,874,749 | B2 | 1/2018 | Bradski |
| 10,037,062 | B1 * | 7/2018 | Bhopte .............. H05K 7/20209 |
| 2002/0154483 | A1 | 10/2002 | Homer et al. |
| 2004/0146405 | A1 | 7/2004 | Hung |
| 2006/0028436 | A1 | 2/2006 | Armstrong |
| 2007/0081123 | A1 | 4/2007 | Lewis |
| 2009/0290307 | A1 | 11/2009 | Hwang et al. |
| 2010/0142146 | A1 | 6/2010 | Hwang et al. |
| 2011/0046812 | A1 | 2/2011 | Hansen et al. |
| 2011/0194223 | A1 | 8/2011 | Kang et al. |
| 2011/0228477 | A1 | 9/2011 | Hong |
| 2011/0263200 | A1 | 10/2011 | Thornton et al. |
| 2012/0127062 | A1 | 5/2012 | Bar-Zeev et al. |
| 2012/0162549 | A1 | 6/2012 | Gao et al. |
| 2013/0044129 | A1 | 2/2013 | Latta et al. |
| 2013/0082922 | A1 | 4/2013 | Miller |
| 2013/0117377 | A1 | 5/2013 | Miller |
| 2013/0125027 | A1 | 5/2013 | Abovitz |
| 2013/0208234 | A1 | 8/2013 | Lewis |
| 2013/0242262 | A1 | 9/2013 | Lewis |
| 2013/0292481 | A1 | 11/2013 | Filson et al. |
| 2014/0002750 | A1 | 1/2014 | Hamada |
| 2014/0071539 | A1 | 3/2014 | Gao |
| 2014/0177023 | A1 | 6/2014 | Gao et al. |
| 2014/0183957 | A1 * | 7/2014 | Duchesneau ......... F01K 13/006 307/64 |
| 2014/0218468 | A1 | 8/2014 | Gao et al. |
| 2014/0267420 | A1 | 9/2014 | Schowengerdt |
| 2014/0294621 | A1 | 10/2014 | Narita |
| 2014/0306866 | A1 | 10/2014 | Miller et al. |
| 2015/0016777 | A1 | 1/2015 | Abovitz et al. |
| 2015/0103306 | A1 | 4/2015 | Kaji et al. |
| 2015/0115060 | A1 | 4/2015 | Klemm et al. |
| 2015/0178939 | A1 | 6/2015 | Bradski et al. |
| 2015/0205126 | A1 | 7/2015 | Schowengerdt |
| 2015/0222883 | A1 | 8/2015 | Welch |
| 2015/0222884 | A1 | 8/2015 | Cheng |
| 2015/0238141 | A1 | 8/2015 | Lai |
| 2015/0268415 | A1 | 9/2015 | Schowengerdt et al. |
| 2015/0302652 | A1 | 10/2015 | Miller et al. |
| 2015/0309263 | A2 | 10/2015 | Abovitz et al. |
| 2015/0326570 | A1 | 11/2015 | Publicover et al. |
| 2015/0346490 | A1 | 12/2015 | TeKolste et al. |
| 2015/0346495 | A1 | 12/2015 | Welch et al. |
| 2016/0011419 | A1 | 1/2016 | Gao |
| 2016/0026156 | A1 | 1/2016 | Jackson et al. |
| 2016/0026253 | A1 | 1/2016 | Bradski et al. |
| 2016/0098138 | A1 | 4/2016 | Park et al. |
| 2016/0128229 | A1 | 5/2016 | Pallasmaa et al. |
| 2016/0255748 | A1 | 9/2016 | Kim et al. |
| 2017/0347498 | A1 | 11/2017 | Janak et al. |
| 2018/0053284 | A1 | 2/2018 | Rodriguez et al. |
| 2018/0136703 | A1 | 5/2018 | Woods et al. |
| 2018/0232021 | A1 * | 8/2018 | Perchlik .................. G06F 1/203 |
| 2018/0249025 | A1 | 8/2018 | Nakayama et al. |
| 2018/0348826 | A1 | 12/2018 | Aguirre et al. |
| 2018/0348828 | A1 * | 12/2018 | Cavallaro ............... G06F 1/206 |
| 2019/0010866 | A1 * | 1/2019 | Snyder .................. H02K 11/33 |
| 2020/0383240 | A1 | 12/2020 | Rohena |

FOREIGN PATENT DOCUMENTS

| | | | |
|---|---|---|---|
| CN | 109863533 A | | 6/2019 |
| JP | 2001308999 A | | 11/2001 |
| JP | 2007194872 A | | 8/2007 |
| JP | 2009071516 A | | 4/2009 |
| JP | 2012168446 A | | 9/2012 |
| WO | 2016170717 A1 | | 10/2016 |
| WO | WO 2020/023491 | | 1/2020 |

OTHER PUBLICATIONS

International Search Report and Written Opinion for PCT Application No. PCT/US2019/043001, mailed Dec. 2, 2019.

International Preliminary Report on Patentability for PCT Application No. PCT/US2019/043001, issued Jan. 26, 2021.

ARToolKit: https://web.archive.org/web/20051013062315/http://www.hitl.washington.edu:80/artoolkit/documentation/hardware.htm, archived Oct. 13, 2005.

Azuma, "A Survey of Augmented Reality," Teleoperators and Virtual Environments 6, 4 (Aug. 1997), pp. 355-385. https://web.archive.org/web/20010604100006/http://www.cs.unc.edu/~azuma/ARpresence.pdf.

Azuma, "Predictive Tracking for Augmented Realty," TR95-007, Department of Computer Science, UNC—Chapel Hill, NC, Feb. 1995.

Bimber, et al., "Spatial Augmented Reality—Merging Real and Virtual Worlds," 2005 https://web.media.mit.edu/~raskar/book/BimberRaskarAugmentedRealityBook.pdf.

Jacob, "Eye Tracking in Advanced Interface Design," Human-Computer Interaction Lab Naval Research Laboratory, Washington, D.C. / paper/ in Virtual Environments and Advanced Interface Design, ed. by W. Barfield and T.A. Furness, pp. 258-288, Oxford University Press, New York (1995).

Tanriverdi and Jacob, "Interacting With Eye Movements in Virtual Environments," Department of Electrical Engineering and Computer Science, Tufts University, Medford, MA—paper/Proc. ACM CHI 2000 Human Factors in Computing Systems Conference, pp. 265-272, Addison-Wesley/ACM Press (2000).

* cited by examiner

THERMAL MANAGEMENT SYSTEM FOR ELECTRONIC DEVICE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 C.F.R. § 1.57. U.S. patent application Ser. No. 15/992,032, filed on May 29, 2018, is hereby incorporated by reference in its entirety and for all purposes.

BACKGROUND

Field

The field relates to a thermal management system for electronic devices, and in particular, for portable electronic devices (e.g., augmented reality or virtual reality devices).

Description of the Related Art

In various types of portable electronic devices, it can be challenging to sufficiently dissipate heat that is generated by on-board electronics and/or the power supply (e.g., batteries). Moreover, some thermal dissipation components may experience high mechanical loading conditions that can cause cyclic or other mechanical stresses and/or failure. It can be desirable to improve the dissipation of heat in electronic devices, and/or to improve the mechanical performance of such devices.

For example, in some embodiments, modern computing and display technologies have facilitated the development of systems for virtual reality and/or augmented reality experiences, wherein digitally reproduced images or portions thereof are presented to a user in a manner wherein they seem to be, or may be perceived to be, real. A virtual reality, or "VR", scenario typically involves presentation of digital or virtual image information without transparency to other actual real-world visual input; an augmented reality, or "AR", scenario typically involves presentation of digital or virtual image information as an augmentation to visualization of the actual world around the user.

Some VR or AR systems may include portable electronic devices that may be subject to the thermal and/or mechanical loads. Accordingly, there remains a continuing need for improved thermal and/or mechanical solutions for portable electronic devices, including those used in conjunction with VR or AR systems.

SUMMARY

In one embodiment, an electronic device is disclosed. The electronic device can comprise a temperature sensor configured to detect an over-temperature condition of the electronic device, the temperature sensor comprising an alert output terminal. A power supply can supply electrical power to a power input of the temperature sensor. A first transistor in electrical communication with the alert output terminal such that, when the alert output signal is activated by the temperature sensor, the first transistor causes the electronic device to shut down.

In another embodiment, an electronic device is disclosed. The electronic device can comprise a housing comprising processing electronics and an energy storage device. The electronic device can comprise a fan disposed in or coupled to the housing, the fan configured to cool the processing electronics and/or the energy storage device. The electronic device can comprise one or a plurality of temperature sensors disposed in or on the housing, the one or a plurality of temperature sensors configured to measure a corresponding one or plurality of temperatures at or near one or more of the processing electronics and the energy storage device. A portion of the processing electronics can be configured to compare the corresponding one or plurality of temperatures to predetermined temperature threshold(s) and, in response, to adjust a distribution of output flow of the fan.

In another embodiment, an electronic device is disclosed. The electronic device can comprise an enclosure and processing electronics within the enclosure. An inlet port can be provided in the enclosure to provide fluid communication between the processing electronics and the outside environs. A portion of the processing electronics can be configured to selectively and at least partially occlude one or more inlet ports of the plurality of inlet ports to adjust airflow through the electronic device.

In some embodiments, an electronic device is disclosed. The electronic device can comprise a housing comprising a first compartment in which a first electronic component is disposed. The housing can comprise a second compartment in which a second electronic component is disposed, one or both of the first and second electrical components electrically communicating with another component of the electronic device. The housing can comprise a connection portion extending between the first and second compartments. The first compartment can separated from the second compartment at a location spaced away from the connection portion by a gap to provide thermal separation between the first and second electronic components In some embodiments, a portable electronic device is disclosed. The portable electronic device comprises a housing and a battery disposed in the housing, the battery supplying power for at least a portion of the portable electronic device. The portable electronic device comprises electronic components for operating the portable electronic device, the electronic components disposed in the housing. The portable electronic device comprises a thermal mitigation assembly comprising a frame assembly. The frame assembly can comprise a shaft assembly having a first end and a second end opposite the first end, the first and second ends supported by the frame assembly. The frame assembly can comprise an impeller having fan blades coupled with a hub, the hub being coupled with the shaft assembly for rotation within the housing about a longitudinal axis of the shaft assembly. Loading transverse to the longitudinal axis of the shaft assembly can be controlled by the frame assembly at the second end of the shaft assembly. The thermal mitigation assembly removes heat generated from one or both of the battery and the electronic components.

In some embodiments, the housing comprises a first enclosure and a second enclosure, the electronic components and the thermal mitigation assembly disposed in the first enclosure and the battery disposed in the second enclosure.

In some embodiments, a fan assembly is disclosed. The fan assembly can include a first support frame, a shaft assembly having a first end coupled with the first support frame and a second end disposed away from the first end, and a second support frame coupled with the first support frame and disposed at or over the second end of the shaft assembly. An impeller can have fan blades coupled with a hub, the hub being disposed over the shaft assembly for rotation between the first and second support frames about a longitudinal axis. Transverse loading on the shaft assembly can be controlled by the first and second support frames.

In some embodiments, the second support frame comprises an airflow opening disposed about the longitudinal axis which extends between the first and second ends of the shaft assembly. A shaft support can be coupled with the second end of the shaft assembly, the shaft support being rigidly attached to the second support frame across the airflow opening. The shaft support can be supported at respective first and second portions of the second support frame, the respective first and second portions spaced apart about a periphery of the airflow opening. The first portion of the second support frame is generally on an opposite side of the airflow opening relative to the second portion of the second support frame. The shaft support is disposed in a rotational position of the airflow opening corresponding to a maximum of air flow when the impeller is operating. The shaft support comprises an elongate member between first and second ends thereof, the elongate member having an airfoil shape. The shaft support comprises an elongate member between the first and second ends thereof, the elongate member having varying width along the length thereof. The shaft support comprises an elongate member between the first and second ends thereof, the elongate member having varying thickness along the length thereof. The shaft assembly comprises a first shaft portion rotationally fixed to the first support frame and a second portion rotationally fixed to the impeller, the second portion being rotatable over a free end of the first shaft portion of the shaft assembly. The shaft assembly comprises an elongate member having a first end disposed on a first side of the impeller and a second end disposed on a second side of the impeller, the second side being opposite the first side. A concave member can be coupled with the second support frame and configured to rotationally support the second end of the elongate member. An additional concave member can be coupled with the first support frame and configured to rotationally support the first end of the elongate member. An airflow pathway of the fan assembly extends between the airflow opening disposed about the longitudinal axis and a second airflow opening having a face disposed about an axis non-parallel to the longitudinal axis. The axis non-parallel to the longitudinal axis is disposed generally perpendicular to the longitudinal axis and along a radial-extending axis of the impeller.

A fan assembly can include an enclosure supporting a shaft assembly at a first end, the shaft having a second end opposite the first end, and an impeller having fan blades coupled with a hub, the hub being coupled with the shaft for rotation within the enclosure about a longitudinal axis. Transverse loading on the shaft assembly can be controlled by the enclosure at the second end of the shaft assembly.

A fan assembly can comprise a housing comprising a shaft support and a shaft assembly supported by the shaft support. An impeller can be disposed in the housing and coupled with the shaft assembly, the impeller configured to rotate about a longitudinal axis of the shaft assembly. A first airflow opening can be disposed about the longitudinal axis. A second airflow opening having a face can be disposed about an axis non-parallel to the longitudinal axis. An airflow pathway of the fan assembly can extend between the first airflow opening and the second airflow opening. The shaft support can comprise an elongate member extending across at least a portion of the first airflow opening, the elongate member angularly positioned across the first airflow opening at an angle relative to the non-parallel axis that permits at least a local maximum of airflow through the first airflow opening.

In some embodiments, the angle relative to the non-parallel axis is acute. In some embodiments, the angle relative to the non-parallel axis is in a range of −45° to 45°. In some embodiments, the angle relative to the non-parallel axis is in a range of −30° to 30°.

In some embodiments, a method of manufacturing a fan assembly is disclosed. The method can include providing a fan assembly comprising a housing and an impeller disposed in the housing and coupled with a shaft assembly, the impeller configured to rotate about a longitudinal axis of the shaft assembly. A first airflow opening can be disposed about the longitudinal axis. A second airflow opening having a face disposed about an axis non-parallel to the longitudinal axis, wherein an airflow pathway of the fan assembly extends between the first airflow opening and the second airflow opening. The method can include computing an airflow profile through the fan assembly, and based on the computing, providing a shaft support to support an end of the shaft assembly, the shaft support comprising an elongate member extending across at least a portion of the first airflow opening.

In some embodiments, based on the computing, the method can comprise angularly positioning the elongate member at least partially across the first airflow opening at an angle relative to the non-parallel axis that permits at least a local maximum of airflow through the first airflow opening. In some embodiments, angularly positioning comprises orienting the angle relative to the non-parallel axis at an acute angle. In some embodiments, angularly positioning comprises orienting the angle relative to the non-parallel axis in a range of −45° to 45°. In some embodiments, angularly positioning comprises orienting the angle relative to the non-parallel axis in a range of −30° to 30°.

Details of one or more implementations of the subject matter described in this specification are set forth in the accompanying drawings and the description below. Other features, aspects, and advantages will become apparent from the description, the drawings, and the claims. Neither this summary nor the following detailed description purports to define or limit the scope of the inventive subject matter.

Throughout the drawings, reference numbers may be re-used to indicate correspondence between referenced elements. The drawings are provided to illustrate example embodiments described herein and are not intended to limit the scope of the disclosure.

DETAILED DESCRIPTION

Figure 1:
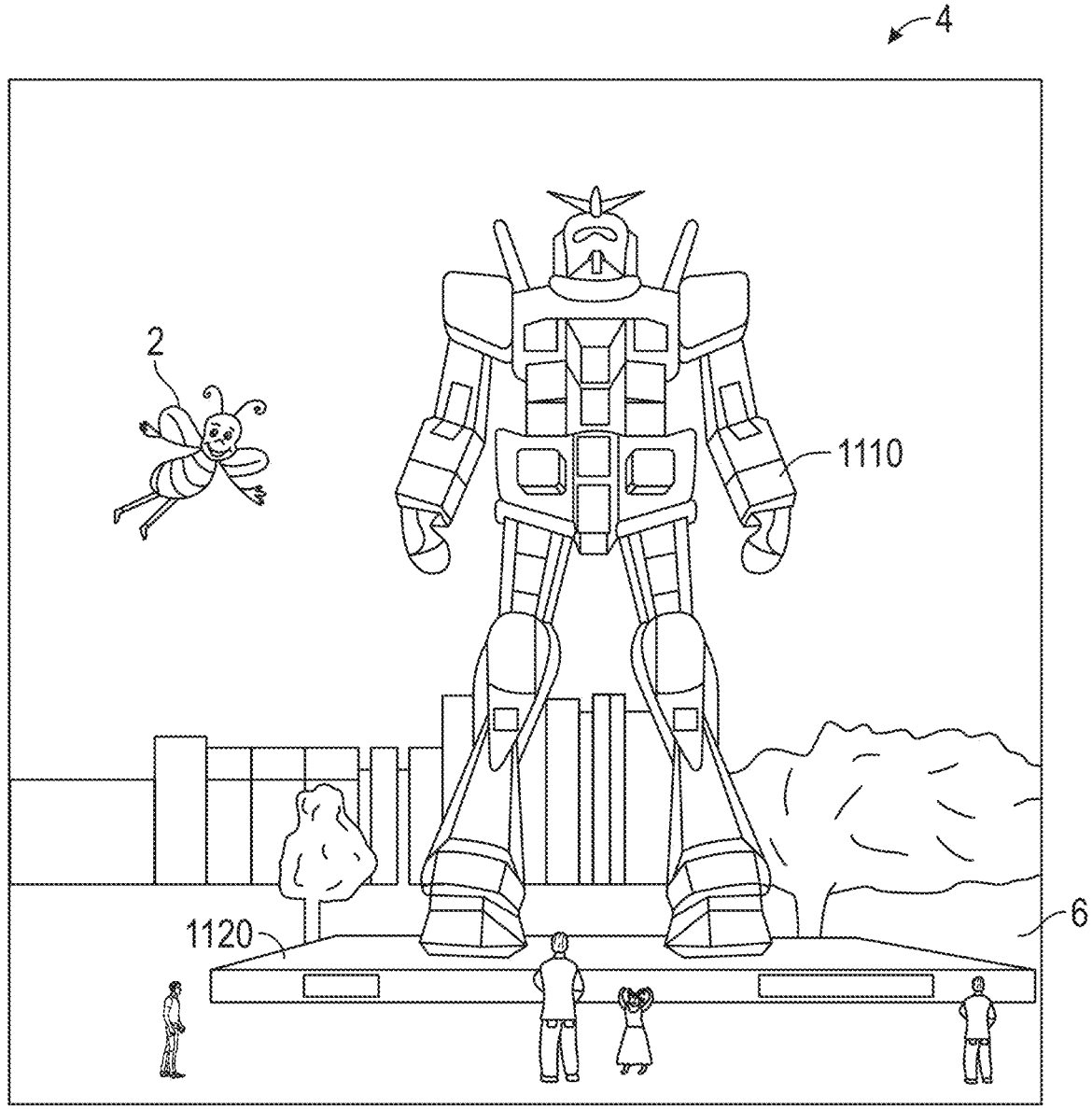
FIG. 1 depicts an illustration of an augmented reality scenario with certain virtual reality objects, and certain physical objects viewed by a person.

Various embodiments disclosed herein relate to a portable (e.g., wearable) electronic device. For example, in FIG. 1 an augmented reality scene 4 is depicted wherein a user of an AR technology sees a real-world park-like setting 6 featuring people, trees, buildings in the background, and a concrete platform 1120. In addition to these items, the user of the AR technology also perceives that he "sees" a robot statue 1110 standing upon the real-world platform 1120, and a cartoon-like avatar character 2 flying by which seems to be a personification of a bumble bee, even though these elements 2, 1110 do not exist in the real world. At least the elements 2, 1110 can be provided to the user at least in part by the portable (e.g., wearable) electronic devices disclosed herein. As it turns out, the human visual perception system is very complex, and producing a VR or AR technology that facilitates a comfortable, natural-feeling, rich presentation of virtual image elements amongst other virtual or real-world imagery elements is challenging.

For instance, head-worn AR displays (or helmet-mounted displays, or smart glasses) typically are at least loosely coupled to a user's head, and thus move when the user's head moves. If the user's head motions are detected by the display system, the data being displayed can be updated to take the change in head pose into account.

As an example, if a user wearing a head-worn display views a virtual representation of a three-dimensional (3D) object on the display and walks around the area where the 3D object appears, that 3D object can be re-rendered for each viewpoint, giving the user the perception that he or she is walking around an object that occupies real space. If the head-worn display is used to present multiple objects within a virtual space (for instance, a rich virtual world), measurements of head pose (e.g., the location and orientation of the user's head) can be used to re-render the scene to match the user's dynamically changing head location and orientation and provide an increased sense of immersion in the virtual space.

In AR systems, detection or calculation of head pose can facilitate the display system to render virtual objects such that they appear to occupy a space in the real world in a manner that makes sense to the user. In addition, detection of the position and/or orientation of a real object, such as handheld device (which also may be referred to as a "totem"), haptic device, or other real physical object, in relation to the user's head or AR system may also facilitate the display system in presenting display information to the user to enable the user to interact with certain aspects of the AR system efficiently. As the user's head moves around in the real world, the virtual objects may be re-rendered as a function of head pose, such that the virtual objects appear to remain stable relative to the real world. At least for AR applications, placement of virtual objects in spatial relation to physical objects (e.g., presented to appear spatially proximate a physical object in two- or three-dimensions) may be a non-trivial problem. For example, head movement may significantly complicate placement of virtual objects in a view of an ambient environment. Such is true whether the view is captured as an image of the ambient environment and then projected or displayed to the end user, or whether the end user perceives the view of the ambient environment directly. For instance, head movement will likely cause a field of view of the end user to change, which will likely require an update to where various virtual objects are displayed in the field of the view of the end user. Additionally, head movements may occur within a large variety of ranges and speeds. Head movement speed may vary not only between different head movements, but within or across the range of a single head movement. For instance, head movement speed may initially increase (e.g., linearly or not) from a starting point, and may decrease as an ending point is reached, obtaining a maximum speed somewhere between the starting and ending points of the head movement. Rapid head movements may even exceed the ability of the particular display or projection technology to render images that appear uniform and/or as smooth motion to the end user.

Head tracking accuracy and latency (e.g., the elapsed time between when the user moves his or her head and the time when the image gets updated and displayed to the user) have been challenges for VR and AR systems. Especially for display systems that fill a substantial portion of the user's visual field with virtual elements, it is advantageous if the accuracy of head-tracking is high and that the overall system latency is very low from the first detection of head motion to the updating of the light that is delivered by the display to the user's visual system. If the latency is high, the system can create a mismatch between the user's vestibular and visual sensory systems, and generate a user perception scenario that can lead to motion sickness or simulator sickness. If the system latency is high, the apparent location of virtual objects will appear unstable during rapid head motions.

In addition to head-worn display systems, other display systems can benefit from accurate and low latency head pose detection. These include head-tracked display systems in which the display is not worn on the user's body, but is, e.g., mounted on a wall or other surface. The head-tracked display acts like a window onto a scene, and as a user moves his head relative to the "window" the scene is re-rendered to match the user's changing viewpoint. Other systems include a head-worn projection system, in which a head-worn display projects light onto the real world.

Additionally, in order to provide a realistic augmented reality experience, AR systems may be designed to be interactive with the user. For example, multiple users may play a ball game with a virtual ball and/or other virtual objects. One user may "catch" the virtual ball, and throw the ball back to another user. In another embodiment, a first user may be provided with a totem (e.g., a real bat communicatively coupled to the AR system) to hit the virtual ball. In other embodiments, a virtual user interface may be presented to the AR user to allow the user to select one of many options. The user may use totems, haptic devices, wearable components, or simply touch the virtual screen to interact with the system.

Detecting head pose and orientation of the user, and detecting a physical location of real objects in space enable the AR system to display virtual content in an effective and enjoyable manner. However, although these capabilities are key to an AR system, but are difficult to achieve. In other words, the AR system can recognize a physical location of a real object (e.g., user's head, totem, haptic device, wearable component, user's hand, etc.) and correlate the physical coordinates of the real object to virtual coordinates corresponding to one or more virtual objects being displayed to the user. This generally requires highly accurate sensors and sensor recognition systems that track a position and orientation of one or more objects at rapid rates. Current approaches do not perform localization at satisfactory speed or precision standards.

Thus, there is a need for a better localization system in the context of AR and VR devices. Moreover, the continual and/or rapid movement of users can introduce various other problems into the electrical, thermal, and/or mechanical systems of such AR and/VR devices.

Referring to FIGS. 2A-2D, some general componentry options are illustrated. In the portions of the detailed description which follow the discussion of FIGS. 2A-2D, various systems, subsystems, and components are presented for addressing the objectives of providing a high-quality, comfortably-perceived display system for human VR and/or AR.

Figure 2A:
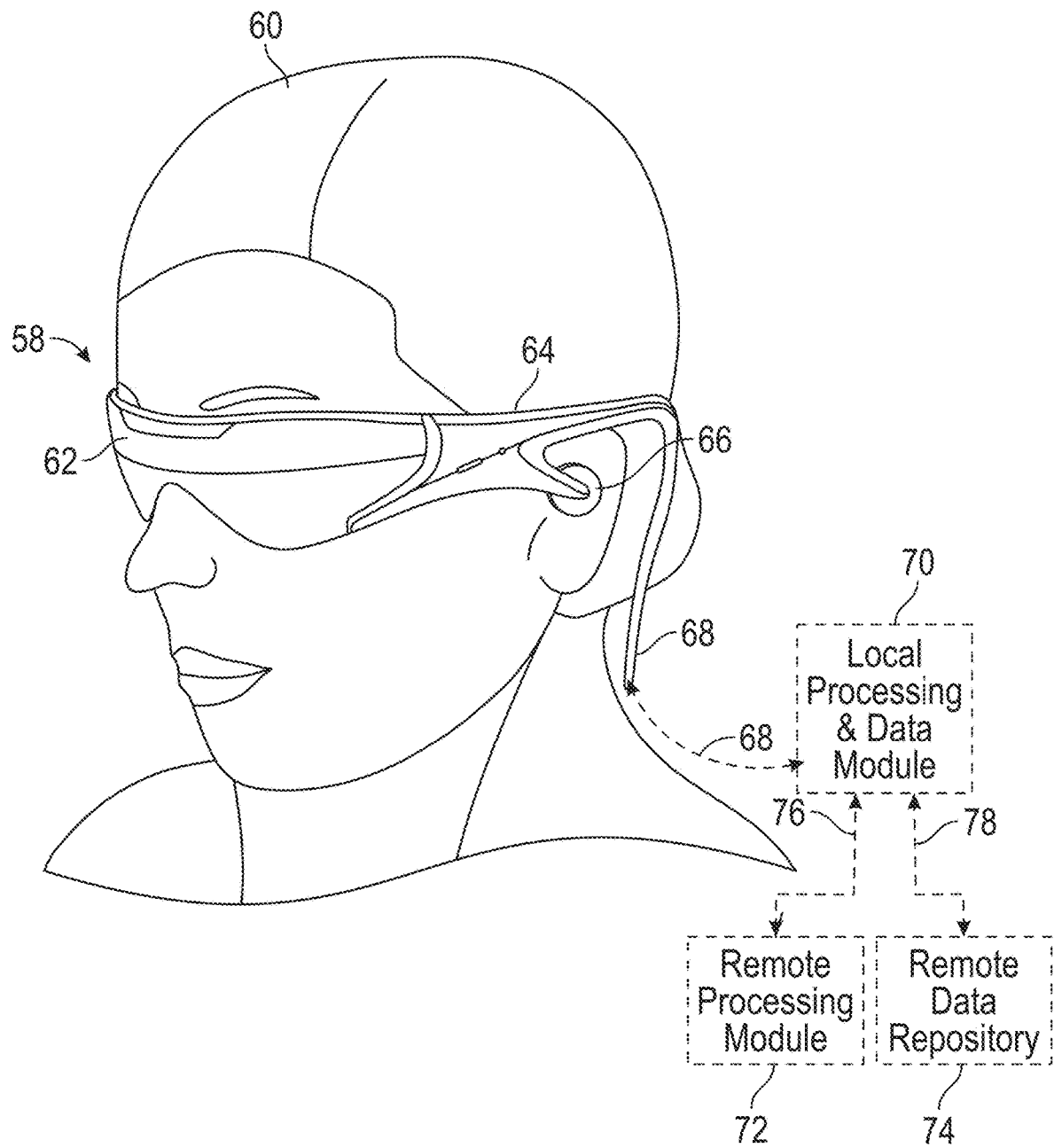
FIGS. 2A-2D schematically illustrate examples of a wearable system, according to various embodiments.
Figure 2B:
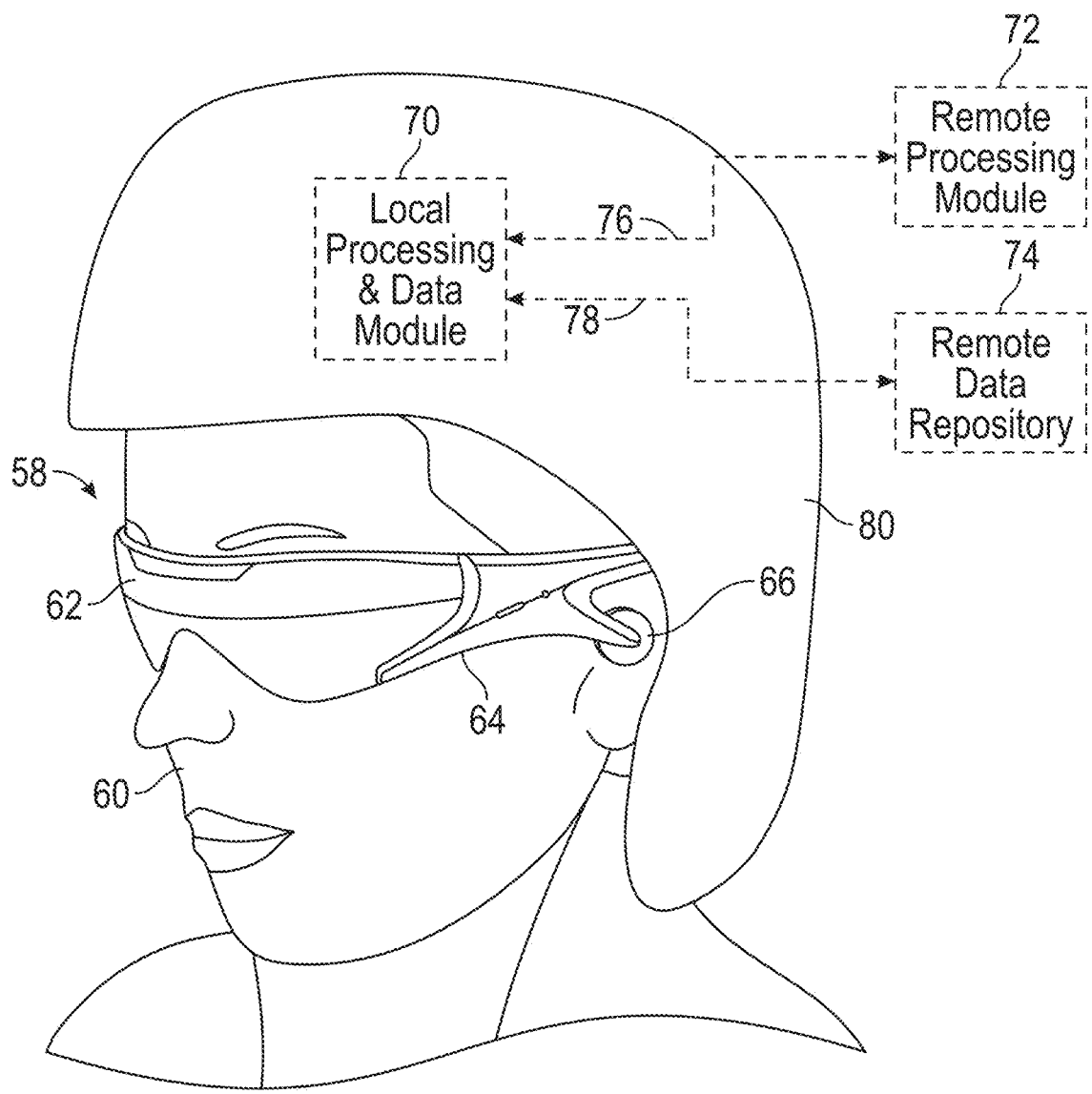
Figure 2C:
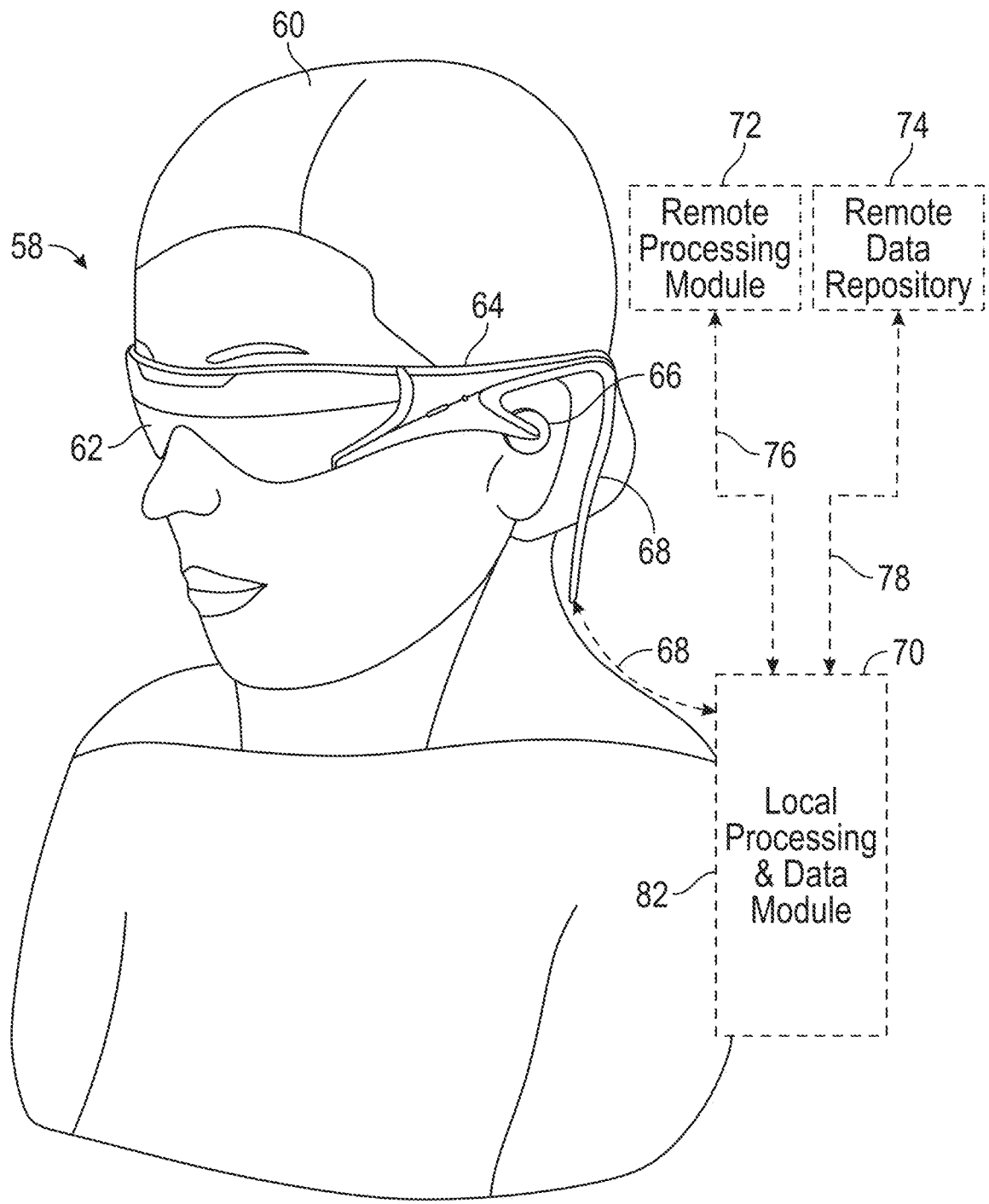
Figure 2D:
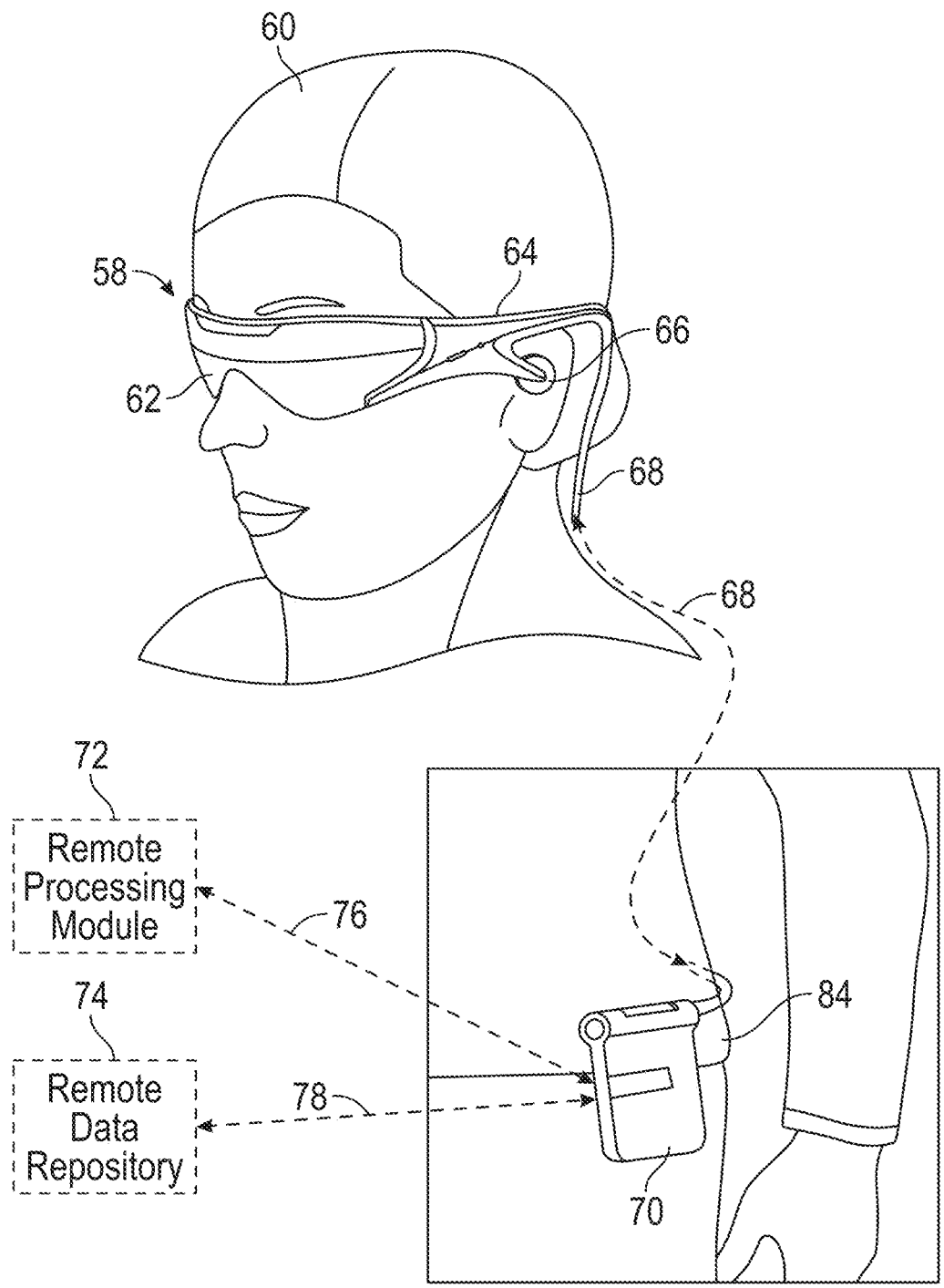

As shown in FIG. 2A, an AR system user 60 is depicted wearing head mounted component 58 featuring a frame 64 structure coupled to a display system 62 positioned in front of the eyes of the user. A speaker 66 is coupled to the frame 64 in the depicted configuration and positioned adjacent the ear canal of the user (in one embodiment, another speaker, not shown, is positioned adjacent the other ear canal of the user to provide for stereo/shapeable sound control). The display 62 is operatively coupled 68, such as by a wired lead or wireless connectivity, to a local processing and data module 70 which may be mounted in a variety of configurations, such as fixedly attached to the frame 64, fixedly attached to a helmet or hat 80 as shown in the embodiment of FIG. 2B, embedded in headphones, removably attached to the torso 82 of the user 60 in a backpack-style configuration as shown in the embodiment of FIG. 2C, or removably attached to the hip 84 of the user 60 in a belt-coupling style configuration as shown in the embodiment of FIG. 2D.

The local processing and data module 70 may comprise a power-efficient processor or controller, as well as digital memory, such as flash memory, both of which may be utilized to assist in the processing, caching, and storage of data a) captured from sensors which may be operatively coupled to the frame 64, such as image capture devices (such as cameras), microphones, inertial measurement units, accelerometers, compasses, GPS units, radio devices, and/or gyros; and/or b) acquired and/or processed using the remote processing module 72 and/or remote data repository 74, possibly for passage to the display 62 after such processing or retrieval. The local processing and data module 70 may be operatively coupled 76, 78, such as via a wired or wireless communication links, to the remote processing module 72 and remote data repository 74 such that these remote modules 72, 74 are operatively coupled to each other and available as resources to the local processing and data module 70.

In one embodiment, the remote processing module 72 may comprise one or more relatively powerful processors or controllers configured to analyze and process data and/or image information. In one embodiment, the remote data repository 74 may comprise a relatively large-scale digital data storage facility, which may be available through the internet or other networking configuration in a "cloud" resource configuration. In one embodiment, all data is stored and all computation is performed in the local processing and data module, allowing fully autonomous use from any remote modules.

Thermal Mitigation In Local Processing and Data Module

Figure 3A:
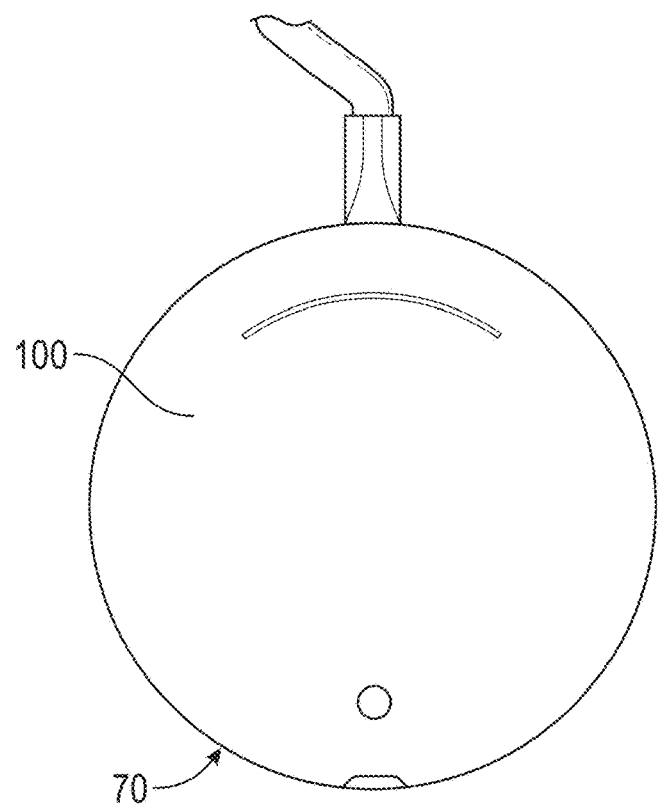
FIG. 3A is a schematic front plan view of a portion of a portable electronic device that can comprise part of a wearable system comprising a local processing and data module, according to one embodiment.
Figure 3B:
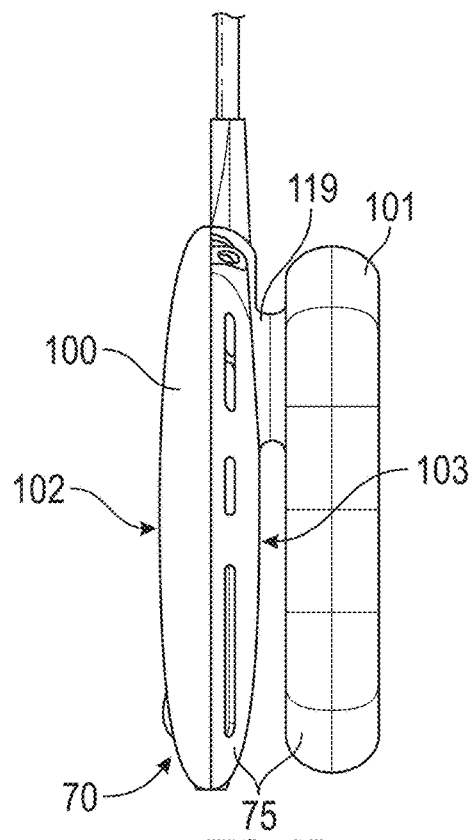
FIG. 3B is a schematic right side view of the local processing and data module of FIG. 3A.

FIG. 3A is a schematic front plan view of the local processing and data module 70, according to one embodiment. FIG. 3B is a schematic right side view of the local processing and data module 70 of FIG. 3A. As shown in FIGS. 3A and 3B, the local processing and data module 70 can comprise a housing 75 comprising a first enclosure 100 and a second enclosure 101 mechanically connected with the first enclosure 100. The second enclosure 101 can be fluidly coupled with the first enclosure 100 in some embodiments. The first enclosure 100 and the second enclosure 101 are coupled to provide thermal isolation or separation therebetween, e.g., a gap (such as an air gap) between the enclosures 100, 101 can provide improved thermal isolation therebetween. Thus, in some embodiments, the first enclosure can comprise a first compartment separated from a second compartment of the second enclosure 101 at a location spaced away from the first compartment by a gap that provides thermal separation between the first and second enclosures 100, 101. As discussed further below, however, in various embodiments at least some heat generated in the second enclosure 101 can flow to the first enclosure 100.

The first enclosure 100 can comprise a front side 102 and a back side 103 opposite the front side 102. The second enclosure 101 can be coupled with the back side 103 of the first enclosure. A connection portion comprising a channel 119 can extend between the first and second enclosures 100, 101. The channel 119 of the connection portion can connect an internal chamber or cavity defined within the first enclosure 100 with an internal chamber or cavity defined within the second enclosures 101. As explained herein, in some embodiments, the channel 119 can be sized to accommodate one or more electrical connectors extending between components within the first and second enclosures 100, 101. Moreover, the channel 119 can provide heat transfer by fluid communication or other means between the first and second enclosures 100, 101, e.g., to improve heat dissipation within the housing 75. In other embodiments, as explained herein, the channel 119 of the connection portion (and/or a physical air gap separating the enclosures 100, 101) can provide a thermal gap between the first and second enclosures 100, 101 to provide thermal separation between the enclosures 100, 101. In the embodiment of FIGS. 3A-3B, each enclosure 100, 101 can comprise a disc-shaped structure having an internal chamber or cavity shaped to contain various electronic devices, thermal mitigation features, and/or power supply devices. In other embodiments, the enclosures 100, 101 can be shaped differently.

Figure 3C:
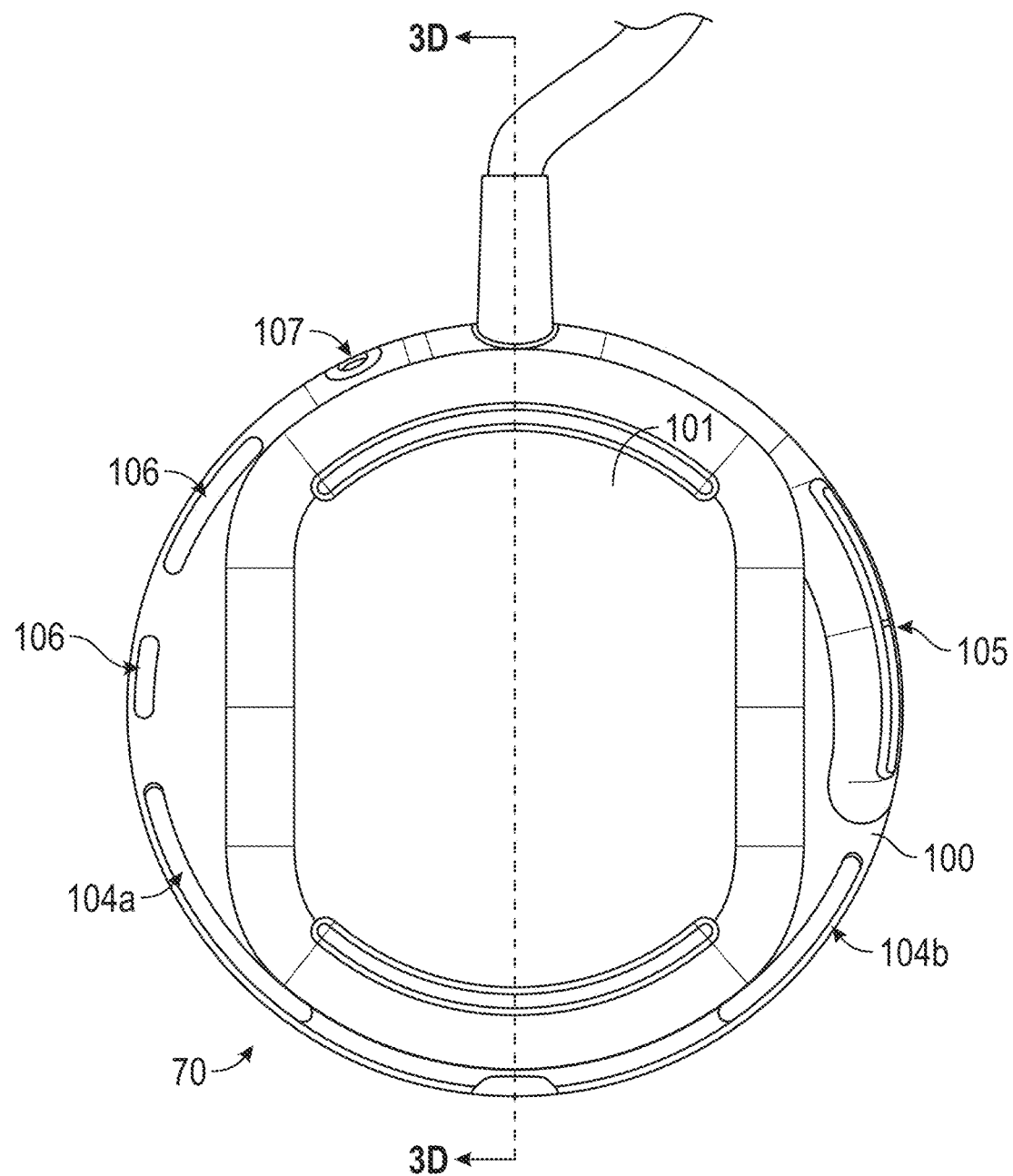
FIG. 3C is a schematic rear plan view of the local processing and data module shown in FIGS. 3A-3B.

FIG. 3C is a schematic rear plan view of the local processing and data module 70 shown in FIGS. 3A-3B. As shown in FIG. 3C, the housing 75 (e.g., on a periphery of the first enclosure 100) can include one or a plurality of user interfaces 106 configured to enable the user to control the operation of the system. For example, in some embodiments, the user interfaces 106 can comprise buttons or other types of interfaces to control the volume of the AR or VR experience, and/or to mute the volume. Other control mechanisms are possible through the interfaces 106. In addition, the local processing and data module 70 can include one or more input/output (I/O) ports 107 to provide input and/or output data. For example, the I/O port(s) 107 can comprise an audio port.

Also, the local processing and data module 70 can comprise one or more inlet ports 104a, 104b configured to permit gas (e.g., air) to enter the housing 75, e.g., at a position on a periphery of the first enclosure 100. The local processing and data module 70 can also include one or more exhaust ports 105 to permit the gas (e.g., air) to exit the housing 75, e.g., at a position on a periphery of the first enclosure 100. Thus, air can flow into the enclosure 100 through the inlet ports 104a, 104b, and can exit the enclosure 100 through the exhaust port(s) 105. The ports 104a, 104b, can include one or an array of holes in the enclosure 100 at spaced apart locations on the periphery of the enclosure 100. The ports 105 can include one or an array of holes in the enclosure 100. As discussed further below, one fan outlet is provided in some embodiments and in such embodiments a single ports 105 can be provided for fluid communication out of the housing 100. The ports 105 can be disposed on multiple peripheral sides of the enclosure 100 in some embodiments. The ports 104 can be disposed on multiple peripheral sides of the enclosure 100. As explained herein, the airflow through the enclosure 100 can beneficially carry heat away from the local processing and data module 70.

Figure 3D:
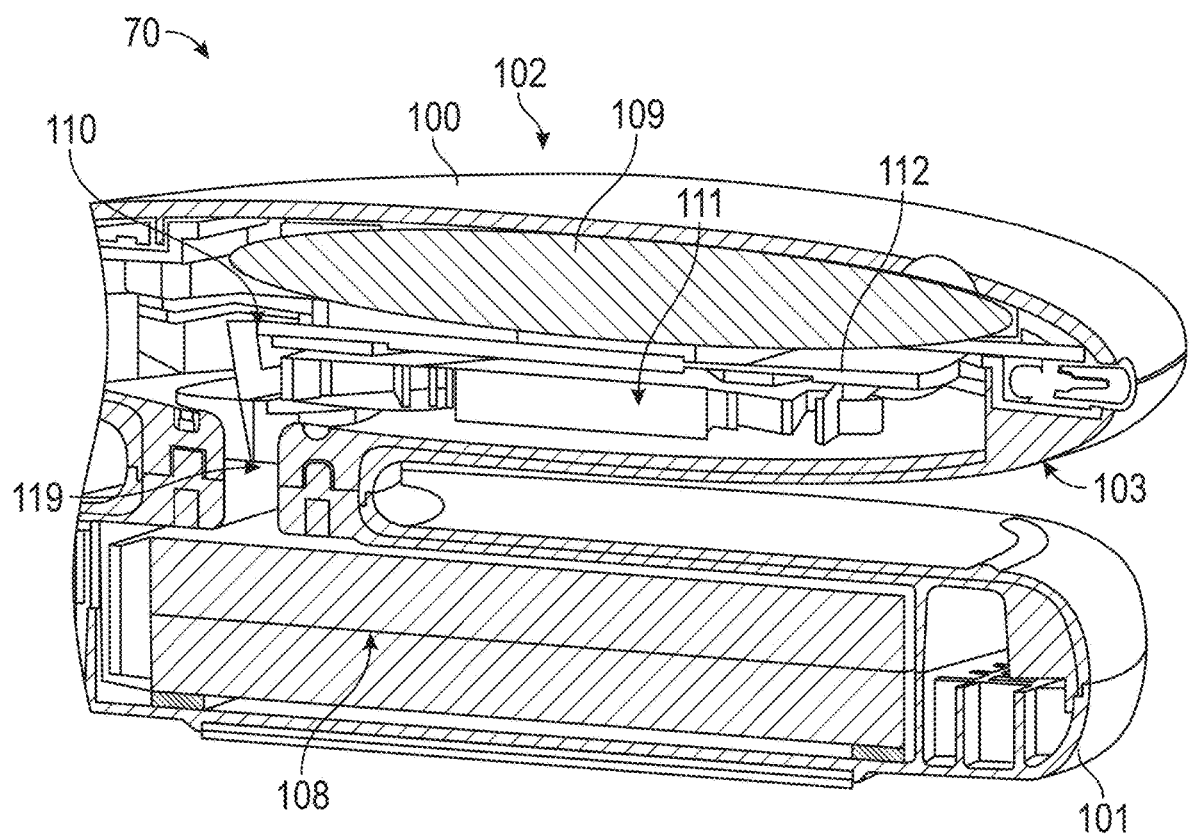
FIG. 3D is a schematic side cross-sectional view of the local processing and data module shown in FIGS. 3A-3C.

FIG. 3D is a schematic side cross-sectional view of the local processing and data module 70 shown in FIGS. 3A-3C. As explained above, the local processing and data module 70 may include one or multiple electronic components 109 (also referred to as processing electronics) (illustrated schematically herein in block form), such as processors, memory dies, sensors, etc. In the embodiment of FIG. 3D, the electronic components 109 can be disposed within a chamber or first compartment of the first enclosure 100 of the housing. As shown, the electronic components 109 can be arranged within a relatively low profile and a relatively small lateral footprint. The illustrated electronic components 109 are shown at or near the front side 102 of the first enclosure 100, but it should be appreciated that additional electronic components may be provided anywhere suitable in the enclosures 100, 101.

Incorporating multiple electronic components 109 within the enclosure 100 may generate substantial heat, which if not adequately cooled, may be uncomfortable to the user and/or may damage system components. Accordingly, in various embodiments, a thermal mitigation assembly 110 can be provided in the housing (e.g., in the first enclosure 100) to remove heat generated by the electronic components 109 and to maintain the temperature of the housing at comfortable and/or effective levels during operation. In the illustrated embodiment, the thermal mitigation assembly 110 is disposed rear of the electronic components 109. In the view depicted in FIG. 3D, the thermal mitigation assembly 110 can comprise a first heat spreader 112 disposed on a first side of a fan assembly 111. The first heat spreader 112 can be disposed on a front side of the fan assembly 111 and thus is sometimes a front heat spreader. As explained herein, the first heat spreader 112 can be mechanically and thermally coupled with the electronic components 109, so as to thermally conduct heat to a heat sink discussed below or components of the fan assembly 111. The fan assembly 111 can blow or draw air near or over the heat spreader 112 to expel a heat transfer medium (e.g., the heated air or other heated gas) out of the local processing and data module 70 through the exhaust port 105.

The local processing and data module 70 may also include additional electronic components (e.g., an on-board power supply module 118) within the second enclosure 101 to provide power to the electronic components 109 in the first enclosure 100 such that the user need not be tethered to a wired power supply. The power supply 118 shown in FIG. 3D can, for example, include one or a plurality of batteries. The on-board power supply may generate additional heat within the local processing and data module 70. In some embodiments, the fan assembly 111 can draw a heat transfer medium (e.g., heated air or other heated gas) from the second enclosure 101 into the first enclosure 100, e.g., by way of the channel 119 that provides fluid communication between the enclosures 100, 101. Thus, in various embodiments, the thermal mitigation assembly 110 can be configured to remove heat that is generated from one or both of the battery (e.g., the power supply 118) and the electronic components 109. In various embodiments, a majority of the heat removed from the local processing and data module 70 can comprise heat generated by the electronic components 109.

Figure 4A:
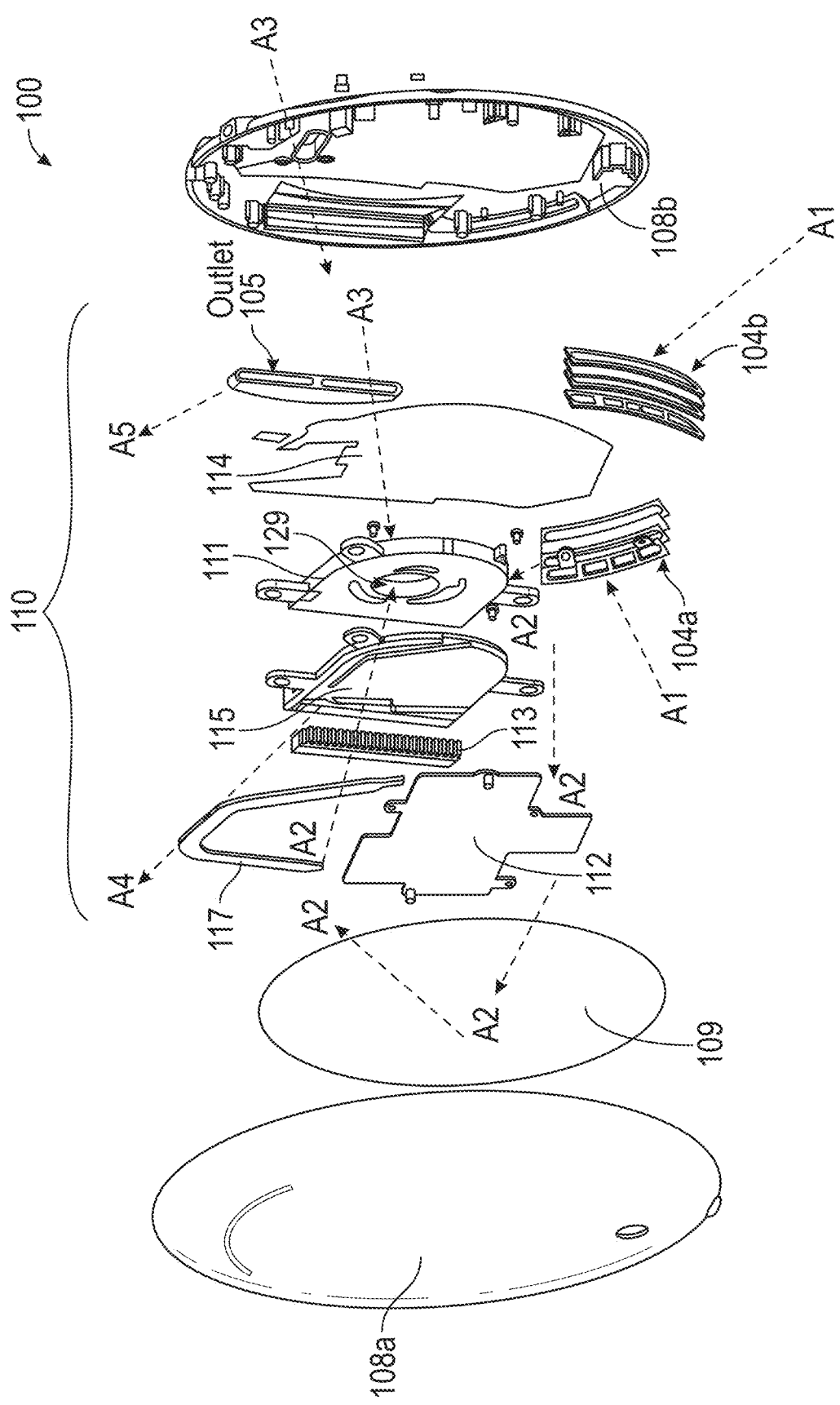
FIG. 4A is a schematic perspective, exploded view of a first enclosure of the local processing and data module, according to one embodiment.

FIG. 4A is a schematic perspective, exploded view of the first enclosure 100 of the local processing and data module 70, according to one embodiment. As explained above in connection with FIGS. 3A-3D, the electronics components 109 can be positioned within the enclosure 100 forward of the thermal mitigation assembly 110. The enclosure 100 can be structurally bounded or contained by connecting or mating a front cover 108a with a rear cover 108b. The front and rear covers 108a, 108b when connected define the chamber or first compartment in which the electronics components 109 and the thermal mitigation assembly 110 are disposed. Although FIG. 4A illustrates electronics components 109 and the thermal mitigation assembly 110 within the enclosure 100, it should be appreciated that additional components may be provided in the first enclosure 100.

As shown in FIG. 4A, the thermal mitigation assembly 110 can comprise a base 115 to support various components of the thermal mitigation assembly 110. For example, as shown in FIG. 4A, the first heat spreader 112 and a thermal conveyance pathway 117 (e.g., a heat pipe) can be mounted to or coupled with the base 115. In some embodiments, however, the assembly 110 may not include a base 115, such that the first heat spreader 122 and the thermal conveyance pathway 117 may be disposed adjacent to or otherwise connected to the fan assembly 111. In addition, a heat sink 113 (e.g., a finned stack of metallic plates or elements) can be mounted to or coupled with the base 115. For example, the heat sink 113 can comprise linked copper fin patterns, with each fin having a thickness in a range of 0.05 mm to 0.35 mm, e.g., in a range of 0.1 mm to 0.3 mm (about 0.2 mm in some embodiments). The fins can be spaced in a range of 0.25 mm to 2 mm, or in a range of 0.5 mm to 1.5 mm (about 1 mm in some embodiments). A second heat spreader 114 can be disposed on a second side of the fan assembly 111. The second heat spreader 114 can be disposed on a rear side of the fan assembly 111 and thus is sometimes a rear heat spreader. The first heat spreader 112 can be thermally and, optionally, mechanically coupled to some or all of the electronic components 109 by way of any suitable connector, such as a thermally conductive connector, a thermal gap pad, a thermal adhesive, etc. For example, in some embodiments, heat generated by the electronic components 109 may be conducted to the first heat spreader 112 by way of one or more thermal gap pads, which can comprise a thermally conductive elastomer. The thermal gap pads can generate pressure between the heat spreader 112 and the components so as to improve thermal conductivity. The heat can be conveyed from the heat spreader 112 and/or from the electronic components 109 along the thermal conveyance pathway 117 to the heat sink 113.

The fan assembly 111 can drive or draw air over and/or around the first heat spreader 112, the thermal conveyance pathway 117, and/or the second heat spreader 114 to cool the first enclosure 100 and/or the second enclosure 101. For example, influent air A1 can be drawn, by the fan assembly 111, into the first enclosure 100 by way of the inlet ports 104a, 104b. The fan assembly 111 can circulate cooling air A2 within the first enclosure 100 and over and/or around the electronic components 109 to cool the electronic components 109. The cooling air A2 may comprise ambient air drawn into the enclosure 100 without additional cooling in some embodiments. Moreover, as shown in FIG. 4A, the fan assembly 111 can draw cooling air A3 into the first enclosure 100 from the second enclosure 101, e.g., by way of the channel 119. Thus, in the illustrated embodiment, the electronic components 109 can be cooled by the cooling air A2 circulated within the enclosure 100.

In some embodiments, the battery or power supply 118 may also be cooled by way of the cooling air A3 drawn from the second enclosure 101 into the first enclosure 100. Heat from the second enclosure 101 can also be conducted by a thermal conductor into the first enclosure 100 in some embodiments and dissipated by the airflow described herein. In some embodiments, as explained herein, the connection portion including the channel 119 can comprise a thermal insulating gap so as to mitigate or reduce the flow of heat from the first enclosure 100 to the second enclosure 101 (or vice versa). The cooling air currents A2 and A3 can be drawn or sucked into an airflow opening 129 formed in an interior portion (e.g., central portion) of the fan assembly 111. In some embodiments, for example, the cooling air A2 can pass laterally between the first heat spreader 112 or the base 115 and the fan assembly 111, and can enter the fan assembly 111 through the opening 129. As explained herein (see FIGS. 4C and 4E), the air drawn through the airflow opening 129 of the fan assembly 111 can be expelled radially outward through an outlet air opening 132 in an outflow air current A4 from the fan assembly 111. Thus, in various embodiments, air pathways of the fan assembly 111 can extend between the airflow opening 129 disposed along the longitudinal axis L and the outlet airflow opening 132 having a face disposed about an axis non-parallel to the longitudinal axis L. For example, the outlet airflow opening 132 can be disposed radially outward (e.g., generally perpendicular to the longitudinal axis L). The radially outflowing air current A4 can be directed over the heat sink 113 to drive thermal energy stored in the heat sink 113 out of the enclosure 100. As shown in FIG. 4A, expelled air A5 can be directed out of the first enclosure 100 through the exhaust port 105 to the outside environs.

Figure 4B:
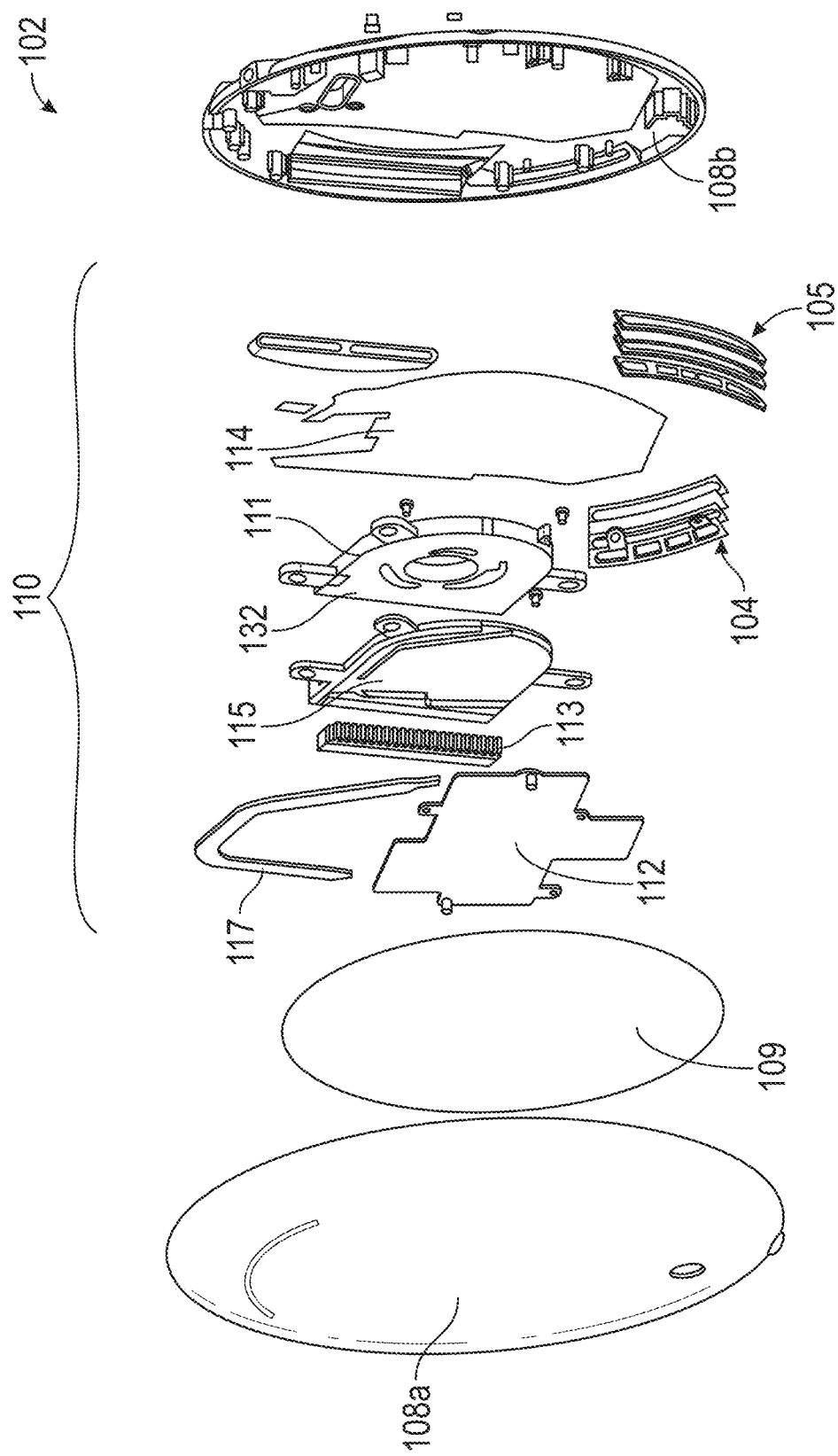
FIG. 4B is a schematic perspective, exploded view of the local processing and data module, according to another embodiment.

FIG. 4B is a schematic perspective, exploded view of the local processing and data module 70, according to another embodiment. Unless otherwise noted, the local processing and data module 70 of FIG. 4B may be similar to the local processing and data module 70 of FIG. 4A. Unlike the embodiment of FIG. 4A, in FIG. 4B, only a single inlet port 104 and a single exhaust port 105 are shown. Thus, it should be appreciated that any suitable number of inlet ports 104 and/or outlet ports 105 may be provided for intaking air into the enclosure 100 and for expelling air from the enclosure 100.

Figure 4C:
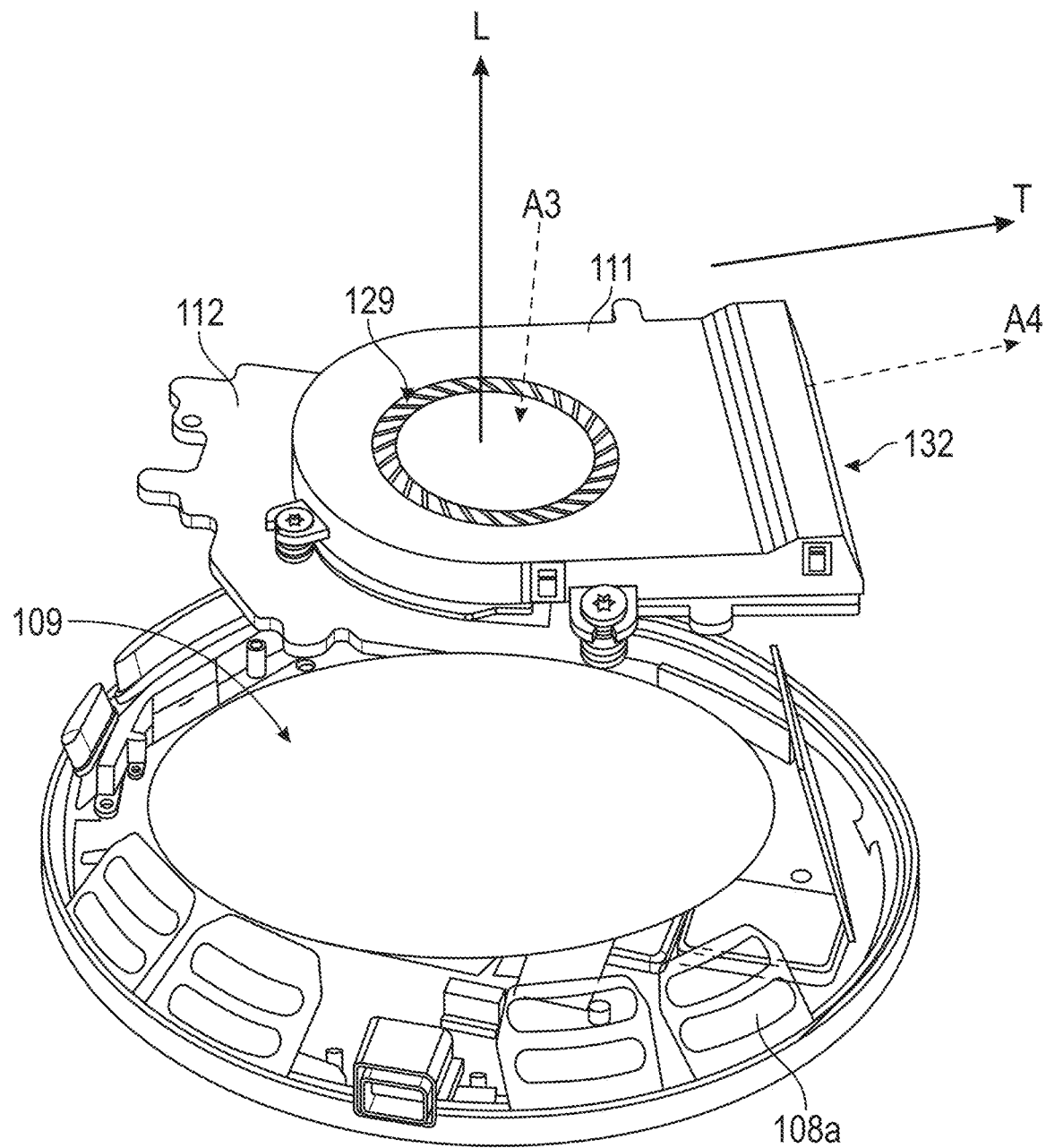
FIG. 4C is a schematic perspective, partially exploded view of a fan assembly mounted to a first heat spreader, according to various embodiments.
Figure 4D:
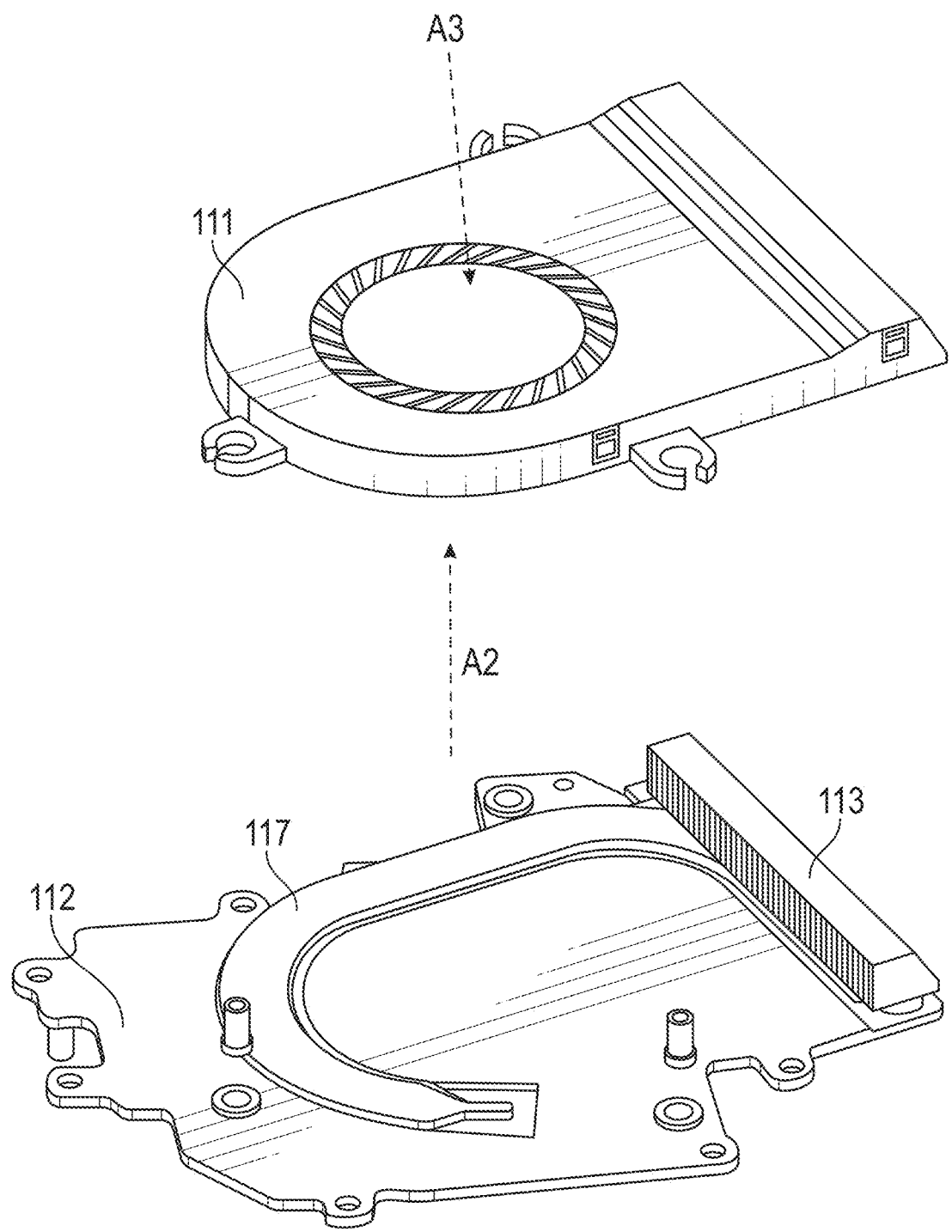
FIG. 4D is a schematic, partially exploded view of the fan assembly, the first heat spreader, a thermal conveyance pathway, and a heat sink.

FIG. 4C is a schematic perspective, partially exploded view of the fan assembly 111 mounted to the first heat spreader 112. FIG. 4D is a schematic, partially exploded view of the fan assembly 111, the heat spreader 112, the thermal conveyance pathway 117, and the heat sink 113. As shown in FIGS. 4A-4C, the electronic components 109 can be disposed near the front cover 108a. The first heat spreader 112 can be disposed rear of the electronic components, and the fan assembly 111 can be thermally coupled with, and disposed rear of, the first heat spreader 112. The first heat spreader 112 can be disposed between the electronic components 109 and the fan assembly 111. The fan assembly 111 can be thermally coupled with the first heat spreader 112. In some embodiments, a gap may be disposed between the fan assembly 111 and the heat spreader 112 or base 115 to permit air to enter the opening 129. The base 115 and thermal conveyance pathway 117 are obscured in FIG. 4C, since the base 115 and conveyance pathway 117 may be disposed between the heat spreader 112 and the fan assembly 111. As explained above in connection with FIG. 4A, the outflow air current A5 can pass over the heat sink 113 (obscured in FIG. 4C) disposed near (e.g., upstream of) the outlet opening 132 of the fan assembly 111.

As shown in FIG. 4C, the fan assembly 111 can comprise a rotational axis L and a transverse axis T disposed non-parallel relative to (e.g., perpendicular to) the axis L. The rotational axis L is a longitudinal axis of a shaft assembly or a shaft portion about which a portion of the fan assembly 111 rotates and thus is sometimes referred to as a longitudinal axis L. The cooling air currents A2 (see FIG. 4D) and A3 (see FIGS. 4C and 4D) can enter the fan assembly 111 through the airflow opening 129 from heat source(s) in the housings 100, 101, e.g., from the electronic components 109 and the power supply 118, respectively. In some arrangements, for example, the air currents A2 can pass between the heat spreader 112 or the base 115 and the fan assembly 111, and can enter the opening 129. The cooling air currents A2, A3 can have velocity components aligned along the longitudinal axis L, at least locally in the vicinity of the opening 129 and at a corresponding opening on the opposite side of the fan assembly 111. The rotation of the blades of the fan assembly 111 can therefore draw air into the fan assembly 111 with high momentum along the longitudinal axis. The outflow air current A4 can be directed radially outward through the outlet opening 132, such that the air current A4 includes velocity components aligned along the transverse axis T. The outflow air current A4 can exit the enclosure 100 by way of the exhaust port 105 (see FIGS. 4A-4B).

Figure 4E:
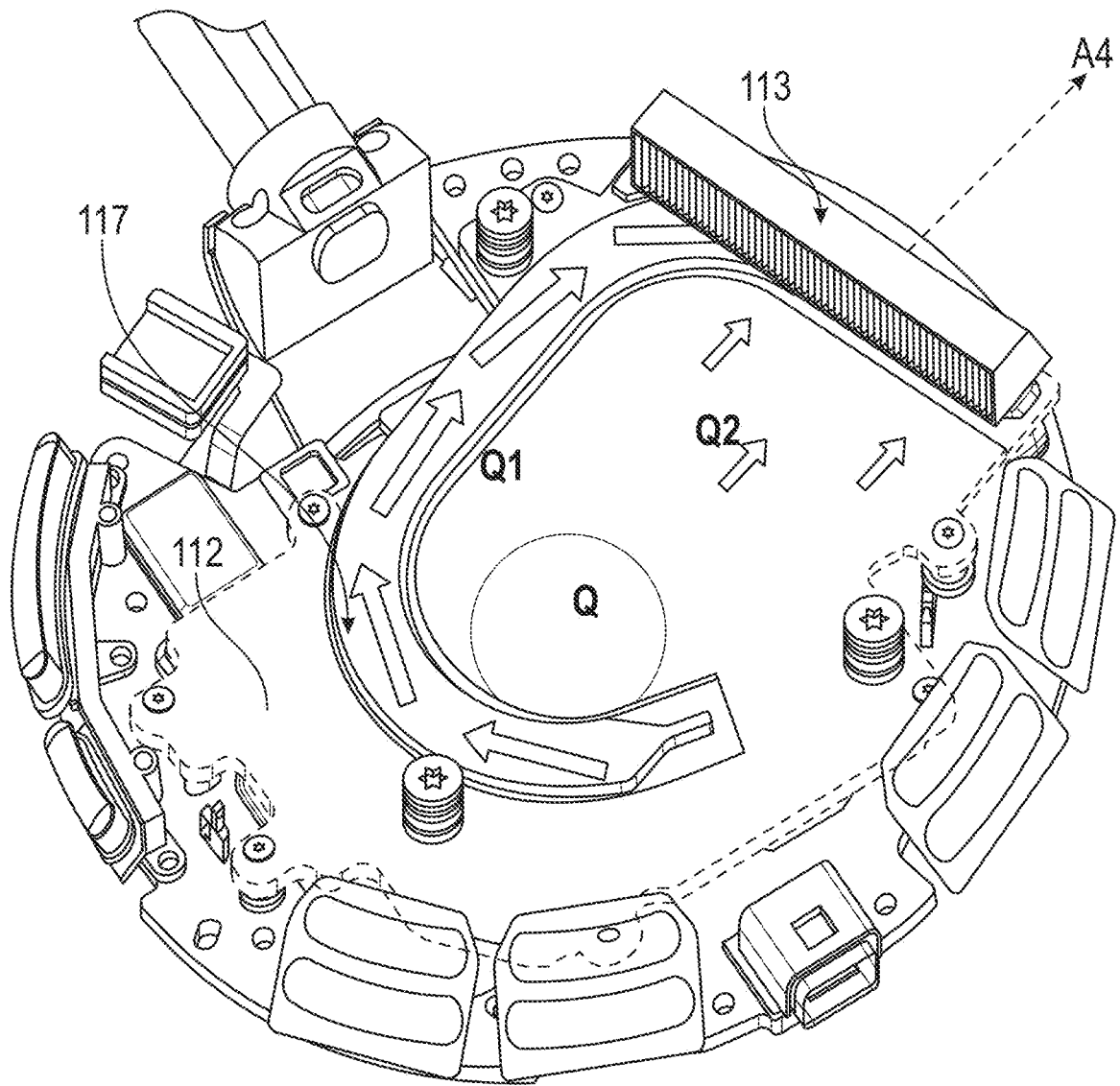
FIG. 4E illustrates a heat map of the assembled heat spreader, thermal conveyance pathway, and heat sink during operation of the fan assembly.

FIG. 4E illustrates a heat map of the assembled heat spreader, thermal conveyance pathway 117, and heat sink 113 during operation of the fan assembly 111. The heat map was computed using computational fluid dynamics (CFD) software. As shown in FIGS. 4D and 4E, the thermal conveyance pathway 117 can be coupled with the heat spreader 112, e.g., disposed in a groove or channel of the heat spreader 112. The heat spreader 112 can comprise a thermally conductive material, such as copper. The thermal conveyance pathway 117 can comprise a heat pipe comprising a thermally conductive channel. A working fluid (e.g., water) can be provided within a lumen of the thermal conveyance pathway 117. In various embodiments, the heat pipe of the conveyance pathway 117 can comprise a copper pipe that is flattened so as to have a cross-sectional profile that is generally elliptical. In various embodiments, for example, a major dimension of the heat pipe can be between two and ten times larger than a minor dimension of the heat pipe (e.g., between five and nine times larger).

As shown in FIG. 4E, thermal energy Q can be stored in and/or conducted to the heat spreader 112 from the components 109. The thermal energy Q from the heat spreader 112 can be transferred to the heat sink 113 along one or more thermal pathways Q1, Q2. For example, as shown in FIG. 4E, some thermal energy can be conveyed along a first pathway Q1 from the heat spreader 112 by way of the thermal conveyance pathway 117. By utilizing a working fluid with a high heat capacity inside a thermally conductive tubular member, thermal energy can be rapidly and effectively transferred to the heat sink 113. A second pathway Q2 can convey thermal energy along the area of the heat spreader 112 to the heat sink. As shown in FIG. 4E, the arrows representative of the first pathway Q1 are wider than the arrows representative of the second pathway Q2, indicating that heat is more efficiently and/or rapidly transferred along the first pathway Q1 than the second pathway Q2. In various embodiments, the conveyance pathway 117 can be significantly more thermally conductive than the first heat spreader 112 (e.g., at least five times, or at least ten times as thermally conductive as the heat spreader 112).

As shown in FIG. 4E, during operation of the fan assembly 111, heat can be rapidly transferred away from the heat sink by the outflow air current A4, as shown by the relatively cool temperatures maintained by the airflow over the heat sink 113. Maintaining the heat sink 113 at a cool temperature can increase the thermal gradient between the heat spreader 112 and/or the thermal conveyance pathway 117 and the heat sink 113. Beneficially, the disclosed embodiments can maintain the temperature of the local processing and data module 70 at suitably low temperatures.

Figure 5:
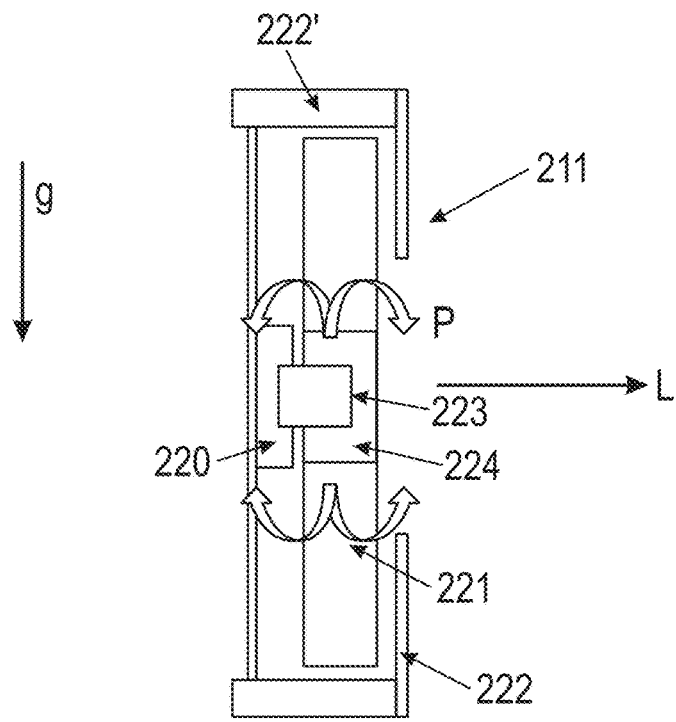
FIG. 5 is a schematic side cross-sectional view of a fan assembly that can be used in conjunction with the local processing and data module described herein.

FIG. 5 is a schematic side cross-sectional view of a fan assembly 211 that can be used in conjunction with the local processing and data module 70 described herein. The fan assembly 211 can comprise a support frame 222 configured to provide structural support to the fan assembly 211. The frame 222 can comprise multiple frame portions connected together by, e.g., fasteners or other mechanical connectors. In other embodiments, the frame 222 can comprise a unitary body. A motor 220 can be mechanically coupled with the frame 222. A shaft assembly 223 can be connected to the motor 220 and can extend along the longitudinal axis L described above, such that the longitudinal axis extends between and/or through first and second ends of the shaft assembly 223. In the embodiment of FIG. 5, in which the shaft assembly 223 is connected to the motor 220, the shaft-supporting motor 220 may be considered part of the support frame 222 or frame assembly. In the illustrated arrangement, the shaft assembly 223 is cantilevered relative to the motor 220 or the frame 222. As explained herein, the shaft assembly 223 can comprise a single shaft in some embodiments. In other embodiments, the shaft assembly 223 can comprise a plurality of shafts coupled together. A bearing 224, which can be a bushing, can be disposed at least partially around the shaft assembly 223. An impeller 221 can be operably coupled with and disposed about the bushing or other bearing 224.

In some embodiments, the motor 220 can comprise a stator (not shown) having one or more wire coils that, when energized by electric power, create changing or alternating magnetic fields sufficient to drive a magnetic rotor assembly (not shown) coupled or formed with the impeller 221 (e.g., in or on a hub or other central portion of the impeller 221). The magnetic fields generated by the motor 220 can interact with the magnetic rotor assembly of the impeller 221 to cause the magnetic rotor, and therefore the impeller 221) to rotate about the longitudinal axis L. In the illustrated embodiment, the shaft assembly 223 can be fixed to the motor 220, or to the frame 222. Thus, in the illustrated embodiment, the shaft assembly 223 may not rotate. In some embodiments, the bushing or other bearing 224 may be secured over or fixed to the shaft assembly 223, and the impeller 221 can rotate relative to the bushing 224 and the shaft assembly 223. In some embodiments the bushing or other bearing 224 may be secured or fixed to the impeller 221 and can rotate with the impeller 221 relative to the shaft assembly 223. In other embodiments, it should be appreciated that the motor 220 can include internal stator and rotor assemblies that cause the shaft assembly 223 (or portion(s) thereof to rotate). In such arrangements, the impeller 221 can be rotationally fixed relative to, and can rotate with, the shaft assembly 223.

The impeller 221 can be driven to rotate at high speeds in order to adequately remove thermal energy from the housing. For example, the impeller 221 can rotate at speeds between 5,000 rpm and 10,000 rpm, e.g., 8,000 rpm, or at higher speeds. As explained above, the local processing and data module 70 can be worn or otherwise carried by the user for VR or AR experiences. The user may often be moving while wearing the module 70 and therefore, the local processing and data module 70, and the fan assembly 211 therein, may frequently be disposed at different angles relative to gravity g. However, in some cases, the fan assembly 211 may be disposed at an angle, or may move at sufficiently high acceleration, such that the torque resulting from transverse loads on the shaft assembly 223 causes the shaft assembly 223 to bend or flex by an angle P as shown in FIG. 5. The deflection or bending of the shaft assembly 223 due to transverse loading conditions may cause the impeller 221 to contact or hit the interior surface of the frame 222, which can cause undesirable noise and/or vibration within the local processing and data module 70. Moreover, the frequent application of such external torques to the shaft assembly 223 may cause the shaft assembly 223 to wear or experience fatigues, which may damage the shaft assembly.

Accordingly, it can be desirable to reduce or eliminate noise and vibrations caused by the application of transverse loads (and the resulting torques) on the shaft assembly 223, and to reduce or eliminate the effects of fatigue or wear. The embodiments disclosed herein can advantageously control the loading transverse to the longitudinal axis L shown in FIG. 5. In some arrangements, for example, the shaft assembly 223 may be made sufficiently stiff so as to reduce the amount of deflection of the distal end of the shaft assembly 223. In other arrangements, elements on the frame 222 can assist in preventing the impeller 221 and shaft assembly 223 from contacting the frame 222 or substantially deflecting. For example, in some embodiments, a frame portion 222' of the frame disposed about the impeller 221 can comprise one or more magnets in alignment with corresponding magnet(s) in the impeller 221. For example, the magnets in the frame portion 222' and impeller can have like poles aligned so as to cause the impeller 221 to remain centered within the frame 222 or at least to oppose deflection of the impeller 221 toward the frame 222 on a transverse loading which may reduce or eliminate deflection of the shaft assembly 223.

Figure 6:
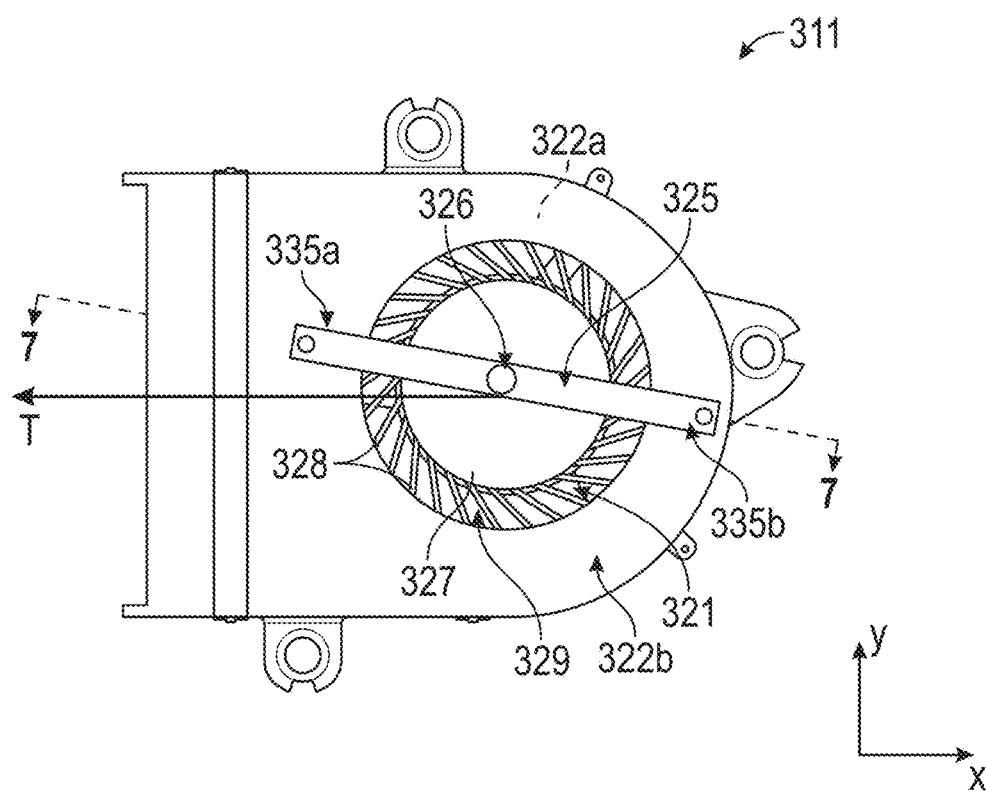
FIG. 6 is a rear plan view of a fan assembly, according to various embodiments disclosed herein.
Figure 7:
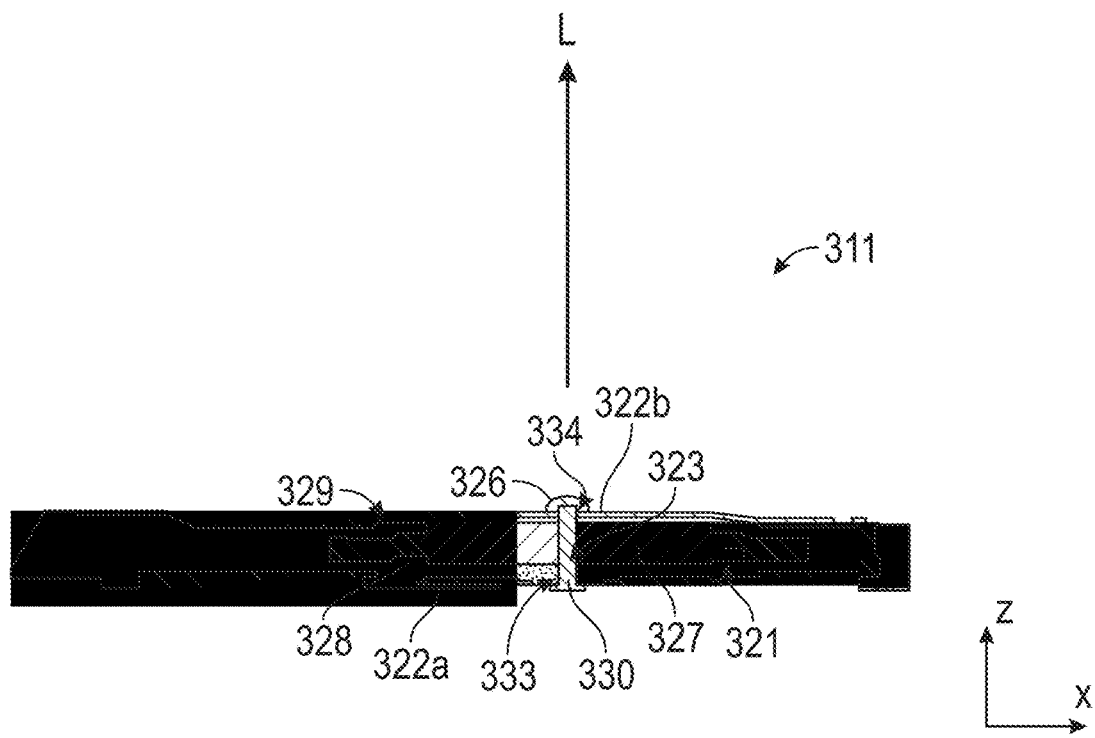
FIG. 7 is a schematic side sectional view of the fan assembly of FIG. 6.

FIG. 6 is a rear plan view of a fan assembly 311, according to various embodiments disclosed herein. FIG. 7 is a schematic side sectional view of the fan assembly 311 of FIG. 6. Unless otherwise noted, the components shown in FIGS. 6 and 7 may include components similar to like numbered components shown in FIG. 5. As shown in FIGS. 6 and 7, the fan assembly 311 can comprise a frame assembly that can have a first support frame 322a and a second support frame 322b coupled to the first frame 322a. The connected first and second support frames 322a, 322b can define an enclosure or chamber. The impeller 321 can be disposed between the first and second support frames 322a, 322b, e.g., within the enclosure defined by the frames 322a, 322b. Thus, in the illustrated embodiment, the first and second support frames 322a, 322b can define a housing in which the impeller 321 is disposed. The impeller 321 of FIGS. 6 and 7 can comprise a hub 327 and one or a plurality of blades 328 (e.g., fan blades) coupled with and/or extending from the hub 327. The hub 327 can be coupled with the shaft assembly 323. In some embodiments, a bushing can be disposed between the shaft assembly 323 and the hub 327. As explained above, in some embodiments, the impeller 321 can rotate relative to the rotationally fixed shaft assembly 323. In other embodiments, the impeller 321 can rotate with the rotating shaft assembly 323.

As shown in FIG. 7, a first end 333 of the shaft assembly 323 can be supported by or coupled with the first support frame 322a (e.g., to a support structure defined by or including the frame, to the motor, etc.) For example, in the embodiment of FIG. 7, the first end 333 of the shaft assembly 123 can be secured to the first frame 322a at a first shaft support 330 of the first support frame 322a. In various embodiments, the first end 333 can be welded, glued, or press fit onto the frame 322a. The first shaft support 330 can comprise a portion of a structural body defined by the first support frame 322a. In other embodiments, the first support frame 322a can comprise the motor such that the first end 333 of the shaft assembly 323 is secured to the motor and the shaft support 330 comprises a portion of the motor. It should be appreciated that any suitable structure can be used as the shaft support 330 so as to secure the first end 333 of the shaft assembly 323.

As explained above, it can be advantageous to control transverse loads applied to the shaft assembly 323 so as to reduce noise and vibrations, and to mitigate the risks of fatigue, wear, or excessive loading conditions. Accordingly, in the embodiment of FIGS. 6 and 7, a second support frame 322b can be provided to control transverse loading on the shaft assembly 323. The second support frame 322b can be coupled with the first support frame 322a and can be disposed at or over a second end 334 of the shaft assembly 323 so as to control transverse loading at the second end 334 of the shaft assembly 323. In FIGS. 6 and 7, the second support frame 322b can comprise a second shaft support 326 coupled with the second end 334 of the shaft assembly 323. The second shaft support 326 can be rigidly attached to the second support frame 322b across at least a portion of the airflow opening 329. In some embodiments, the second shaft support 326 can comprise a pin or other connector that rigidly attaches the second end 334 of the shaft assembly 323 to the frame 322b. In various embodiments, the second shaft support 326 (e.g., a pin) can be connected concentrically or axially relative to the axis L about which the shaft assembly 323, the impeller 321 or both the shaft assembly 323 and the impeller rotate. Positioning the second shaft support 326 along or centered relative to the axis L can beneficially reduce deflections and improve the rotation of the impeller 321.

In the embodiment of FIGS. 6 and 7, the second shaft support 326 can comprise or be connected with an elongate member 325 between first and second end portions 335a, 335b thereof. As shown in FIG. 6, the first end portion 335a of the elongate member 325 can be supported at a first portion of the second support frame 322b, and the second end portion 335b of the elongate member 325 can be supported at a second portion of the second support frame 322b. The first and second end portions 335a, 335b (and the corresponding first and second portions of the second frame 322b) can be spaced apart about a periphery of the airflow opening 329. In the illustrated embodiment, for example, the first and second end portions 335a, 335b (and the first and second portions of the frame 322b) can be disposed on generally opposite sides of the airflow opening 329. In other embodiments, however, the first and second end portions 335a, 335b of the elongate member 325 can be spaced apart peripherally by less than 180°. For example, the elongate member 325 may extend from the first end portion 335a over the airflow opening 329 and may connect with the second end 334 of the shaft assembly. The elongate member 325 may further extend from the second end 334 to the second end portion 335b at an angle less than 180°.

Rigidly supporting the second end 334 of the shaft assembly 323, in addition to supporting the first end 333, can beneficially control transverse loading on the shaft assembly 323 and can reduce or eliminate deflections of the assembly 323. However, since the elongate member 325 may be disposed across part of or the entire airflow opening 329, the elongate member 325 may interfere with the influent air entering the fan assembly 311 through the airflow opening 329. Accordingly, in the illustrated embodiment, the elongate member 325 can be angled relative to the transverse axis T by an angle A selected or determined so as to reduce or minimize disruption to the influent air (e.g., such that the airflow into the opening 329 is maximized or increased sufficiently for thermal design goals). For example, in some embodiments, computational techniques (such as computational fluid dynamics, or CFD) can calculate the estimate air flow field through the motor assembly 311. The analysis or calculations can determine the desired angle A at which to orient the elongate member 325. In various embodiments, the desired angle A can correspond to a global or local maximum of airflow when the impeller 321 is rotating, as compared over a range of angles A of the elongate member 325 (with the elongate member 325 being attached to the frame 322b). In some embodiments, computational techniques can be applied without the elongate member 325 to determine the locations of the opening 329 at which the airflow is less compared to other positions about the opening 329 during operation of the fan assembly 311. If a minimum or reduced airflow region is found (without the elongate member 325 being attached), then the desired location or orientation of the elongate member 325 may correspond with these regions of lesser airflow. In the illustrated embodiment, it can be desirable to orient the elongate member 325 at a sufficiently small angle A relative to the transverse axis T, so that air can flow around the relatively thin profile of the elongate member 325 at such angles. In various embodiments, the angle A can be in a range of −45° to 45°, e.g., in a range of −30° to 30°. It should be appreciated, however, that other angles A may be used depending on the specific flow dynamics of the fan assembly 311. Beneficially, in various embodiments, the manufacturer or assembler can accordingly assemble the fan assembly 311 and, based upon the determined lesser airflow regions during operation of the fan assembly 311 without the elongate member 325, the manufacturer can position the elongate member 325 so as to minimize disruptions to airflow (e.g., by orienting the elongate member 325 over these minimal flow regions). Orienting the elongate member 325 during assembly and after calculation of minimal airflow patterns can enable the manufacturer or assembler to account for specific airflow patterns of the device being cooled before affixing the elongate member 325.

As discussed further below, the orientation of the elongate member 325 can be generally transverse to the direction of locally greater or globally greatest airflow over the frame 322a and through the opening 329 (or through an opening in the frame 322b). The elongate member 325 can be oriented to have a minimal profile facing this greater or greatest airflow regime.

Figures 6A, 6B, 6C:
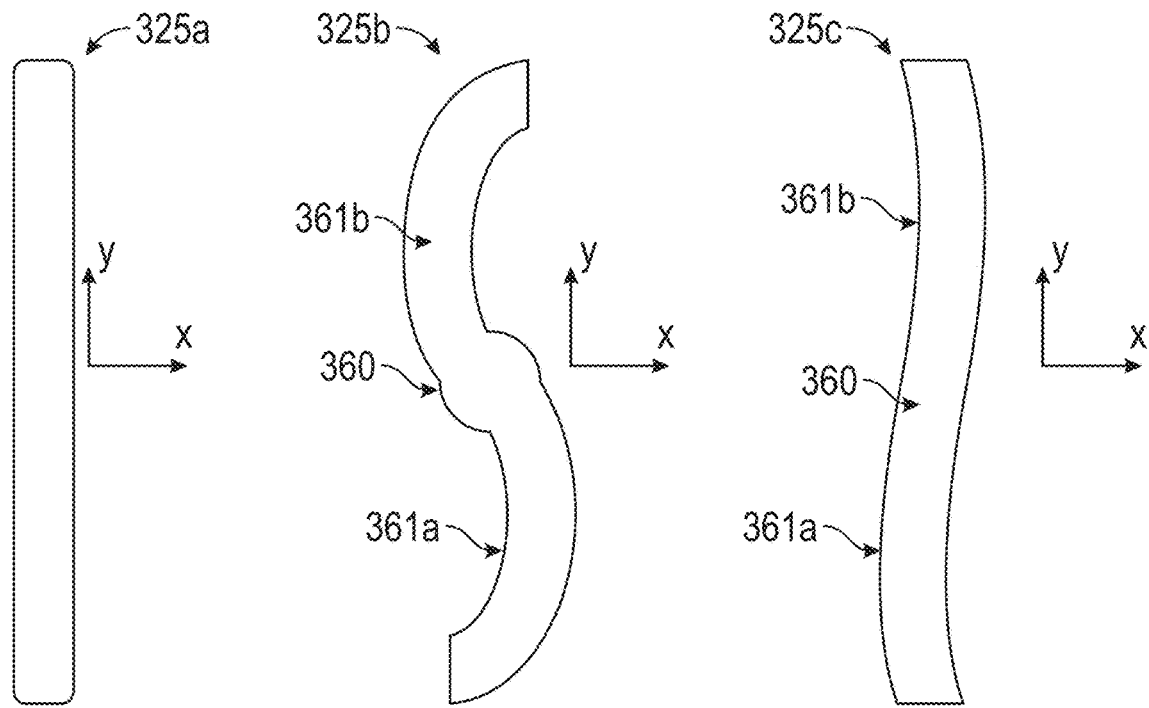
FIG. 6A is a schematic top plan view of an elongate member having a generally straight profile along a plane defined generally parallel with the rotational plane of the impeller.
FIG. 6B is a schematic top plan view of an elongate member having a first curved region and a second curved region, according to one embodiment.
FIG. 6C is a schematic top plan view of an elongate member having a first curved region and a second curved region, according to another embodiment.

FIGS. 6A-6F illustrate various top and side profiles of the elongate member 325 described herein. For example, FIG. 6A is a schematic top plan view of an elongate member 325a having a generally straight profile along an x-y plane defined generally parallel with the rotational plane of the impeller 321, e.g., the impeller 321 may rotate within a plane generally parallel to the x-y plane shown in FIG. 6 such that the x-y plane may be transverse to the rotational longitudinal axis L. FIG. 6B is a schematic top plan view of an elongate member 325b having a first curved region 361a and a second curved region 361b. In FIG. 6B, the first and second curved regions 361a, 361b may reverse the direction of curvature at or near a transition region 360. For example, the transition region 360 can serve as an inflection region at which the first and second regions 361a, 361b change directions of curvature. Similarly, FIG. 6C is a schematic top plan view of an elongate member 325c having a first curved region 361a and a second curved region 361b, according to another embodiment. Unlike in FIG. 6B, in FIG. 6C, the first and second curved regions 361a, 361b can change the directions of curvature along a smooth or continuous inflection or transition region 360. The shapes as shown from a top down view (e.g., along the x-y plane) may be selected so as to achieve a desired flow profile through the fan assembly.

Figure 6D:
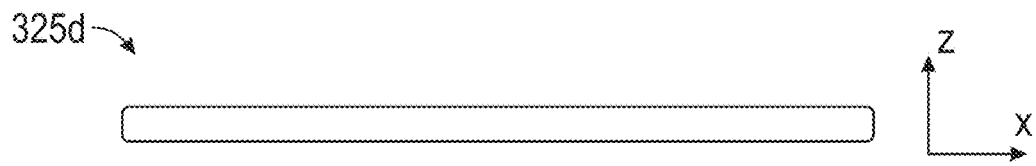
FIG. 6D is a schematic side view of an elongate member having a generally planar or straight profile, as viewed along a plane defined generally transverse to the plane shown in FIGS. 6A-6C.
Figure 6E:
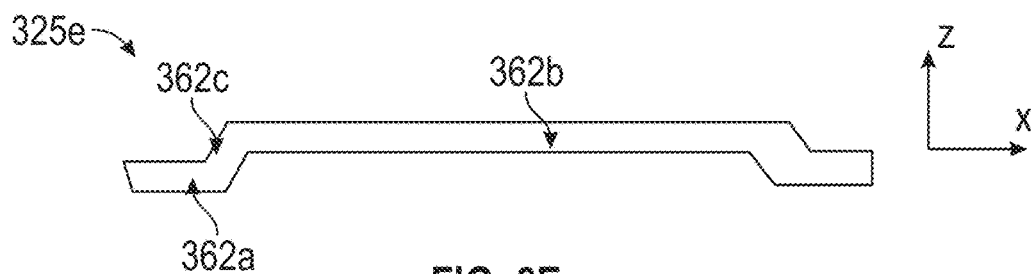
FIG. 6E is a schematic side view of an elongate member having a non-linear or shaped profile, as viewed along a plane defined generally transverse to the plane shown in FIGS. 6A-6C, according to some embodiments.

FIG. 6D is a schematic side view of an elongate member 325d having a generally planar or straight profile, as viewed along an x-z plane defined generally transverse to the x-y plane, e.g., parallel to the direction of the longitudinal rotational axis L (see the x-z plane shown in FIG. 7). FIG. 6E is a schematic side view of an elongate member 325e having a non-linear or shaped profile, as viewed along an x-z plane. For example, as shown in FIG. 6E, the elongate member 325e can comprise a first portion 362a disposed along a first location of the z-axis and a second portion 362b disposed offset from the first portion 362a along the z-axis (which may be parallel or generally aligned with the longitudinal axis L). A third transition portion 362c may serve to connect the first and second portions 362a, 362b.

Figure 6F:
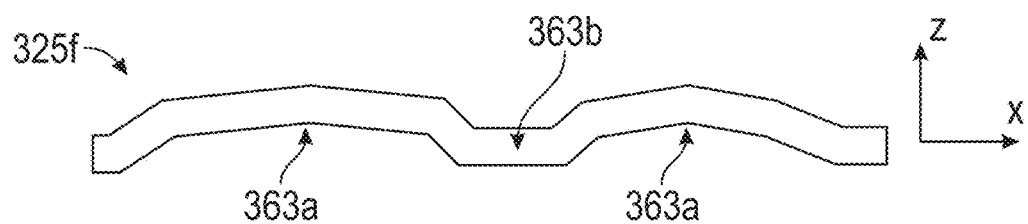
FIG. 6F is a schematic side view of an elongate member having a non-linear or curved profile, as viewed along a plane defined generally transverse to the plane shown in FIGS. 6A-6C, according to another embodiment.

FIG. 6F is a schematic side view of an elongate member 325f having a non-linear or curved profile, as viewed along an x-z plane, according to another embodiment. As with the embodiment of FIG. 6E, the elongate member 325f can comprise first portions 363a along a first location along the z-axis, and one or more second portions 363b at other locations along the z-axis. Unlike the embodiment of FIG. 6E, the member 325f of FIG. 6F can comprise curved surfaces along the z-axis. Thus, as shown in FIGS. 6A-6F, the shape of the elongate member 325 may vary within the x-y plane and/or within the x-z plane. The elongate members 325a-325f may accordingly be shaped to have any suitable type of three-dimensional profile for improving the flow through the fan assembly.

Figure 8:
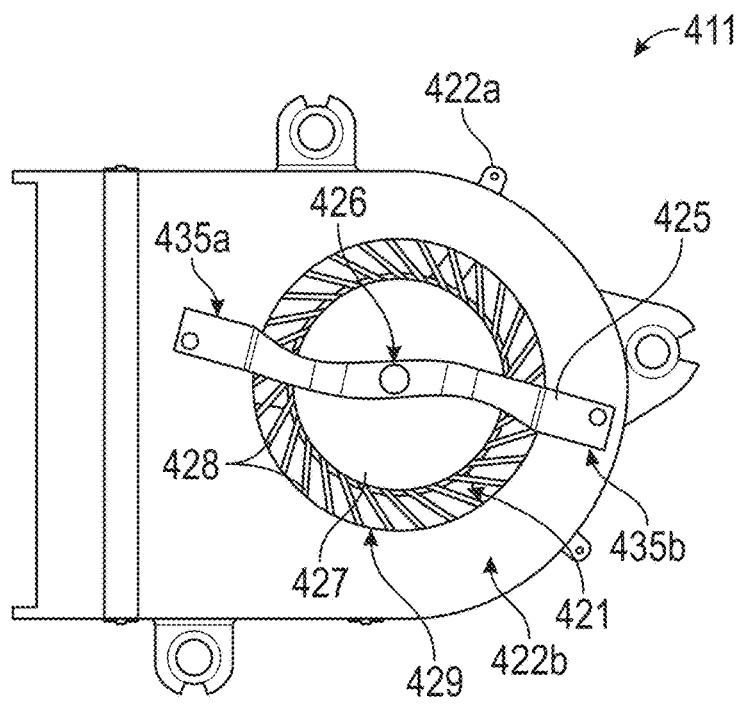
FIG. 8 is a rear plan view of a fan assembly, according to another embodiment.

FIG. 8 is a rear plan view of a fan assembly 411, according to another embodiment. Unless otherwise noted, the components shown in FIG. 8 may include components similar to like numbered components shown in FIGS. 6-7, with the reference numerals incremented by 100 relative to FIGS. 6-7. Unlike the embodiment of FIGS. 6 and 7, however, the elongate member 425 shown in FIG. 8 can have an airfoil shape so as to further improve airflow through the fan assembly 411. In some embodiments, a thickness of the elongate member 425 can vary along a length of the elongate member 425 between the first and second end portions 435a, 435b. In some embodiments, a width of the elongate member 425 can vary along the length of the elongate member 425 between the first and second end portions 435a, 435b. In various embodiments, the width and/or thickness of the elongate member 425 can be selected to be sufficiently strong so as to support the shaft assembly 423 during the expected transverse loading conditions and to accommodate the induced stresses. Thus, the embodiment of FIG. 8 can also beneficially control transverse loading on the shaft assembly 423 while maintaining adequate airflow through the fan assembly 411.

Figure 9:
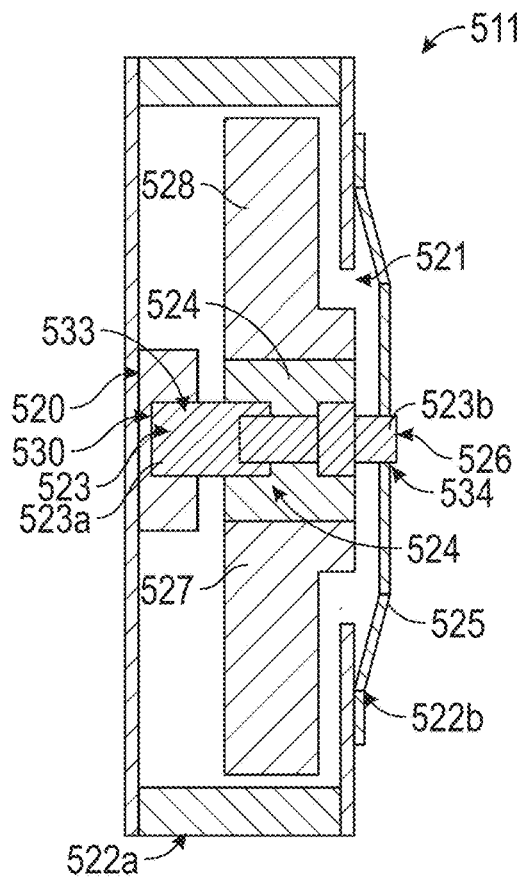
FIG. 9 is a schematic side sectional view of a fan assembly 111, according to another embodiment.

FIG. 9 is a schematic side sectional view of a fan assembly 511, according to another embodiment. Unless otherwise noted, the components shown in FIG. 9 may include components similar to like numbered components shown in FIGS. 6-8, with the reference numerals incremented by 100 relative to FIG. 8. For example, as with the embodiment of FIGS. 6-8, the fan assembly 511 can include the impeller 521 coupled with the shaft assembly 523 (e.g., by way of the bushing 524). Moreover, as with FIGS. 6-8, the first end 533 of the shaft assembly 523 can be fixed or secured to the first frame 522a, for example, at the first shaft support 530 which may be disposed at or on the motor 520 or on a structural body defined by the frame 522a. In addition, as with FIGS. 6-8, the second end 533 of the shaft assembly 523 can be fixed or secured to the second frame 522b at the second shaft support 526, which may also comprise the elongate member 525. Beneficially, the first and second shaft supports 526 can control transverse loading on the shaft assembly 523 and can reduce deflections of the shaft assembly 523. Moreover, as explained above, in some embodiments, the angular orientation of the elongate member 525 can be selected so as to improve airflow through the fan assembly 511 or in some cases to minimize the airflow cost of including the elongate member 525 in the air flow stream.

However, unlike the embodiments of FIGS. 6-8, in FIG. 9, the shaft assembly 523 can comprise a first shaft portion 523a rotationally fixed (e.g., secured) to the first support frame 522a and a second shaft portion 523b rotationally fixed (e.g., secured) to the impeller 521. As shown in FIG. 9, the first end 533 of the shaft assembly 523 can be disposed on a first side of the impeller 521, and the second end 534 of the shaft assembly 523 can be disposed on a second side of the impeller 521 that is opposite the first side. The second shaft portion 523b can be rotatable over and/or relative to a free end of the first shaft portion 523a. In some embodiments, the first and second shaft portions 523a, 523b can comprise two separate shafts that are connected together, e.g., at the impeller 521. In some embodiments, the first and second shaft portions 523a, 523b can comprise a single shaft, with the first portion 523a on the first side of the impeller 521 and the second portion 523b on the second side of the impeller 521.

Thus, in the embodiment of FIG. 9, the first shaft portion 523a can be rotationally fixed relative to the first frame 522a (e.g., the motor 520 or a structural body of the frame 522a. The second shaft portion 523a can rotate with the impeller 521 and bushing 524. As with the above embodiments, supporting the second end 534 of the shaft assembly 523 with the second frame 522b can beneficially control transvers loading conditions and reduce deflections of the shaft assembly 523.

Figure 10:
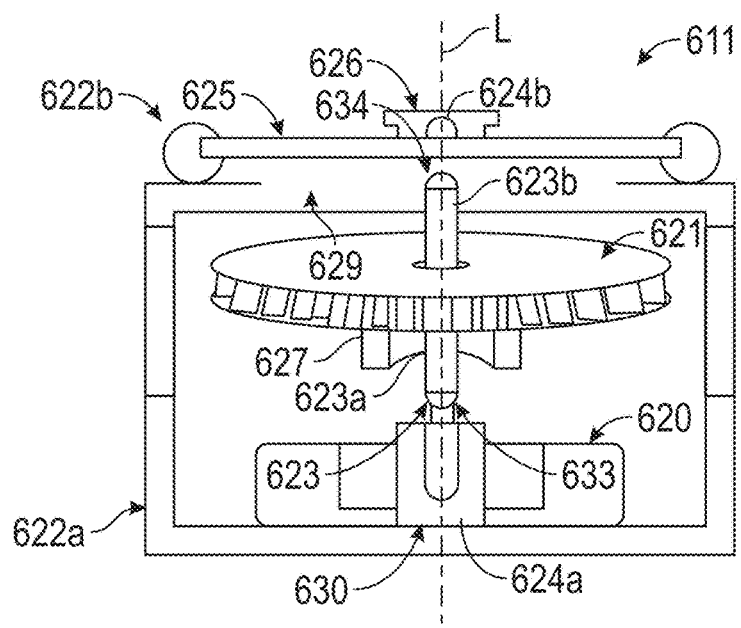
FIG. 10 is a schematic side sectional view of a fan assembly, according to another embodiment.

FIG. 10 is a schematic side sectional view of a fan assembly 611, according to another embodiment. Unless otherwise noted, the components shown in FIG. 10 may include components similar to like numbered components shown in FIGS. 6-9, with the reference numerals incremented by 100 relative to FIG. 9. For example, as with FIG. 9, the first end 633 of the shaft assembly 623 can operably couple with the first frame 622a (which may comprise a structural body of the frame, the motor 620, or any other suitable stationary feature of the fan assembly 611. The second end 634 of the shaft assembly 623 can operably couple with the second frame 622b. In FIG. 10, the impeller 621 and shaft assembly 623 are illustrated in a partially exploded view for ease of illustration. During operation, however, it should be appreciated that the first end 633 of the shaft assembly 623 engages with the first frame 622a, and the second end 634 of the shaft assembly 623 engages with the second frame 622b.

Moreover, as with FIG. 9, the impeller 621 can be coupled with first and second shaft portions 623a, 623b of the shaft assembly 623. The first and second shaft portions 623a, 623b can comprise a single unitary shaft, or the first and second shaft portions 623a, 623b can comprise two separate shafts. In the embodiment of FIG. 10, the shaft portions 623a, 623b can be fixed to the impeller 621 so as to impart rotation to the impeller 621. For example, a portion of the impeller hub 627 can include a follower magnet or rotor assembly. A stator assembly of the motor 620 can be energized so as to create magnetic forces on the hub 627 to impart rotation of the impeller 621. In addition, as shown in FIG. 10, a concave member comprising a first bushing 624a can be coupled or formed with the first frame 622a and/or the motor 620. A second concave member comprising a second bushing 624b can be coupled or formed with the second frame 622b. The first bushing 624a can act as the first shaft support 630 to rotationally support the first end 633 of the shaft assembly 623, and the second bushing 624b can act as or comprise the second shaft support 626 to rotationally support the second end 634 of the shaft assembly 623. Thus, during rotation of the impeller 621, the first end 633 of the first shaft portion 623a can rotate within the first bushing 624a. The second end 634 of the second shaft portion 623a can rotate within the second bushing 624b.

Beneficially, the second bushing 624b can assist in controlling the transverse loading on the shaft assembly 624 during operation of the fan assembly 611. As shown, the second bushing 624b of the shaft support 626 can be aligned along or aligned concentrically relative to the second shaft portion 623b. In some embodiments, the second shaft support 626 can also comprise the elongate member 625 extending across part of or the entire airflow opening 629. As shown in FIG. 10, one or both of the first and second bushings 624a, 624b can comprise a concave member, e.g., a concave inner surface. In some embodiments, the concave inner surface may comprise or define a generally or substantially spherical surface. The concave inner surface defined in the first and/or second bushings 624a, 624b can beneficially permit rotation of the shaft assembly 623 while supporting both ends 633, 634 of the shaft assembly 623 against transverse loading conditions. Moreover, the concave inner surfaces of the first and/or second bushings 624a, 624b can be shaped so as to accommodate small but acceptable rotation and/or translation of the ends 633, 634 of the shaft assembly 623. Accommodating such negligible movement of the ends 633, 634 can further reduce stresses on the shaft assembly 623 while preventing undesirable large deformations.

Figure 10A:
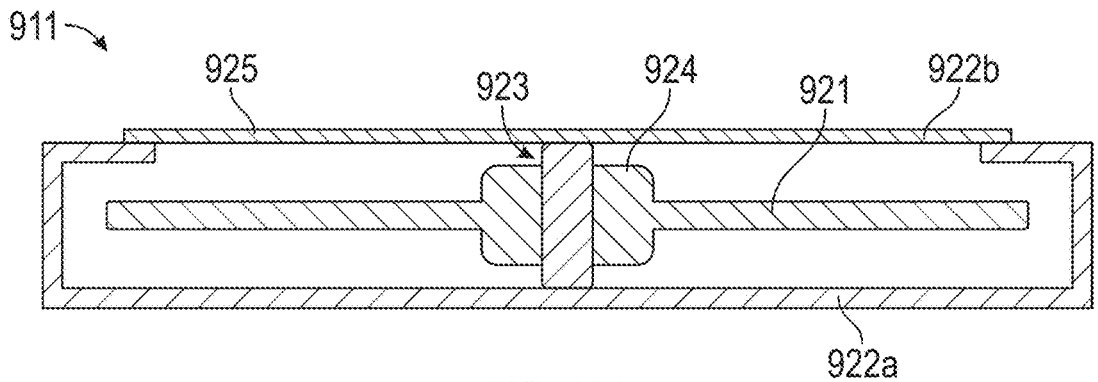
FIG. 10A is a schematic side view of a fan assembly comprising a shaft assembly that operably couples to an impeller assembly by way of a bushing, according to some embodiments.

FIGS. 10A-10D illustrate additional examples of a fan assembly that can be used in conjunction with the embodiments disclosed herein. For example, FIG. 10A is a schematic side view of a fan assembly 911 comprising a shaft assembly 923 that operably couples to an impeller assembly 921 by way of a bushing 924. Unless otherwise noted, the components shown in FIG. 10A may include components similar to like numbered components shown in FIGS. 6-10, with the reference numerals incremented by 100 relative to FIG. 10. In the embodiment of FIG. 10A, the shaft assembly 923 can comprise a single shaft that can be connected at its ends to frames 922a, 922b (e.g., welded to the elongate member 925 or frame 922b, mechanically fastened, or otherwise fixed). In some embodiments, one of the frames 922b can comprise the elongate member 925. In FIG. 10A, the shaft assembly 923 can comprise a separate member from the bushing 924 and impeller 921, e.g., the shaft assembly 923 of FIG. 10A may not be integrally formed with the bushing 924. In FIG. 10A, the shaft assembly 923 may or may not be rotationally fixed to the bushing 924. For example, in some embodiments, the shaft assembly 923 may not be rotationally fixed to the bushing 924 such that the bushing 924 and impeller 921 may rotate relative to (e.g., may rotate about) the fixed shaft assembly 923. In other embodiments, the bushing 924 and impeller 921 may be rotationally fixed or coupled to the shaft assembly 923 such that the impeller 921 and bushing 924 rotate with or follow the rotation of the shaft assembly 923.

Figure 10B:
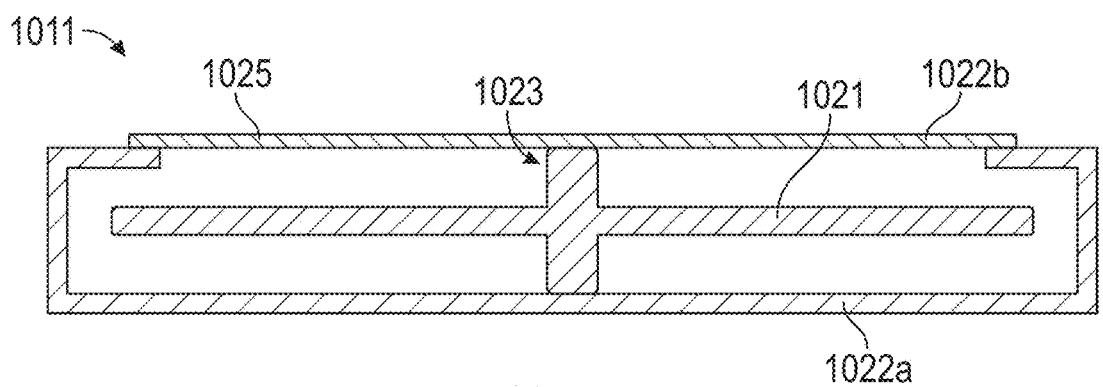
FIG. 10B is a schematic side view of a fan assembly comprising a shaft assembly that operably couples to an impeller assembly by way of a bushing, according to another embodiment.

FIG. 10B is a schematic side view of a fan assembly 1011 comprising a shaft assembly 1023 that operably couples to an impeller assembly 1021 by way of a bushing 1024. Unless otherwise noted, the components shown in FIG. 10B may include components similar to like numbered components shown in FIGS. 6-10A, with the reference numerals incremented by 100 relative to FIG. 10A. Unlike the embodiment of FIG. 10A, in the embodiment of FIG. 10B, the shaft assembly 1023 may be physically integrated with the impeller 1021 (and/or with a bushing, not shown) so as to define a single unitary shaft assembly and impeller. Thus, in FIG. 10B, the shaft assembly 1023 can be fixed at its ends to the frames 1022a, 1022b (one of which may comprise an elongate member 1025). Rotation of the shaft assembly 1023 can impart rotation to the integrally formed impeller 1021.

Figure 10C:
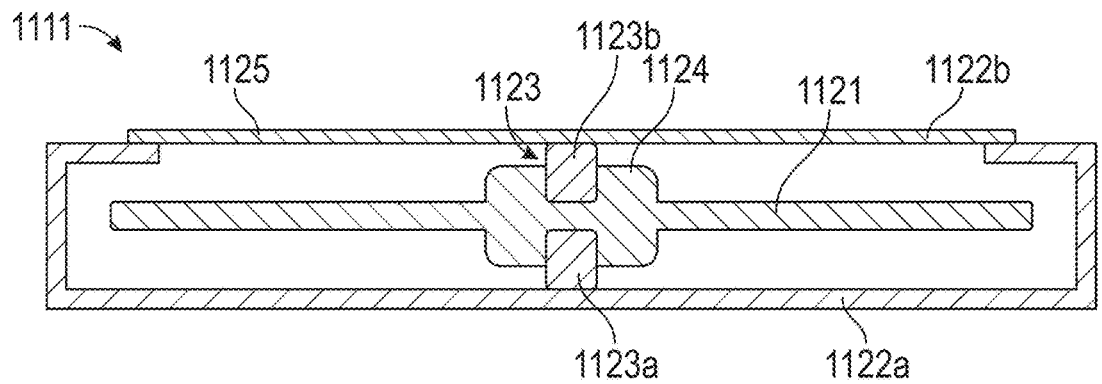
FIG. 10C is a schematic side view of a fan assembly comprising a shaft assembly having first and second shaft portions operably coupled with the impeller, according to another embodiment.

FIG. 10C is a schematic side view of a fan assembly 1111 comprising a shaft assembly 1123 having first and second shaft portions 1123a, 1123b operably coupled with the impeller 1121. Unless otherwise noted, the components shown in FIG. 10C may include components similar to like numbered components shown in FIGS. 6-10B, with the reference numerals incremented by 100 relative to FIG. 10B. In the embodiment of FIG. 10C, the first and second shaft portions 1123a, 1123b can comprise separate shafts that are respectively coupled with the frames 1122a, 1122b. The first and second shaft portions 1123a, 1123b can connect to the impeller 1121 by way of the hub 1124. In FIG. 10C, the first and second shaft portions 1123a, 1123b can be fixed to the frames 1122a, 1122b such that the impeller 1121 and hub 1124 rotate relative to the shaft portions 1123a, 1123b. In other embodiments, the first and second shaft portions 1123a, 1123b can be fixed to the hub 1124 such that the hub 1124 and impeller 1121 can rotate with the first and second shaft portions 1123a, 1123b.

Figure 10D:
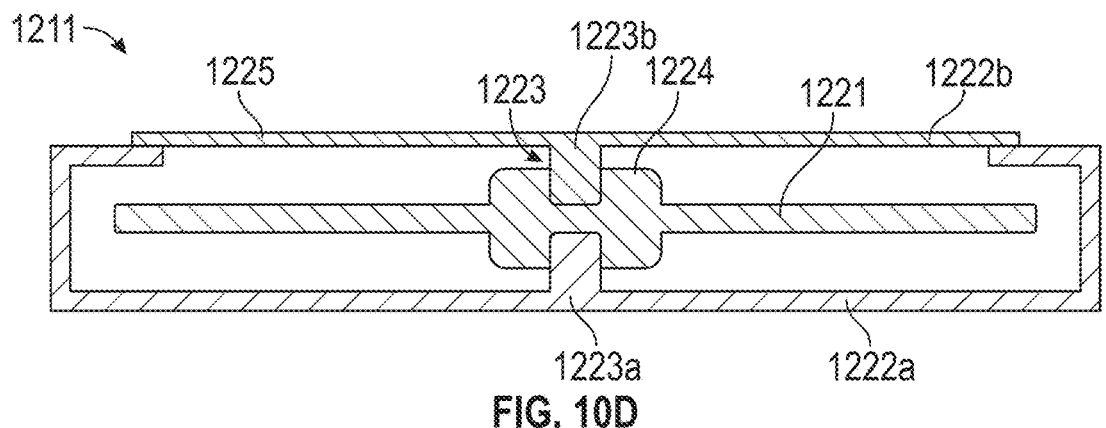
FIG. 10D is a schematic side view of a fan assembly comprising a shaft assembly having first and second shaft portions operably coupled with the impeller, according to another embodiment.

FIG. 10D is a schematic side view of a fan assembly 1211 comprising a shaft assembly 1223 having first and second shaft portions 1223a, 1223b operably coupled with the impeller 1221. Unless otherwise noted, the components shown in FIG. 10D may include components similar to like numbered components shown in FIGS. 6-10C, with the reference numerals incremented by 100 relative to FIG. 10C. Unlike the embodiment of FIG. 10C, for example, the first shaft portion 1223a can be integrally formed with the first frame 1222a, e.g., the first shaft portion 1223a and the first frame 1222a can define a single unitary component such that the first shaft portion 1223a extends from the first frame 1222a. Similarly, the second shaft portion 1223b can be integrally formed with the second frame 1222b, e.g., the second shaft portion 1223b and the second frame 1222b can define a single unitary component such that the second shaft portion 1223b extends from the second frame 1222b. In some embodiments, the first and second shaft portions

1223a, 1223b can be fixed such that the hub 1224 and impeller 1221 rotate relative to the shaft portions 1223a, 1223b.

Figure 11:
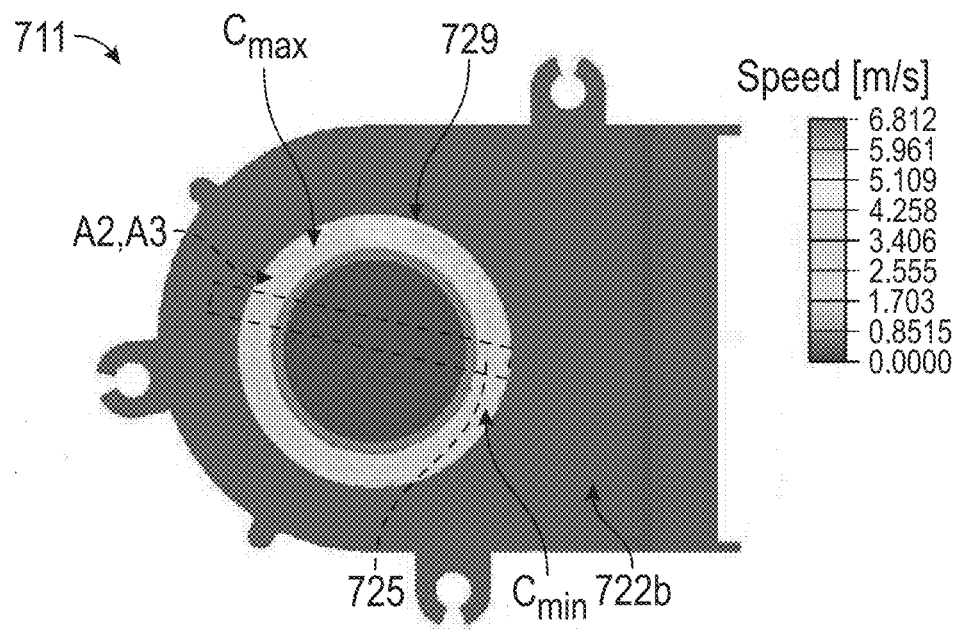
FIG. 11 is a plan view of flow patterns within a fan assembly before an elongate member is attached to the fan assembly.
Figure 12:
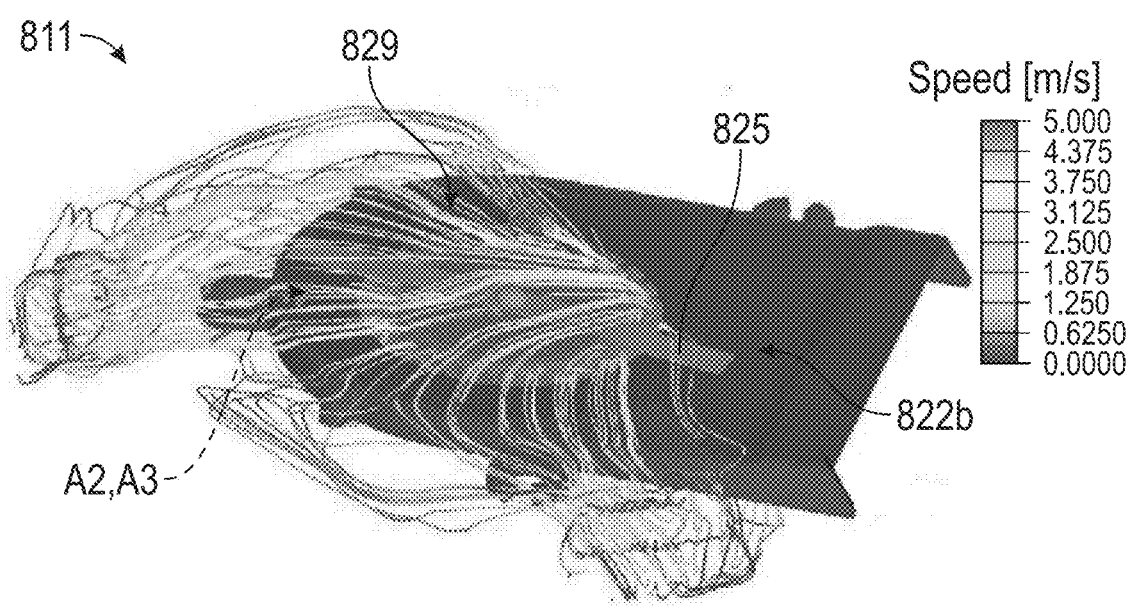
FIG. 12 is a schematic perspective view of flow patterns within and around a fan assembly after the elongate member is placed at a desired orientation relative to the fan assembly.

FIG. 11 is a plan view of flow patterns within a fan assembly 711 before an elongate member 725 is attached to the fan assembly 711. FIG. 12 is a schematic perspective view of flow patterns within and around a fan assembly 811 after the elongate member 825 is placed at a desired orientation relative to the fan assembly 811. The flow patterns of FIGS. 11 and 12 were computed using computational fluid dynamics (CFD) techniques.

FIG. 11 represents the velocity field of cooling air currents A2, A3 (see FIG. 4A) that flow into the airflow opening 729 of the fan assembly 711, without or before the elongate member 725 is attached. As explained above, the fan assembly 711 may be used in conjunction with various types of portable electronic devices, which may include different types or numbers of electronic components. Once the electronic device design has been completed, the flow patterns through the fan assembly 711 can be computed to determine the velocity field of the fan assembly 711 during operation and accounting for the electronic components within the housing. For the assembly 711 shown in FIG. 11 when used in conjunction with a local processing and data module 70, the circumferential location Cmax representative of maximum or increased airflow can be determined. Similarly, the circumferential location Cmin representative of minimum or reduced airflow can be determined.

Based on the velocity profile determined for the fan assembly 711 without the elongate member 725, the desired orientation of the elongate member 725 can be selected. In some cases, it may be desirable to orient the elongate member 725 to correspond to minimum airflow through the opening 729. In some embodiments, one end portion of the elongate member 725 can be positioned at the circumferential location Cmin and the other end portion can be disposed at an opposite circumferential location. In some embodiments, the first and second end portions of the elongate member 725 can be positioned circumferentially based on a weighted average or other determinative criteria for minimum airflow. By positioning the elongate member 725 at regions of minimum or reduced airflow, the effect of the elongate member 725 on the airflow into the fan assembly 711 can be reduced or eliminated.

FIG. 12 illustrates the airflow pathways A2, A3 and their velocity profiles through the fan assembly 811 after the elongate member 825 is oriented according to the selections and determinations made in connection with FIG. 11. As shown in FIG. 12, the elongate member 825 does not appreciably reduce the airflow through the fan assembly 811. Rather, the airflow pathways A2, A3 pass over the elongate member 825 with little or no loss of momentum.

Figure 13B:
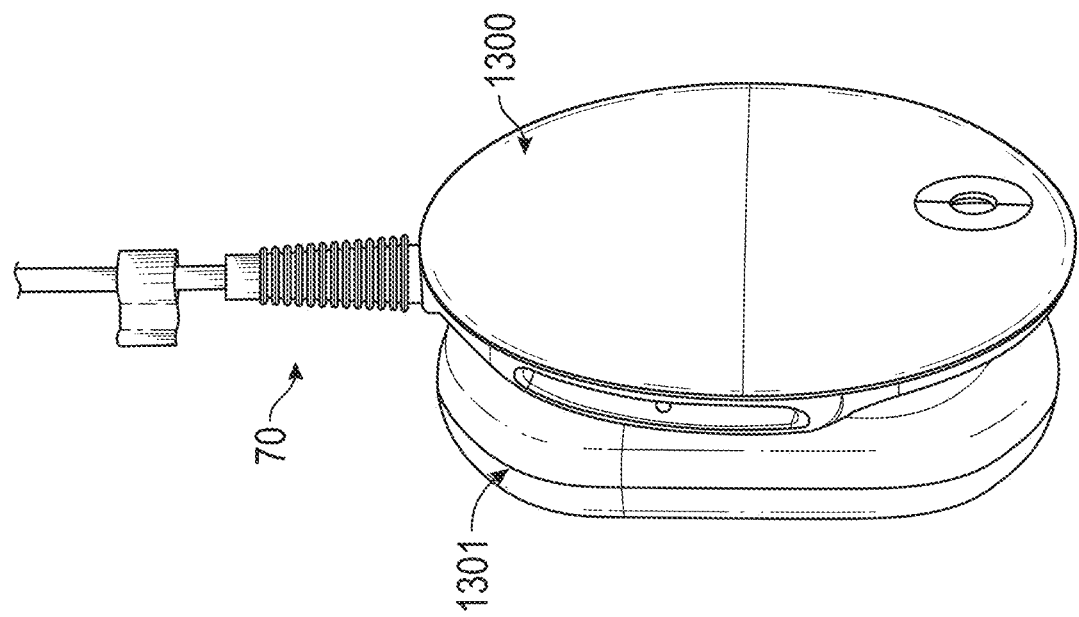
FIG. 13B is a schematic front, right perspective view of the electronic device of FIG. 13A.
Figure 13A:
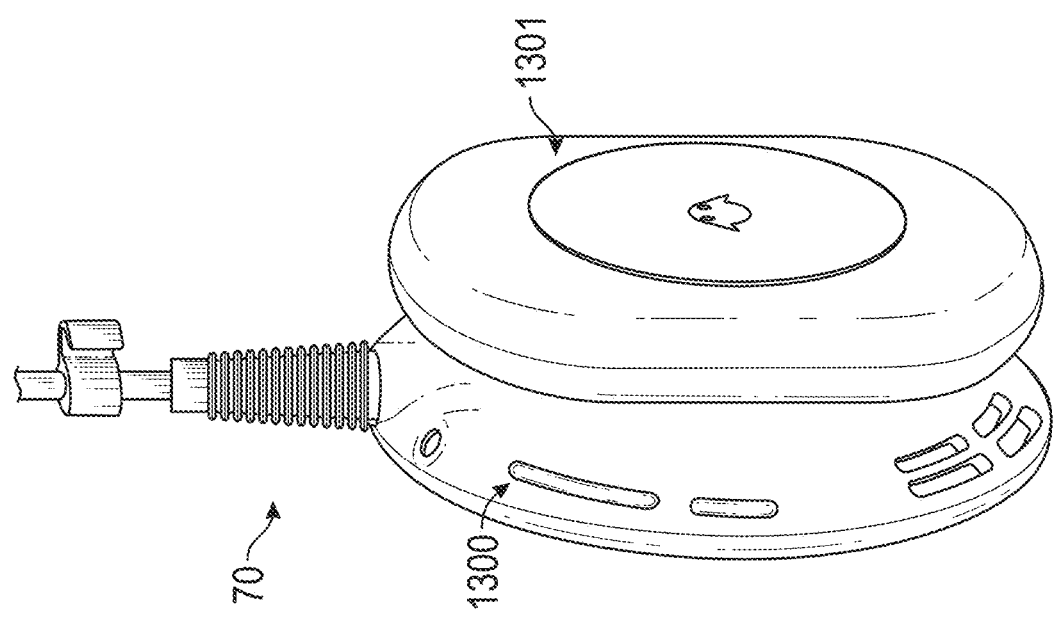
FIG. 13A is a schematic back, left perspective view of an electronic device according to one embodiment.
Figure 13D:
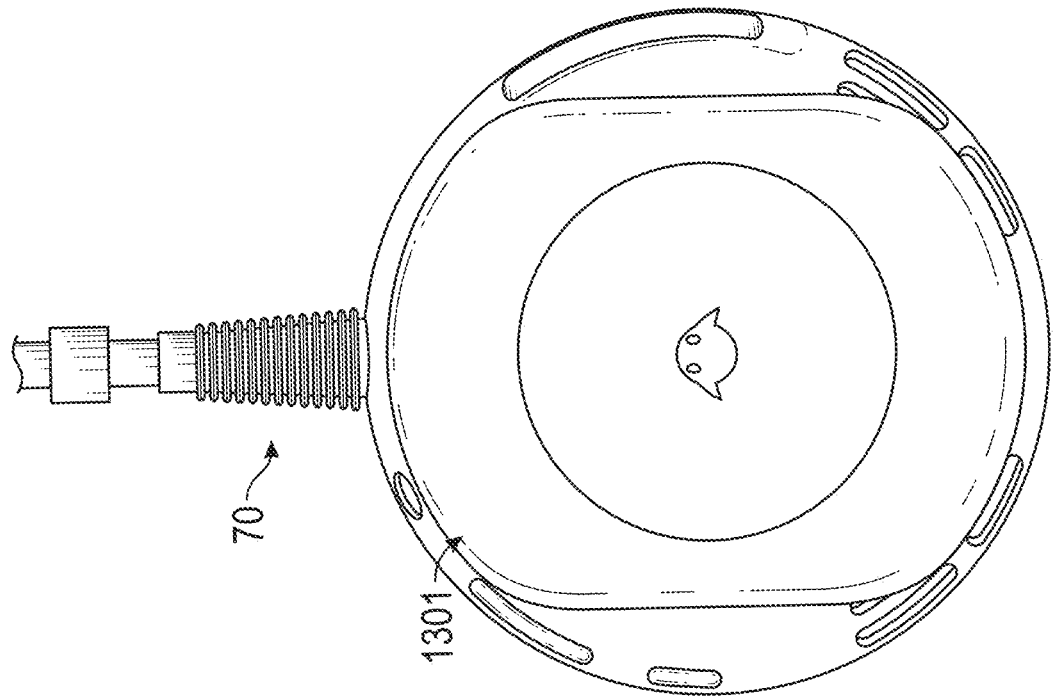
FIG. 13D is a schematic back plan view of the electronic device of FIGS. 13A-13C.
Figure 13C:
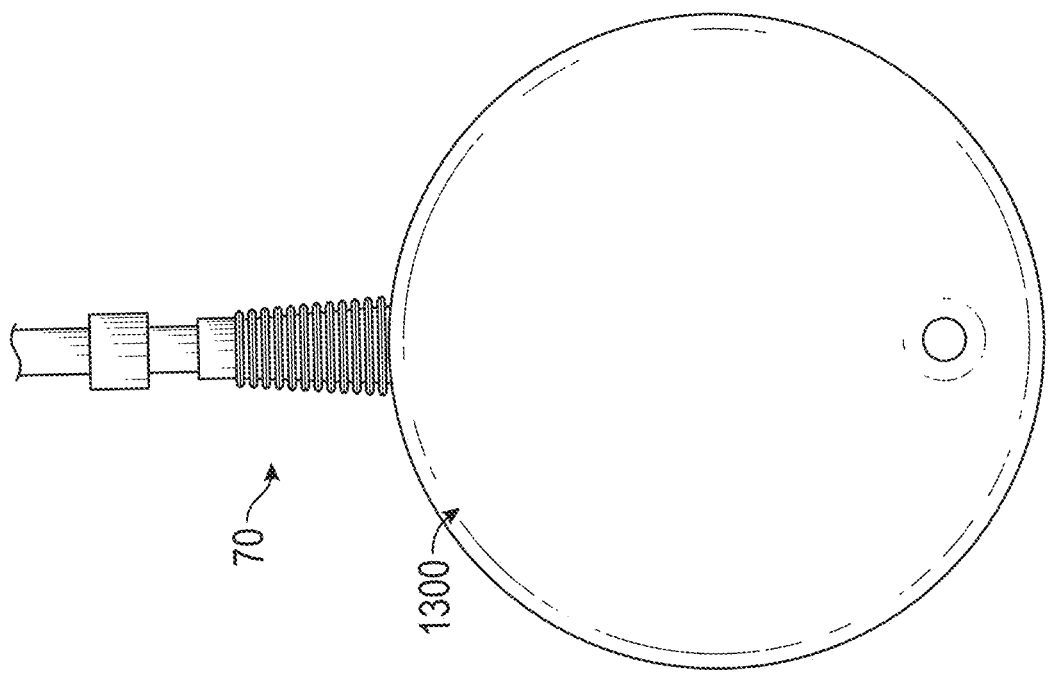
FIG. 13C is a schematic front plan view of the electronic device of FIGS. 13A-13B.
Figure 13E:
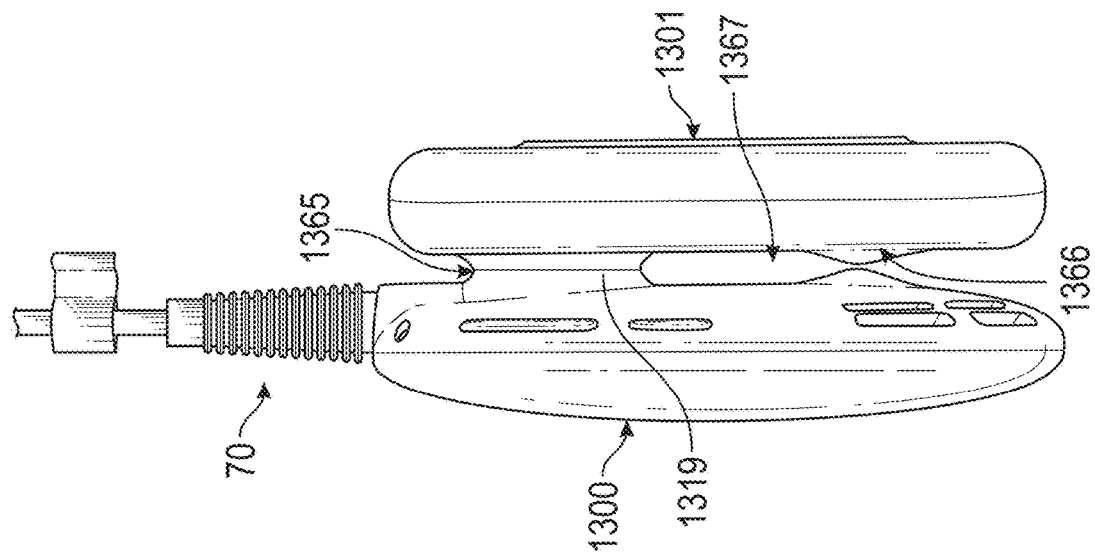
FIG. 13E is a schematic right side view of the electronic device of FIGS. 13A-13D.
Figure 13F:
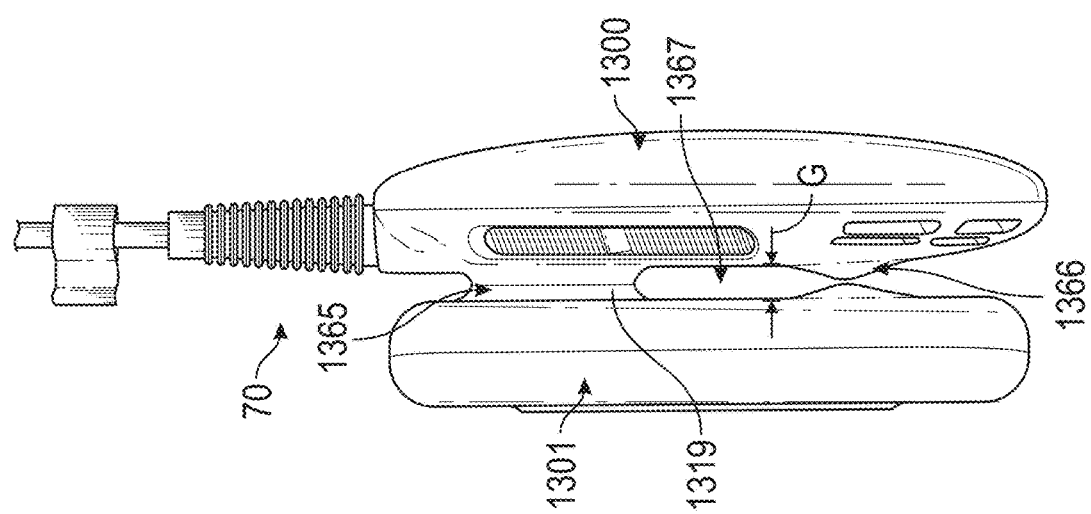
FIG. 13F is a schematic left side view of the electronic device of FIGS. 13A-13E.
Figure 13H:
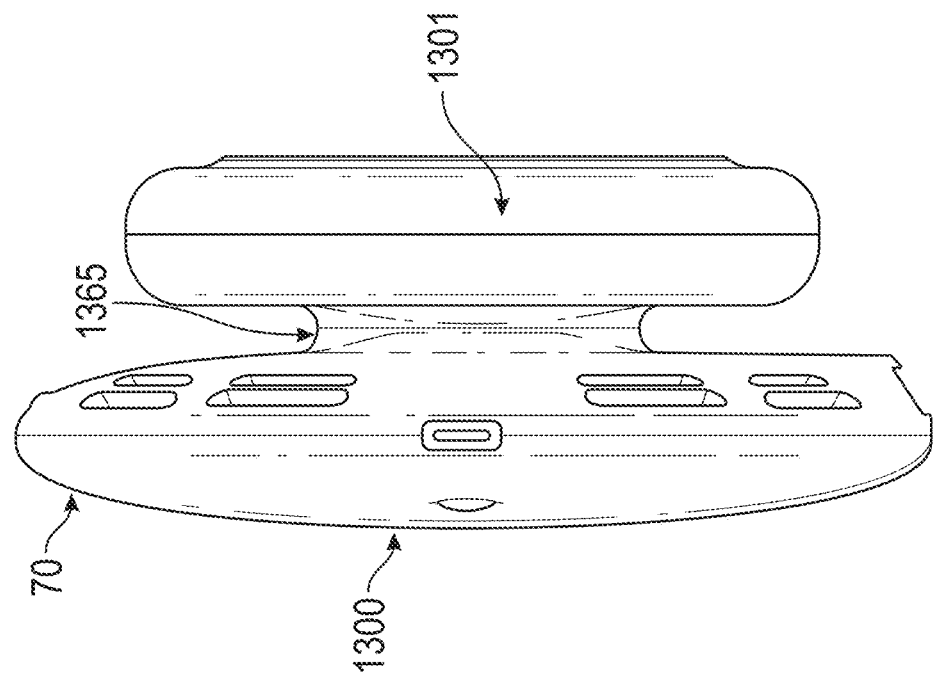
FIG. 13H is a schematic bottom plan view of the electronic device of FIGS. 13A-13G.
Figure 13G:
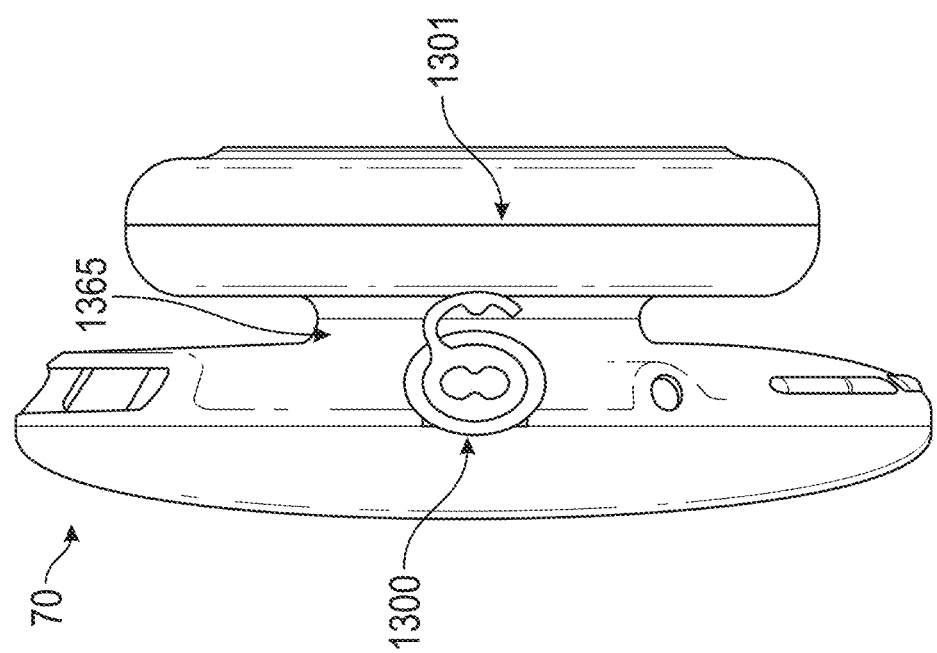
FIG. 13G is a schematic top plan view of the electronic device of FIGS. 13A-13F.

FIG. 13A is a schematic back, left perspective view of an electronic device according to one embodiment. FIG. 13B is a schematic front, right perspective view of the electronic device of FIG. 13A. FIG. 13C is a schematic front plan view of the electronic device of FIGS. 13A-13B. FIG. 13D is a schematic back plan view of the electronic device of FIGS. 13A-13C. FIG. 13E is a schematic right side view of the electronic device of FIGS. 13A-13D. FIG. 13F is a schematic left side view of the electronic device of FIGS. 13A-13E. FIG. 13G is a schematic top plan view of the electronic device of FIGS. 13A-13F. FIG. 13H is a schematic bottom plan view of the electronic device of FIGS. 13A-13G.

The electronic device can comprise the local processing and data module 70 described above. As explained above in connection with FIGS. 3A-3D, the local processing and data module 70 can comprise a first enclosure 1300 (which may be similar to the enclosure 100) and a second enclosure 1301 spaced from the first enclosure 1300 by a gap 1367. As explained herein, one or more electronic devices (e.g., processor(s)) may be provided in a first compartment defined at least in part by the first enclosure 1301. One or more other electronic devices (e.g., one or more batteries, one or more processor(s), etc.) may be provided in a second compartment defined at least in part by the second enclosure 1302.

In various embodiments, it can be desirable to operate the electronic device at high speeds (e.g., at high speeds for central processing and/or graphics processing units), while also charging the power supply (e.g., battery(ies) of the electronic device). The battery(ies) disclosed herein can be any suitable type of battery, including, e.g., a lithium ion battery(ies). However it can be challenging to operate the processor(s) at high speeds (and corresponding high temperatures) while also charging and/or discharging the battery(ies). For example, in some embodiments, the processor(s) can operate up to about 95° C. before throttling back (e.g., before dynamic frequency scaling or throttling is started). Such high temperatures for processor operation may exceed the maximum temperature thresholds for effective battery usage (e.g., which may be at or near 45° C. in some embodiments). Thus, the temperature rise from operating the processor(s) at high speeds may reduce the ability to rapidly and effectively charge the battery(ies) during use of the electronic device (e.g., during high speed operation of the processor(s)). It should be appreciated that the processor and battery operating temperatures are schematic, and that the processor(s) and battery(ies) can be operated at various temperatures.

Accordingly, various embodiments disclosed herein utilize the first and second enclosures 1300, 1301 in conjunction with a connection portion 1365 to thermally separate the compartments of the enclosures 1300, 1301. For example, the processor(s) may be disposed in the first compartment of the first enclosure 1300, and may operate at high speeds and, therefore, high temperatures. The battery(ies) can be disposed in the second compartment of the second enclosure 1301 and can electrically communicate with other components of the device, e.g., with the processor(s) in the first enclosure 1300. In some embodiments, one or more processing elements can be disposed in the first enclosure 1300, and one or more other processing elements can be disposed in the second enclosure 1301. In some embodiments the processing elements in both enclosures 1300, 1301 can be used to control the operation of the system.

In some embodiments, the connection portion 1365 can comprise the channel 1319, which may be similar to the channel 119 described above. In some embodiments, the connection portion 1365 can comprise an air or thermal gap that separates the first and second enclosures 1300, 1301. The relatively low thermal conductivity of the air gap (and high thermal insulation properties) can serve to thermally separate the processor(s) in the first enclosure 1300 from the battery(ies) in the second enclosure 1301. In some embodiments, one or more connectors or wires can pass through the channel 119 to electrically connect the processor(s) in the first enclosure 1300 with the battery(ies) of the second enclosure 1301. Additional components may also be provided in the first and/or second enclosures 1300, 1301. Beneficially, therefore, the thermal gap provided by the connection portion 1365 can reduce or substantially prevent heat from passing from the processor(s) in the first enclosure 1300 to the battery(ies) in the second enclosure 1301. Thus, the processor(s) can operate at relatively high speeds and temperatures, while maintaining the battery(ies) at sufficiently low temperatures so as to enable charging during operation of the processor(s). By contrast, providing the battery(ies) and processor(s) within a single compartment or enclosure may not provide adequate heat separation between the battery(ies) and processor(s).

In the illustrated embodiment, the connection portion 1365 comprises an air gap to provide thermal insulation between the first and second enclosures 1300, 1301. In other embodiments, other low thermal conductivity materials (such as insulators or dielectrics) may be provided in the connection portion 1365. For example, in some embodiments, a thermally insulating polymer (e.g., potting compound or encapsulant) may be provided in the connection portion 1365. In some embodiments, the first and second compartments defined by the first and second enclosures 1300, 1301 may also be filled with a gas (e.g., air). In other embodiments, the electronic devices (e.g., processor(s), battery(ies), etc.) may also be encapsulated or otherwise enclosed within another type of insulating material, such as a polymer or dielectric.

Further, as shown in FIGS. 13E-F, the first and second enclosures 1300, 1301 can be separated by a gap 1367 (e.g., at a location spaced from or below the connection portion 1365) having a gap width Gas shown in FIG. 13E, which may be similar or generally the same as the width or gap defined by the connection portion 1365 disposed or extending between the first and second enclosures 1300, 1301. The gap 1367 (e.g., an air gap between the enclosures 1300, 1301) can provide improved thermal separation between the first and second enclosures 1300, 1301. In some embodiments, a majority of the spaces between the compartments within first and second enclosures 1300, 1301 may be filled with air or a gas. For example, the channel 1319 can be filled with a gas in some embodiments, and the gap 1367 between outer portions of the enclosures 1300, 1301 can comprise a gas such as air. As shown, the channel 1319 can have a side cross-sectional area that is smaller than a cross-sectional area of the first compartment of the first enclosure 1300 (and/or smaller than the cross-sectional area of the second compartment of the second enclosure 1301), taken along a direction parallel to a maximum dimension of the first compartment.

The enclosures 1300, 1301 can comprise a clip 1366 disposed within the gap 1367. The clip 1366 can comprise projection(s) extending from the first and second enclosures 1300, 1301. The clip 1366 can improve wearability of the module 70, e.g., on a belt or other clothing accessory of the user). In some embodiments, the gap width G of the connection portion 1365 (e.g., the channel 1319) and/or the gap 1367 may be in a range of 0.5 mm to 10 mm, in a range of 1 mm to 7 mm, or in a range of 1 mm to 5 mm. Providing a thermal gap or thermal barrier (e.g., air gap) may provide sufficient thermal separation between the enclosures 1300, 1301. In some embodiments, one or both of the enclosures 1300, 1301 may be constructed of a material that has a relatively low thermal conductivity so as to further improve the thermal barrier between the internal compartments of the enclosures 1300, 1301. For example, in some embodiments, a lower thermal conductivity material (e.g., aluminum or plastic) may be used as compared with higher thermal conductivity materials. In various embodiments, as disclosed above, the thermal gap provided by the connection portion 1365 and/or the gap 1367 may still permit at least some heat flow from the first enclosure 1300 to the second enclosure 1301. The fan assemblies disclosed herein can mitigate this heat transfer, however, so as to reduce heat dissipation from the first enclosure 1300 to the second enclosure 1301.

Figure 14A:
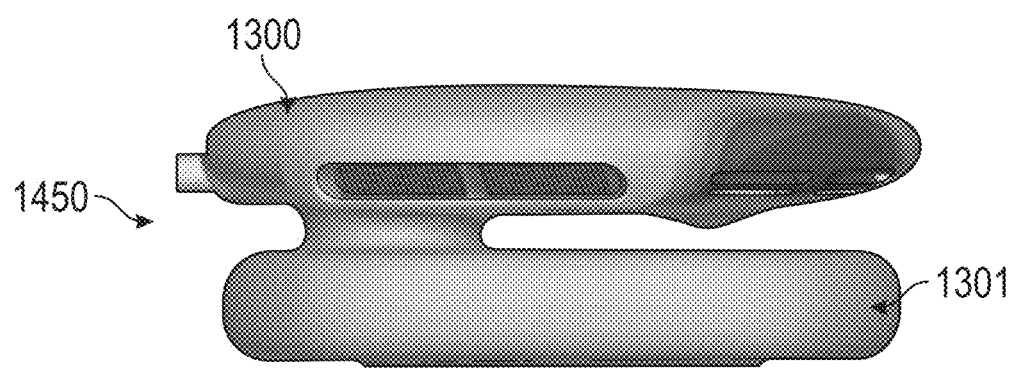
FIG. 14A is a schematic heat transfer map of a side view of the electronic device of FIGS. 13A-13H during operation of the electronic devices.
Figure 14B:
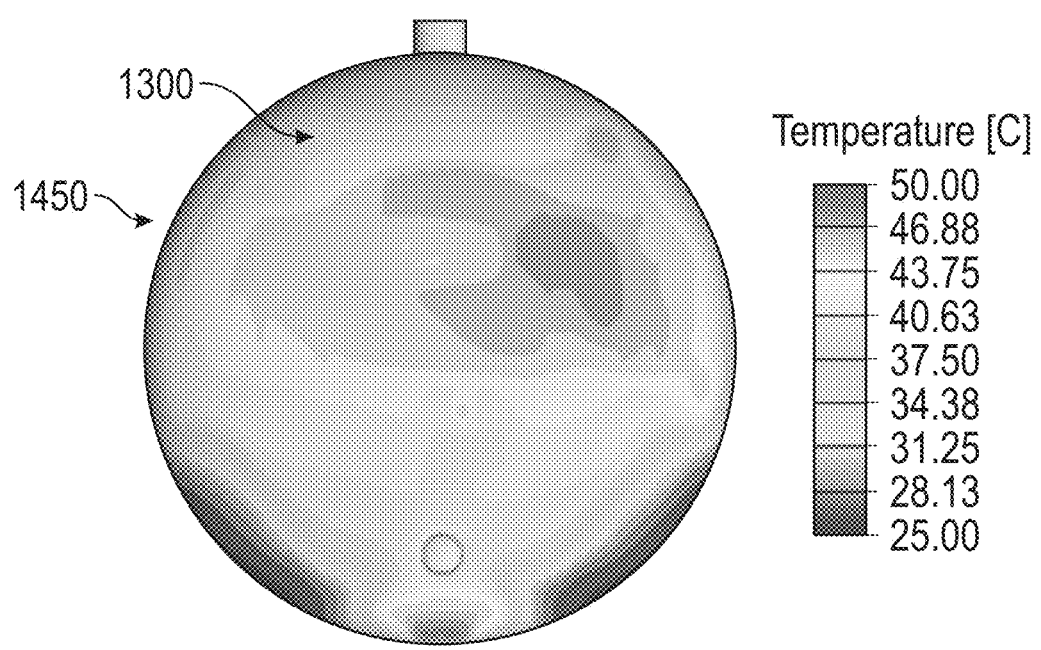
FIG. 14B is a schematic top view of the heat transfer map of FIG. 14A.

FIG. 14A is a schematic heat transfer map 1450 of a side view of the electronic device of FIGS. 13A-13H during operation of the electronic devices. FIG. 14B is a schematic top view of the heat transfer map 1450. As shown in FIGS. 14A and 14B, the temperature profile of the first enclosure 1300 (in which the processor(s) may be disposed) may be significantly higher than the temperature profile of the second enclosure 1301 (in which the battery(ies) may be disposed), indicating that the connection portion 1365 and/or the gap 1367 provide adequate thermal separation between the enclosures 1300, 1301. Various embodiments can beneficially provide thermal separation between the enclosures 1300, 1301 of at least 40° C., at least 50° C., etc.

Figure 15B:
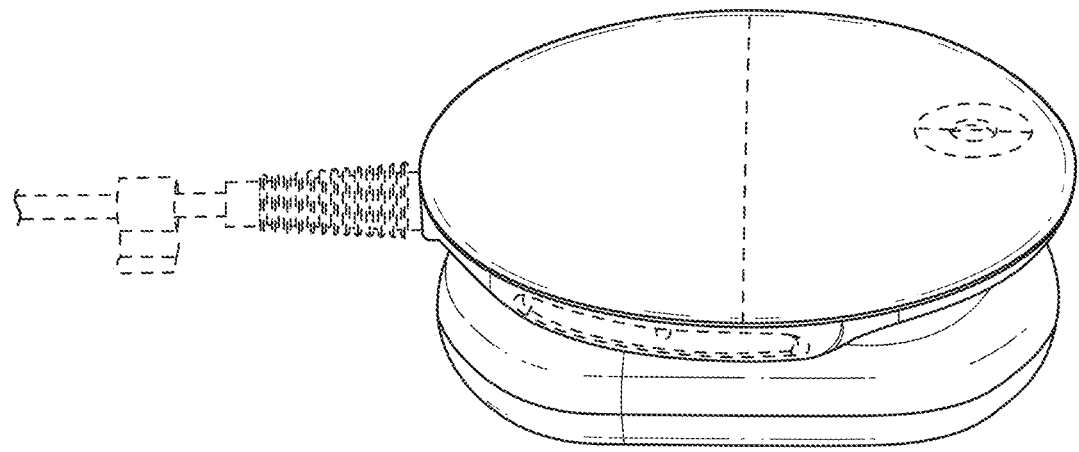
FIG. 15B is a schematic front, right perspective view of the electronic device of FIG. 15A.
Figure 15A:
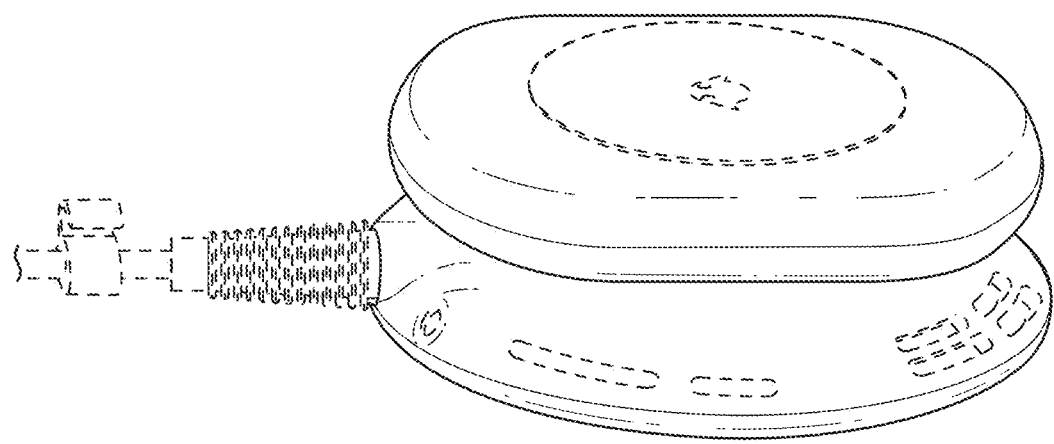
FIG. 15A is a schematic back, left perspective view of an electronic device according to one embodiment of a present design.
Figure 15D:
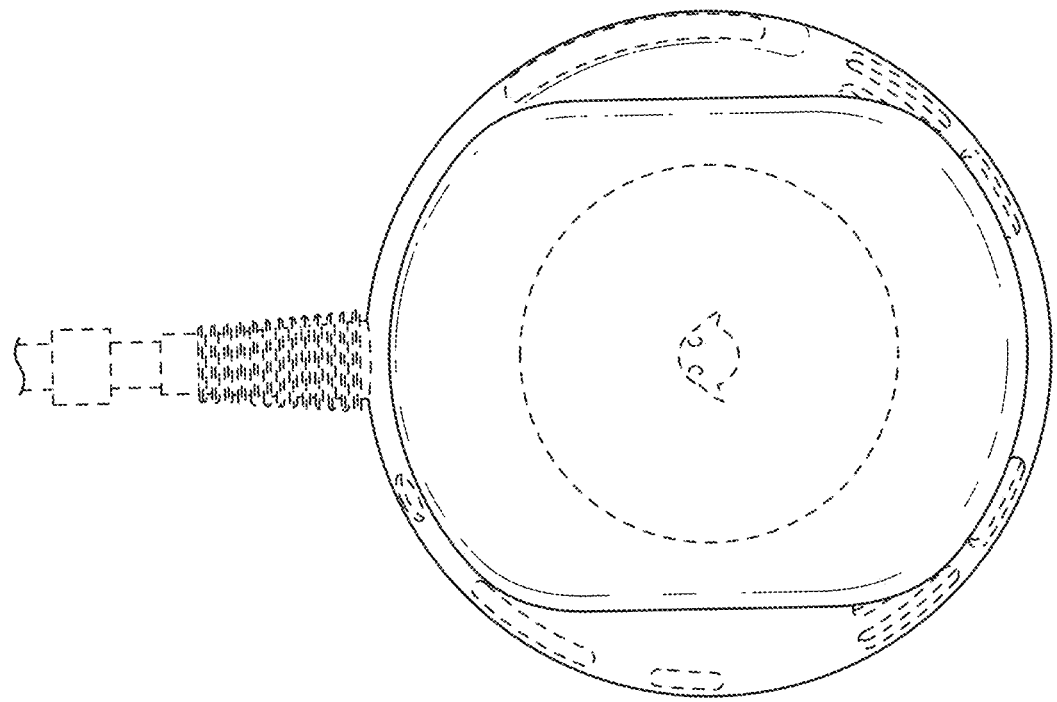
FIG. 15D is a schematic back plan view of the electronic device of FIGS. 15A-15C.
Figure 15C:
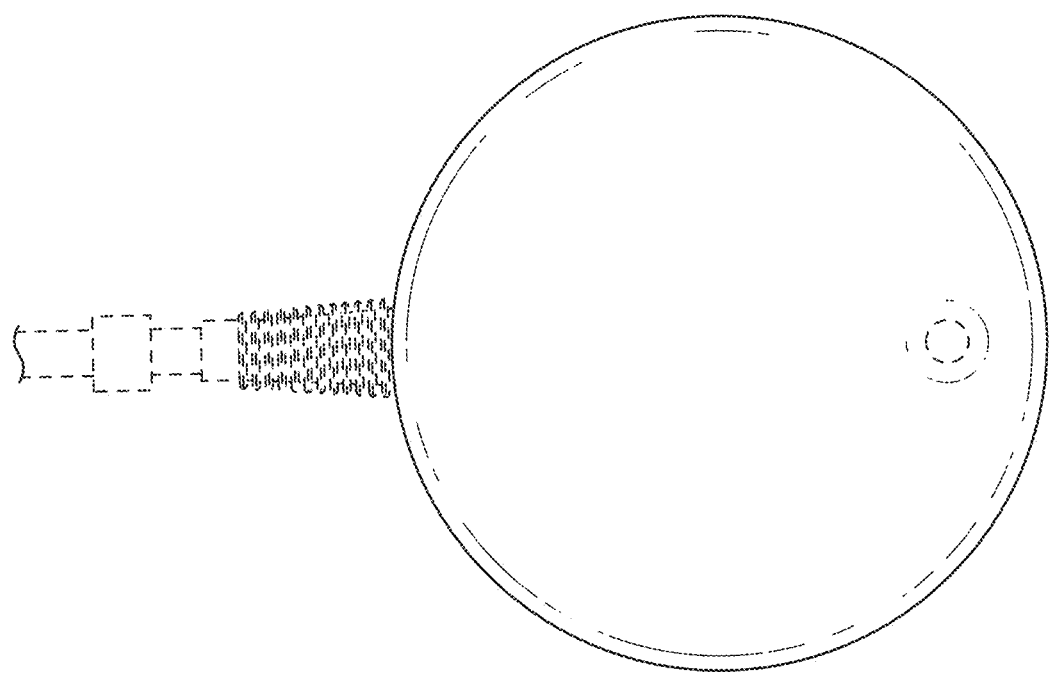
FIG. 15C is a schematic front plan view of the electronic device of FIGS. 15A-15B.
Figure 15E:
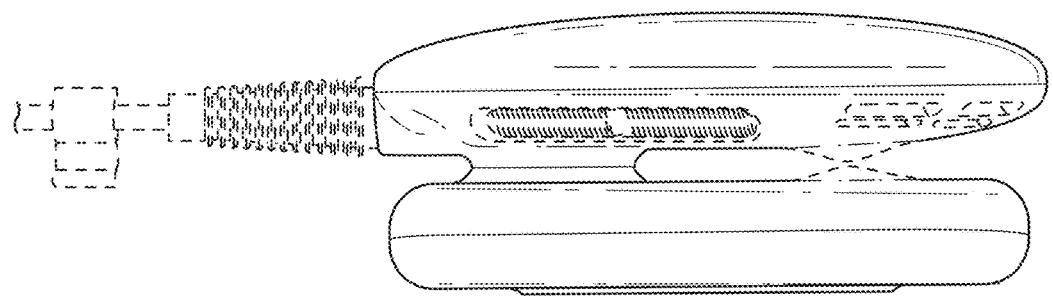
FIG. 15E is a schematic right side view of the electronic device of FIGS. 15A-15D.
Figure 15F:
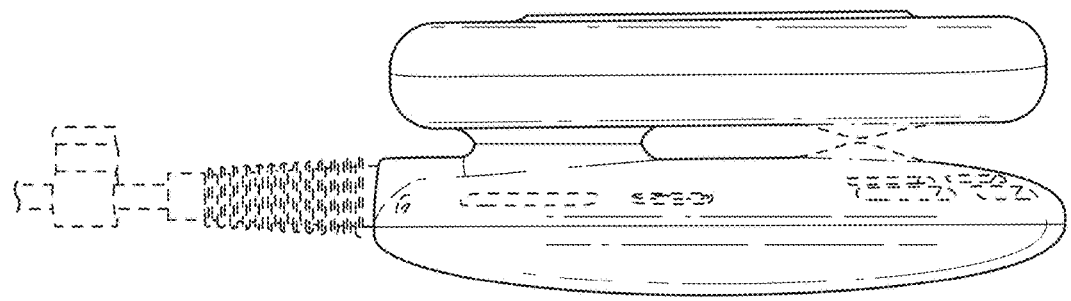
FIG. 15F is a schematic left side view of the electronic device of FIGS. 15A-15E.
Figure 15H:
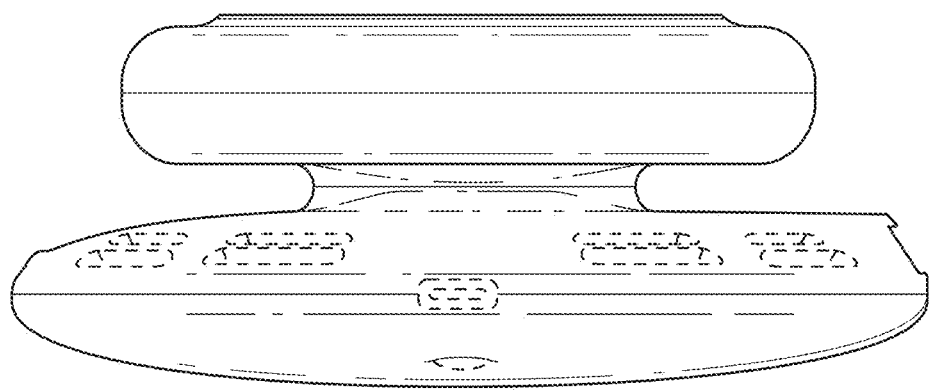
FIG. 15H is a schematic bottom plan view of the electronic device of FIGS. 15A-15G.
Figure 15G:
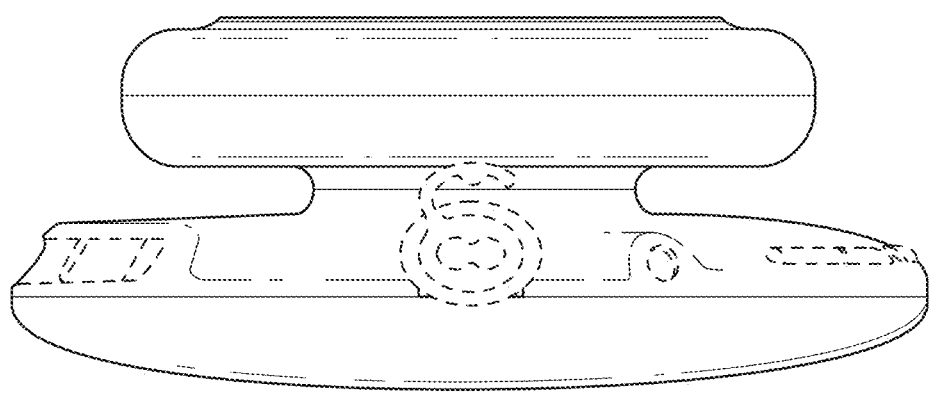
FIG. 15G is a schematic top plan view of the electronic device of FIGS. 15A-15F.

In various embodiments disclosed herein, we, the inventors, have invented new, original and ornamental designs for an electronic device. In FIGS. 15A-15H, the shading shows contours and the broken lines are for illustrative purposes and form no part of the claimed design. FIG. 15A is a schematic back, left perspective view of an electronic device according to one embodiment of the present design. FIG. 15B is a schematic front, right perspective view of the electronic device of FIG. 15A. FIG. 15C is a schematic front plan view of the electronic device of FIGS. 15A-15B. FIG. 15D is a schematic back plan view of the electronic device of FIGS. 15A-15C. FIG. 15E is a schematic right side view of the electronic device of FIGS. 15A-15D. FIG. 15F is a schematic left side view of the electronic device of FIGS. 15A-15E. FIG. 15G is a schematic top plan view of the electronic device of FIGS. 15A-15F. FIG. 15H is a schematic bottom plan view of the electronic device of FIGS. 15A-15G. Various embodiments are accordingly directed to the ornamental designs for an electronic device, as shown and described herein, including at least in FIGS. 15A-15H.

Examples of Thermal Management Systems

Various embodiments disclosed herein relate to thermal management systems for electronic devices, including any of the devices described above (e.g., the local processing and data module 70 with enclosures comprising processing circuitry and a power supply or battery). The local processing and data module 70 can comprise a relatively small device that utilizes a large amount of electrical power. For example, in various embodiments that comprise an augmented or virtual reality device, the extensive use of graphics-based devices can draw a large amount of power in a small space, which can raise the temperature of the local processing and data module 70. It can be important to reduce the temperature of the local processing and data module 70 to temperature levels that are comfortable to the user and that avoid damaging components of the module 70.

To reduce the temperature during operation of the local processing and data module 70, various embodiments disclosed herein can employ an active cooling mechanism, in which instructions are stored for processing circuitry to control the operation of a fan (e.g., software- and/or firmware-controlled hardware), such as any of the fan assemblies described above. Some embodiments can also employ various application-specific hardware-based shutdown mechanisms as a backup for the aforementioned software- and/or firmware-controlled hardware. In addition, various embodiments disclosed herein can comprise mechanical structures to modulate the inflow of air into and within the local processing and data module 70.

Figure 16:
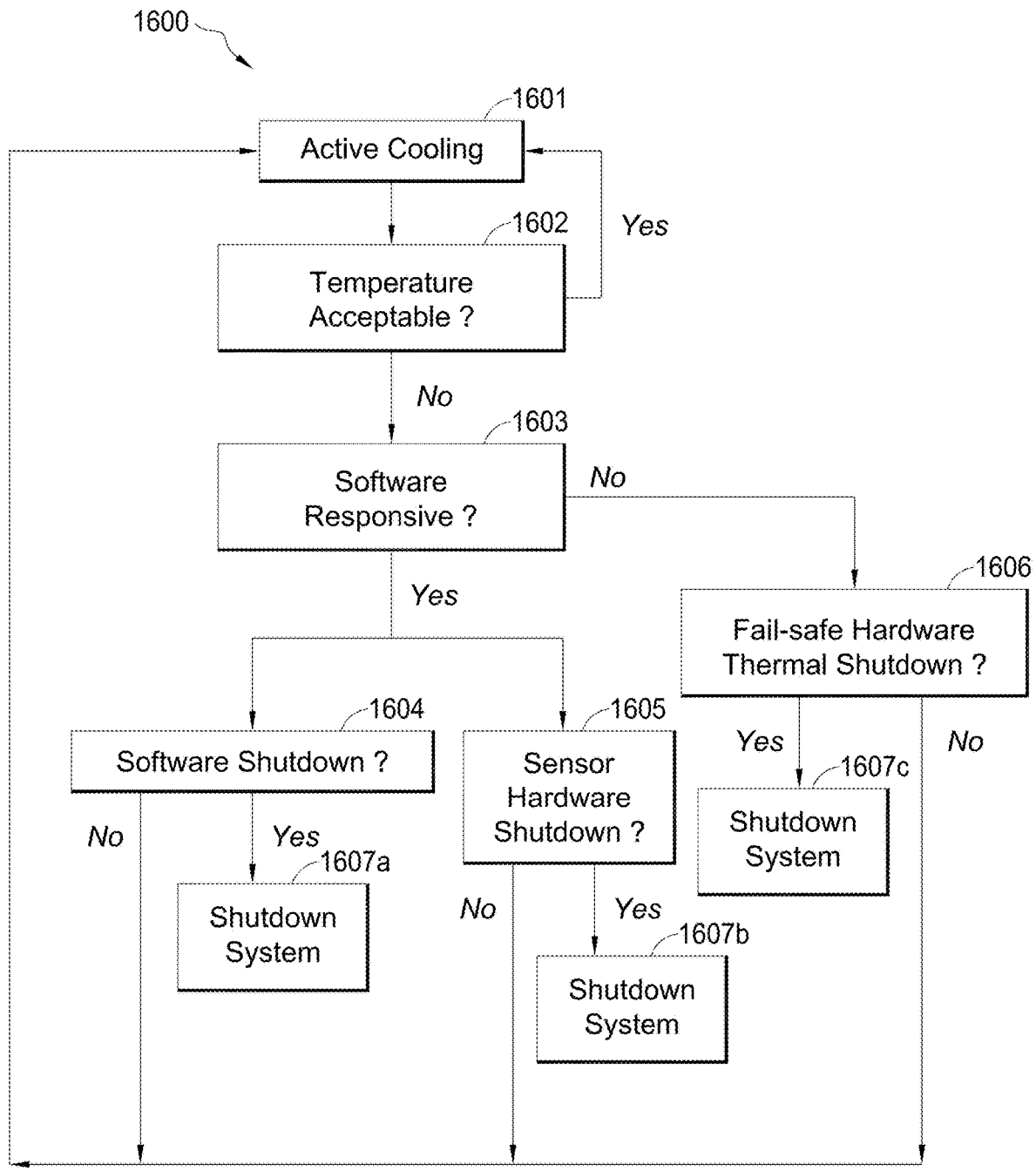
FIG. 16 is a flowchart illustrating a method for thermal management of an electronic device, according to various embodiments.

FIG. 16 is a flowchart illustrating a method 1600 for thermal management of an electronic device, according to various embodiments. The method 1600 can comprise an active cooling technique 1601 in which processing circuitry is configured to actively or dynamically control the operation of a fan assembly (such as any of the fan assemblies disclosed above) to maintain the temperature of portions of the local processing and data module 70 at acceptable temperature levels. The method moves to a block 1602 to determine whether the measured temperature(s) are at acceptable levels. If the determination in block 1602 is yes, then the method 1600 continues with the active cooling techniques 1601. If the determination in block 1602 is no, then the method 1600 moves to a block 1603 to determine whether thermal management software (e.g., instructions loaded on processing circuitry of the module 70) is responsive and/or operational. If the determination in block 1603 is yes, then the method 1600 moves to blocks 1604 and 1605.

In block 1604, for example, the thermal management software can determine whether the temperatures are at unacceptable levels and that the processing circuitry should be shut down. If the determination in block 1604 is that the processing circuitry should not be shut down (e.g., the measured temperature(s) are at acceptable levels), then the method 1600 continues in block 1601 with the active cooling techniques. By contrast, if the software determines in block 1604 that the processing circuitry should be shut down (e.g., the measured temperature(s) are at unacceptable levels), then the system is shut down in block 1607a. In such a situation (e.g., the software determines that the system should be shut down), the processing circuitry can save any unsaved data and can shut down according to normal shutdown processes. In some embodiments, the processing circuitry can be restarted once the temperatures have lowered sufficiently, and the active cooling technique 1601 can be repeated.

In block 1605, various sensor hardware assemblies can be provided at locations in the local processing and data module 70 that may represent sensitive locations to temperature increases, or other locations at which it may be desire to locally measure temperature. For example, as explained herein in connection with FIGS. 18A-18B, digital temperature sensors and/or thermistors may be used to measure temperature at multiple locations in the module 70. If the determination in block 1605 is that the processing circuitry should not be shut down (e.g., the measured temperature(s) are at acceptable levels), then the method 1600 continues in block 1601 with the active cooling techniques. If, however, the measured temperature at any or all of the multiple locations exceeds a predetermined threshold, then the sensor assembly can institute a hardware shutdown of the system in block 1607b. For example, processing circuitry in electrical communication with the sensor assembly (e.g., digital temperature sensors and/or thermistors), can determine that the measured temperatures exceed the threshold and can send a shutdown signal to shut down the processing circuitry and/or other components of the system. In such embodiments (e.g., block 1607b), the system may be shut down without saving any unsaved data. In some embodiments, if the temperatures are sufficiently lowered, then the system can be restarted, and the method 1600 can continue with the active cooling techniques of block 1601.

Figure 19:
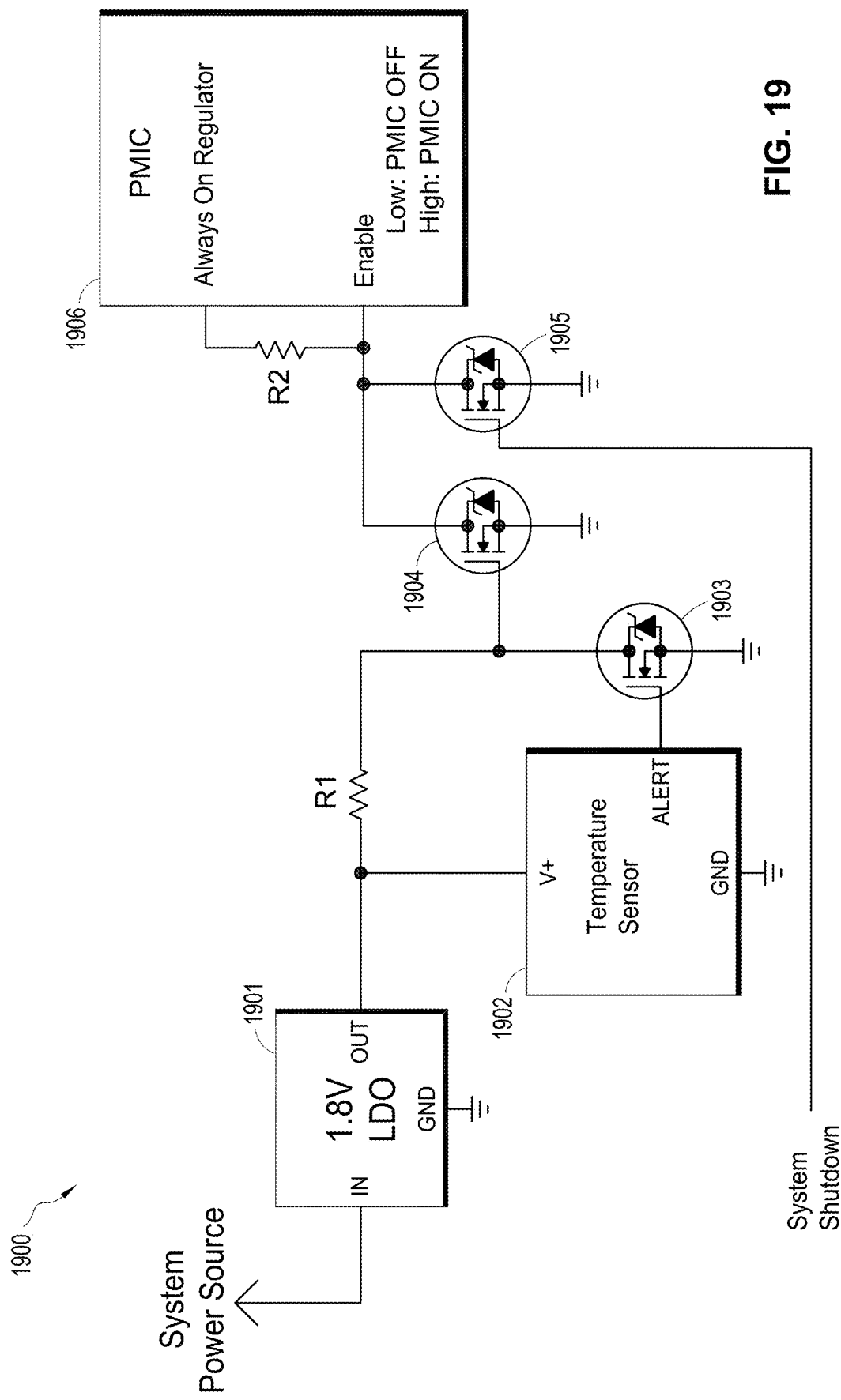
FIG. 19 is a schematic system diagram of a hardware thermal monitoring system according to various embodiments.

Returning to block 1603, if a determination is made that the thermal management software is not responsive, then the method 1600 moves to a block 1606 that comprises a backup hardware thermal shutdown technique, which may be similar to the techniques employed by the device in FIG. 19. If the determination in block 1606 is that the system should not be shut down (e.g., the measured temperature(s) are at acceptable levels), then the method 1600 continues with the active cooling techniques in block 1601. If, however, the hardware shutdown technique of block 1606 indicates that temperatures exceed predetermined threshold(s), then the method 1600 proceeds to block 1607c, in which the processing circuitry and/or other components of the system can be shut down. In various embodiments, as with block 1607b, the system may be shut down without saving any unsaved data. In some embodiments, if the temperatures are sufficiently lowered, then the system can be restarted, and the method 1600 can continue with the active cooling techniques of block 1601.

Figure 17:
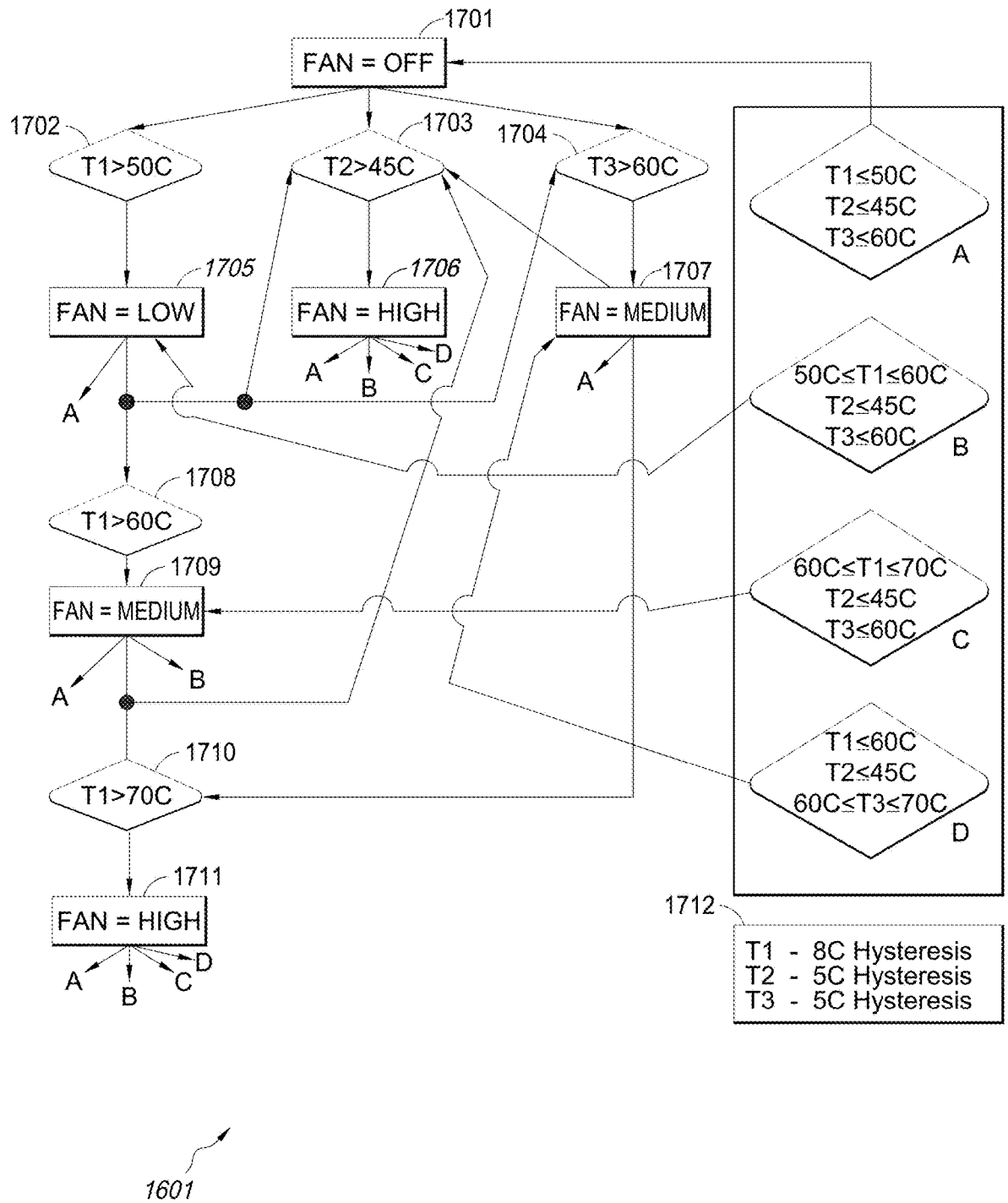
FIG. 17 is a flowchart illustrating one example of the active cooling techniques introduced in FIG. 16.
Figure 18A:
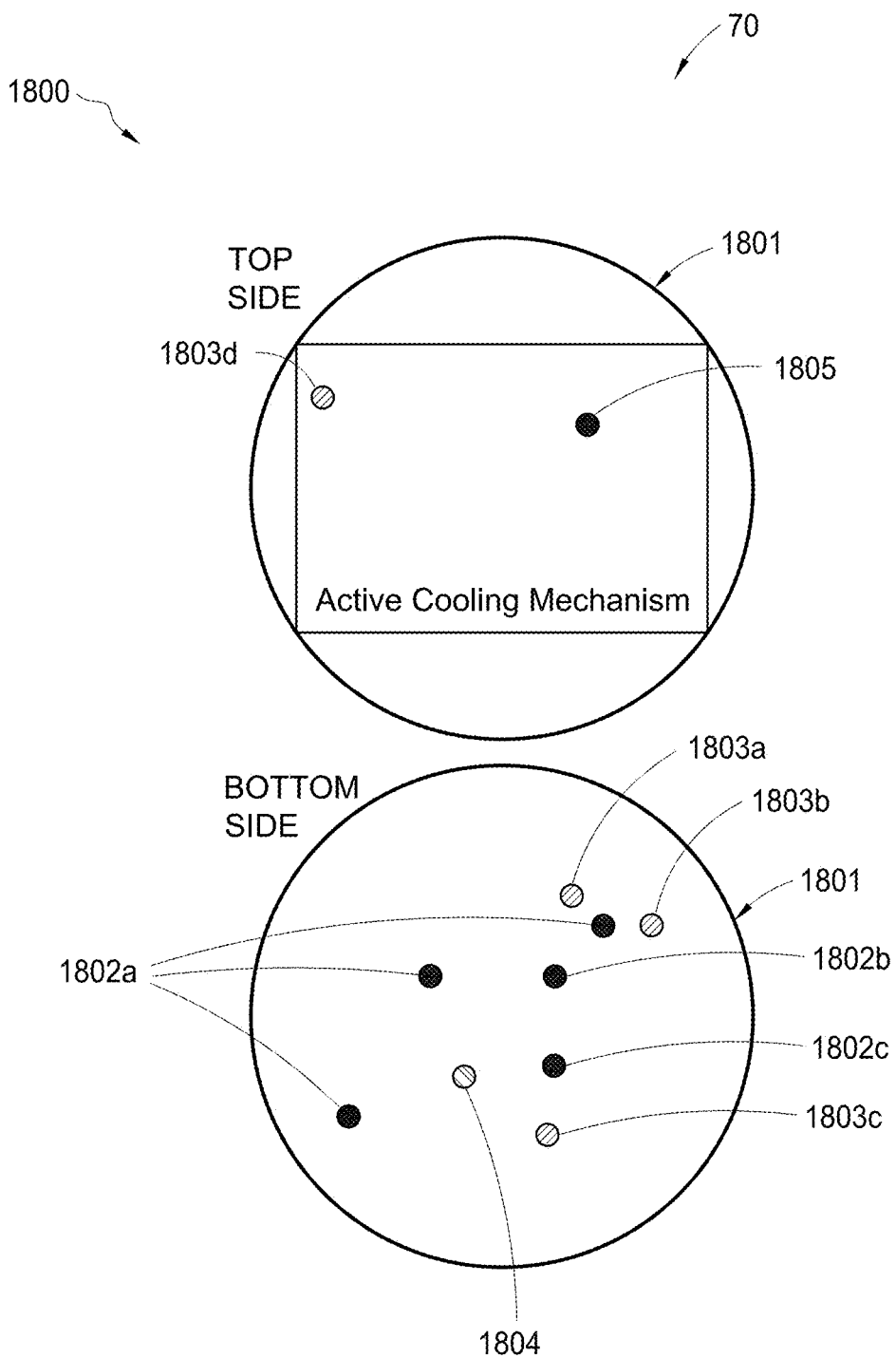
FIG. 18A illustrates schematic top side and bottom side views of a thermal management system according to various embodiments.
Figure 18B:
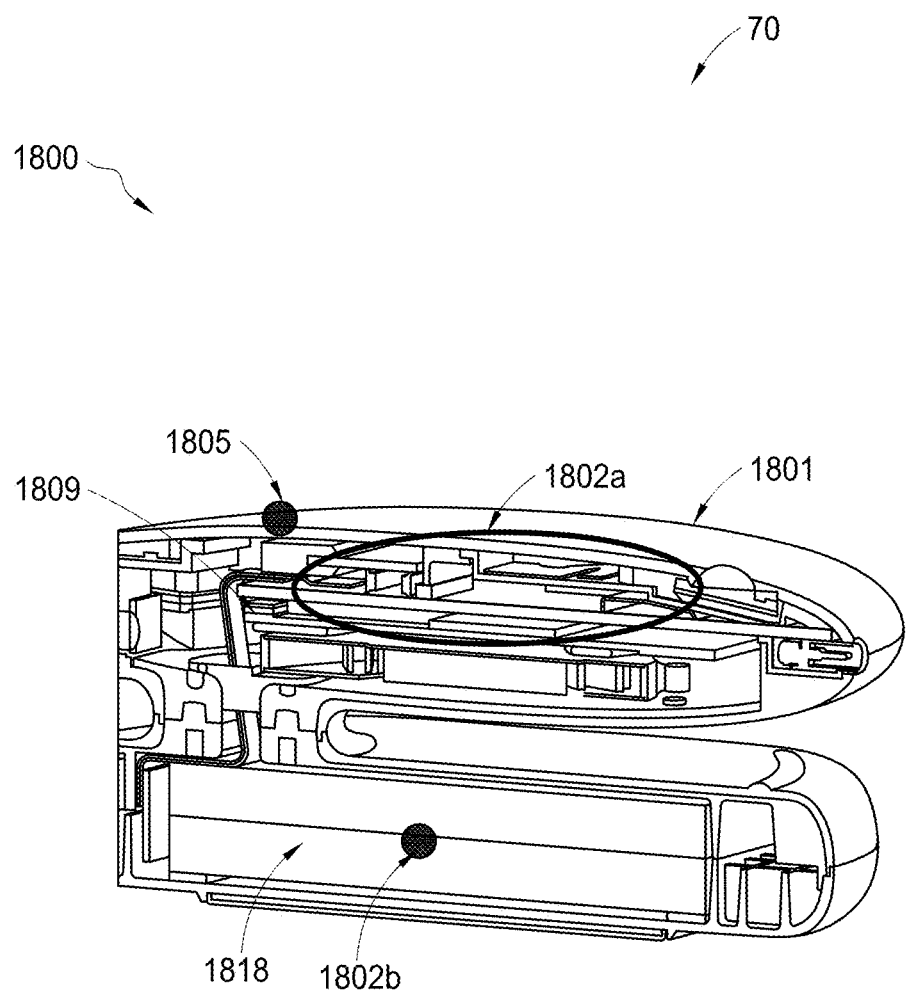
FIG. 18B is a schematic perspective view of the thermal management system, according to various embodiments.

FIG. 17 is a flowchart illustrating one example of the active cooling techniques 1601 introduced in FIG. 16. FIG. 18A illustrates schematic top side and bottom side views of a thermal management system 1800 according to various embodiments. FIG. 18B is a schematic perspective view of the thermal management system 1800, according to various embodiments. In FIGS. 18A-18B, the system 1800 can comprise a plurality of temperature sensors distributed throughout the local processing and data module 70, which may be provided within an enclosure 1801, similar to the enclosures described above. For example, the sensors can be provided at or near memory devices, processing devices, batteries, charging circuitry, areas that may have risks of malfunction or shorting, at or near outer surfaces of the module 70, or any other suitable locations.

For example, the system 1800 can comprise one or a plurality of first sensors 1802a configured to provide first temperature measurement data (T1) at a corresponding one or plurality of locations within or on the module 70. For example, the first temperature measurement data (T1) can comprise the maximum temperature measured by the sensors 1802a, an average temperature measured by the sensors 1802a, or any other suitable determination based on the measured temperatures from the sensors 1802a. In some embodiments, the first sensors 1802a can comprise thermistors, e.g., resistive sensors configured to change resistance in response to surrounding temperature changes. Thermistors can transmit an analog signal to processing electronics (e.g., an analog-to-digital converter) to convert the analog signal to a digital signal. In other embodiments, the first sensors 1802a can comprise digital temperature sensors. The first sensors 1802a can be used to locally measure the temperature of portions of the local processing and data module 70. For example, as schematically shown in FIG. 18B, the first sensors 1802a can be provided at multiple desired locations (e.g., at processors, memory devices, charging circuitry, or other components that may heat up excessively during operation) within the chipset or processing electronics 1809. Although multiple sensors 1802a are shown, it should be appreciated that in some embodiments, only one sensor can be provided to provide the first temperature measurement data. Furthermore, although the sensors 1802a are shown in various locations in FIG. 18A, it should be appreciated that the illustrated sensors 1802a are only schematically shown within the local processing and data module 70, and that the precise locations of FIG. 18A may vary.

The system 1800 can also comprise one or a plurality of second sensors 1802b configured to provide second temperature measurement data (T2) at a corresponding one or plurality of locations within or on the module 70. In some embodiments, the second sensor(s) 1802b can comprise one or more thermistors, but in other embodiments, the second sensor(s) can comprise digital sensor(s). As shown in FIGS. 18A and 18B, the second sensor(s) 1802b can be provided at or near a power supply or battery 1818 to measure the temperature of the battery 1818 and/or the housing that encloses the battery 1818. Although the sensor 1802b is shown at a particular location in FIGS. 18A-18B, it should be appreciated that FIGS. 18A-18B are schematic and that the precise location of the sensor 1802b may vary or be located at a different position at or near the battery 1818.

The system 1800 can further comprise one or more third sensor(s) 1802c configured to provide third temperature measurement data (T3) at a corresponding one or plurality of locations within or on the module 70. In some embodiments, the third sensor(s) 1802c can comprise one or more thermistors, but in other embodiments, the third sensor(s) 1802c can comprise digital sensor(s). The third sensor(s) 1802c (illustrated schematically in FIG. 18A) can be provided at or near charging circuitry configured to charge the battery 1818. For example, during charging of the battery 1818, the temperature of the charging circuitry (not shown) can increase, and it can be accordingly important to monitor the temperature of the charging circuitry, which may be provided at or near the processing electronics 1809 or at or near the battery 1818. It should be appreciated that the position of the third sensor(s) 1802c is schematic only and may be provided where desired, e.g., wherever the charging circuitry is located.

The sensors 1802a-1802c can be used in conjunction with the active cooling techniques of block 1601 of FIGS. 16-17, for example. Turning to FIG. 17, in a block 1701, the fan can be turned off during, for example, operation of the device. During active cooling, the method 1601 can proceed to blocks 1702, 1703, and 1704 to compare the first, second, and third temperature measurement data (T1, T2, T3) with predetermined thresholds. The first, second, and third temperature measurement data (T1, T2, T3) can be based on measurements from, e.g., the first, second, and third sensors 1802a-1802c, as explained above. As explained above, the locations of the sensors 1802a-1802c can be provided at any desired locations. Further, each measurement data (T1, T2, T3) can be based on one or more sensors. Any suitable number of measurements may be taken to utilize the active cooling techniques. Moreover, although the measurement data (T1, T2, T3) is described as being associated with sensors 1802a-1802c provided at or near particular components, it should be appreciated that the measurement data can be associated with other combinations of components or regions of the module 70.

As shown in FIG. 17, if T1 exceeds a first threshold (e.g., 50° C.) in block 1702, then the fan can be activated at a low speed or air flow in block 1705. Similarly, if T2 exceeds a second threshold (e.g., 45° C.) in block 1703, then the method 1601 can move to block 1706 to turn the fan on a third high speed. If T3 exceeds a third threshold (e.g., 60° C.), the fan can be activated at a second medium speed in block 1707. If the fan is activated to the low speed in block 1705, then the method 1601 can proceed to a decision block A, in which T1, T2, and T3 are each compared to threshold temperatures. In block A, if the temperature has dropped sufficiently below the thresholds in block A, accounting for hysteresis effects in block 1712, then the method 1601 can return to block 1701 and the fan can be turned off. For example, in block A, if T1 is less than or equal to 50° C. (50° C. after accounting for hysteresis effects), T2 is less than or equal to 45° C. (40° C. after accounting for hysteresis effects), and T3 is less than or equal to 60° (55° C. after accounting for hysteresis effects), then the fan can be turned off. The hysteresis effects of each measurement are shown, for example, in block 1712, which can prevent the fan from being turned off and on repeatedly if the temperature oscillates about the threshold values.

Further, if the fan is turned to low in block 1705, the method can proceed to block 1708 in which T1 is compared to an additional threshold. If T1 is greater than the threshold (60° C.), then the method moves to a block 1709 to turn the fan on at a second or medium speed. The method can further proceed to block A (explained above) and decision block B. In decision block B, T1, T2, and T3 can be compared to additional thresholds and, if the thresholds of block B are satisfied, the method can move to block 1705. Further, if the fan is activated to medium in block 1709, the method can proceed to block 1710, in which T1 is compared to another threshold (e.g., 70° C.), and if satisfied, the method 1601 can proceed to a block 1711 to activate the fan on at a third or high speed. The method 1601 can proceed to blocks A and B (described above), and to decision blocks C and D.

In decision block C, T1, T2, and T3 can also be compared to various thresholds, and if satisfied, the method 1601 can move to block 1709 to turn the fan to the medium or second speed. In the decision block D, T1, T2 and T3 can be compared to various thresholds, and if satisfied, the method 1601 can proceed to a block 1707 to activate the fan at the second or medium speed.

The method 1601 can be similarly performed for blocks 1703 and 1704, as explained above for block 1702. Beneficially, the method 1601 disclosed in FIG. 17 can compare multiple temperature measurements (e.g., T1, T2, T3) to desired thresholds in order to determine a desired fan speed in order to sufficiently cool the device. By utilizing multiple fan levels, the method 1601 can use fan speeds that are adequate to lower temperatures but that do not use excessive amounts of power. Although example threshold temperatures are provided in FIG. 17, it should be appreciated that any suitable threshold can be provided in the thresholds of FIG. 17. Further, the low, medium, and high fan speeds can comprise any suitable speeds so long as the medium speed is greater than the low speed and the high speed is greater than the medium speed. In some embodiments, for example, the low fan speed can comprise a speed in a range of 3,500 RPMs to 4,500 RPMs (e.g., about 4,000 RPMs). In some embodiments, the medium fan speed can comprise a speed in a range of 4,500 RPMs to 6,500 RPMs (e.g., about 5,500 RPMs). In some embodiments, the high fan speed can comprise a speed in a range of 6,500 RPMs to 7,500 RPMs (e.g., about 7,000 RPMs).

Returning to FIGS. 18A and 18B, one or more digital sensors 1803a-1803d can be provided to measure temperatures at other locations of the module 70. The sensors 1803a-1803d can be provided, for example, at locations of the module 70 that may be susceptible to high temperatures during normal operation or during a fault condition. For example, the sensors 1803a-1803d can be provided at locations that may have a risk of electrical malfunction or shorting. If the temperatures detected by the sensors 1803a-1803d exceed predetermined thresholds, then the system can shut down as explained above in block 1607b of FIG. 16. In some embodiments, for example, unsaved data may not be saved and the system can be automatically shut down. Such arrangements can serve as sensor assembly hardware shutdown mechanisms in some embodiments.

In addition, FIG. 18A illustrates a digital local and remote sensor 1804 that can measure temperature(s) at or near local components of the module 70, as well as locations that are remote from those components. For example, in some embodiments, the sensor 1804 can be provided to measure a plurality of temperatures (e.g., two temperatures). In some embodiments, the sensor 1804 can measure a local temperature at or near a surface of a processor as well as a remote temperature that is within the processor. In some embodiments, if the measured temperatures exceed desired thresholds, then the processing electronics can be configured to send a shutdown signal that shuts down the device, as explained above in block 1607b.

FIGS. 18A-18B illustrate an additional surface temperature sensor 1805 at or near the outer surface of the local processing and data module 70. The sensor 1805 can comprise a thermistor in the illustrated embodiment, although other types of temperature sensors can be used. The sensor 1805 can be configured to detect temperatures at or near the surface of the module 70, and if the processing electronics determines that the temperature exceeds a threshold, then the system can be shut down. The sensor 1805 of FIGS. 18A-18B can accordingly monitor the temperature of the surface(s) that may contact the user so as to maintain a comfortable temperature for user experience.

FIG. 19 is a schematic system diagram of a hardware thermal monitoring system 1900 according to various embodiments. The thermal monitoring system 1900 of FIG. 19 can be configured to perform methods similar to those described in block 1606 of FIG. 16. For example, the system 1900 can beneficially provide a method to power down the system (e.g., the module 70) in the event that software-based monitoring systems become disabled or otherwise are not operational. The system 1900 can comprise a voltage regulator 1901 connected to a system power source (not illustrated). The voltage regulator 1901 can electrically connect to a temperature sensor 1902. The temperature sensor 1902 can comprise any suitable temperature sensor, such as a digital temperature sensor. The temperature sensor 1902 can comprise an alert output terminal and a power input terminal connected to a power supply. In some embodiments, the temperature sensor 1902 can have its own dedicated power supply. In some embodiments, the temperature sensor 1902 can, alternatively or additionally, be connected to a power supply of the local processing and data module 70. In some embodiments, a dedicated power supply for the temperature sensor 1902 can beneficially provide power to the temperature sensor 1902 even if the system has exceeded a system shut down temperature and/or if power to the overall system is turned off.

The system 1900 can also include a first transistor 1903 having an on state and an off state. In some embodiments, the first transistor 1903 is an n-channel MOSFET transistor, and, as such, it is placed in the on state by a high voltage at its gate and it is placed in the off state by a low voltage at its gate. The first transistor 1903 can be configured to cause the local processing and data module 70 to shut down when a signal from the alert output terminal places the first transistor 1903 in the off state. The first transistor 1903 can comprise a gate electrically connected to the alert output terminal of the temperature sensor 1902, a source terminal connected to electrical ground, and a drain terminal connected to the power supply via a resistor R1.

The system 1900 can comprise a second transistor 1904 connected to the first transistor 1903 and the power supply of the system. In some embodiments, the second transistor 1904, too, is an n-channel MOSFET transistor, and, as such, it is placed in the on state by a high voltage at its gate and it is placed in the off state by a low voltage at its gate. The second transistor 1904 can have a gate electrically connected with the drain terminal of the first transistor 1903 and the power supply via the resistor R1, a source terminal connected to electrical ground, and a drain terminal. The system 1900 can also include a power management integrated circuit (PMIC) 1906 in electrical communication with the drain terminal of the second transistor 1904. The PMIC 1906 can comprise a voltage output for supplying power to the system (e.g., the module 70), and a power management enable terminal having a low voltage state and a high voltage state. The system 1900 can include a third transistor 1905 having a gate connected to a system shutdown signal, a source terminal connected to electrical ground, and a drain terminal electrically connected to the power management enable terminal of the PMIC 1906. In some embodiments, the third transistor 1905 is also an n-channel MOSFET transistor, and, as such, it is placed in the on state by a high voltage at its gate and it is placed in the off state by a low voltage at its gate.

The temperature sensor 1902 can have an internal threshold temperature that is set to the temperature at which the local data and processing module 70 should be shut down so as to avoid damage. During operation of the local data and processing module 70, if the temperature detected by the temperature sensor 1902 does not exceed the temperature threshold, then the temperature sensor can place the alert output signal in a deactivated state. In the illustrated embodiment, the alert output signal is low-enabled, so the temperature sensor 1902 sets the voltage of the alert output signal high when the signal is deactivated. When the voltage of the alert output signal is high, the first transistor 1903 is on, which causes its drain terminal to be grounded. This results in a current flowing from the voltage regulator 1901 to ground via the resistor R1, causing a voltage drop across R1. Since the gate of the second transistor 1904 is connected to the grounded drain terminal of the first transistor 1904, the second transistor is off. When the second transistor 1904 is off, there is no path to ground from the voltage output of the PMIC 1906 through the second transistor. Since there is no current through the resistor R2 in this state, there is no voltage drop across R2 and the enable input terminal of the PMIC 1906 is at a high voltage. In the illustrated embodiment, the PMIC 1906 is designed such that voltage output to the local data and processing module 70 from the PMIC is on when the enable input terminal is at a high voltage. Therefore, when the operating temperature of the local data and processing module 70 is at a safe level and the alert output signal from the temperature sensor 1902 is not activated, the voltage output from the PMIC 1906 is on and the module is supplied with power.

During operation of the local processing and data module 70, if the temperature detected by the temperature sensor 1902 exceeds the predetermined threshold, the alert output signal can be activated by the temperature sensor 1902. As already discussed, in the illustrated embodiment, the alert output signal of the temperature sensor 1902 is low-enabled. Therefore, when the alert output signal is activated, its voltage is driven low by the temperature sensor 1902. When the voltage of the alert output signal is low, the first transistor 1903 turns off. Therefore, the drain terminal of the first transistor 1903 is no longer grounded and current no longer flows through the first transistor from the voltage regulator 1901 via the resistor R1. Since there is no longer a current through the resistor R1, there is no voltage drop across R1 and the voltage at the gate of the second transistor 1904 switches to high. The high voltage at the gate of the second transistor 1904 turns it on, which in turn grounds its drain terminal. This allows current to flow through the second transistor 1904 from the voltage output of the PMIC 1906 via the resistor R2. The current through the resistor R2 causes a voltage drop across the resistor R2 and grounds the enable input terminal of the PMIC 1906. The power management enable terminal of the PMIC 1906 is therefore placed in the low voltage state, and the voltage output to the local processing and data module 70 is shut down. If the system returns to normal operating temperatures, the temperature sensor 1902 can release the alert signal, to re-enable the PMIC 1906 and reboot the system. Thus, in various embodiments, if the temperature measured by the sensor 1902 exceeds desired thresholds, the PMIC 1906 can be powered off, regardless of the state of the overall system shutdown signal. The transistors 1903, 1904, 1905 can comprise any suitable type of transistor, such as a complementary metal oxide semiconductor (CMOS) transistor, e.g., a n-type metal oxide semiconductor field effect transistor (MOSFET). Furthermore, although the drains and sources of the transistors 1903, 1904, 1905 as being connected to particular components, it should be appreciated that the components may instead be connected to the other of the drain and source described in the illustrated embodiment.

The circuit shown in FIG. 19 also includes the ability to turn off the voltage output of the PMIC 1906 in response to an independent system shutdown signal. The system shutdown signal can be activated when, for example, the user provides a command to turn off the system. In the illustrated embodiment, the system shutdown signal is high-enabled. When the voltage of the system shutdown signal is driven high, it turns on the third transistor 1905. This grounds its drain terminal, allowing a current path through the third transistor 1905 from the output voltage terminal of the PMIC 1906 via the resistor R2. The resulting voltage drop across the resistor R2 allows the enable input terminal of the PMIC 1906 to be grounded. And, as already discussed, in the illustrated embodiment the PMIC 1906 is designed such that its voltage output turns off, thereby shutting down the system, when the voltage at the enable input terminal of the PMIC is low.

The specific circuit illustrated in FIG. 19 is but one embodiment. In other embodiments, one or more of the signals which are low-enabled could instead be high-enabled, and vice versa, one or more p-channel transistors could be substituted for the one or more of the n-channel transistors 1903, 1904, 1905, etc.

Figure 20:
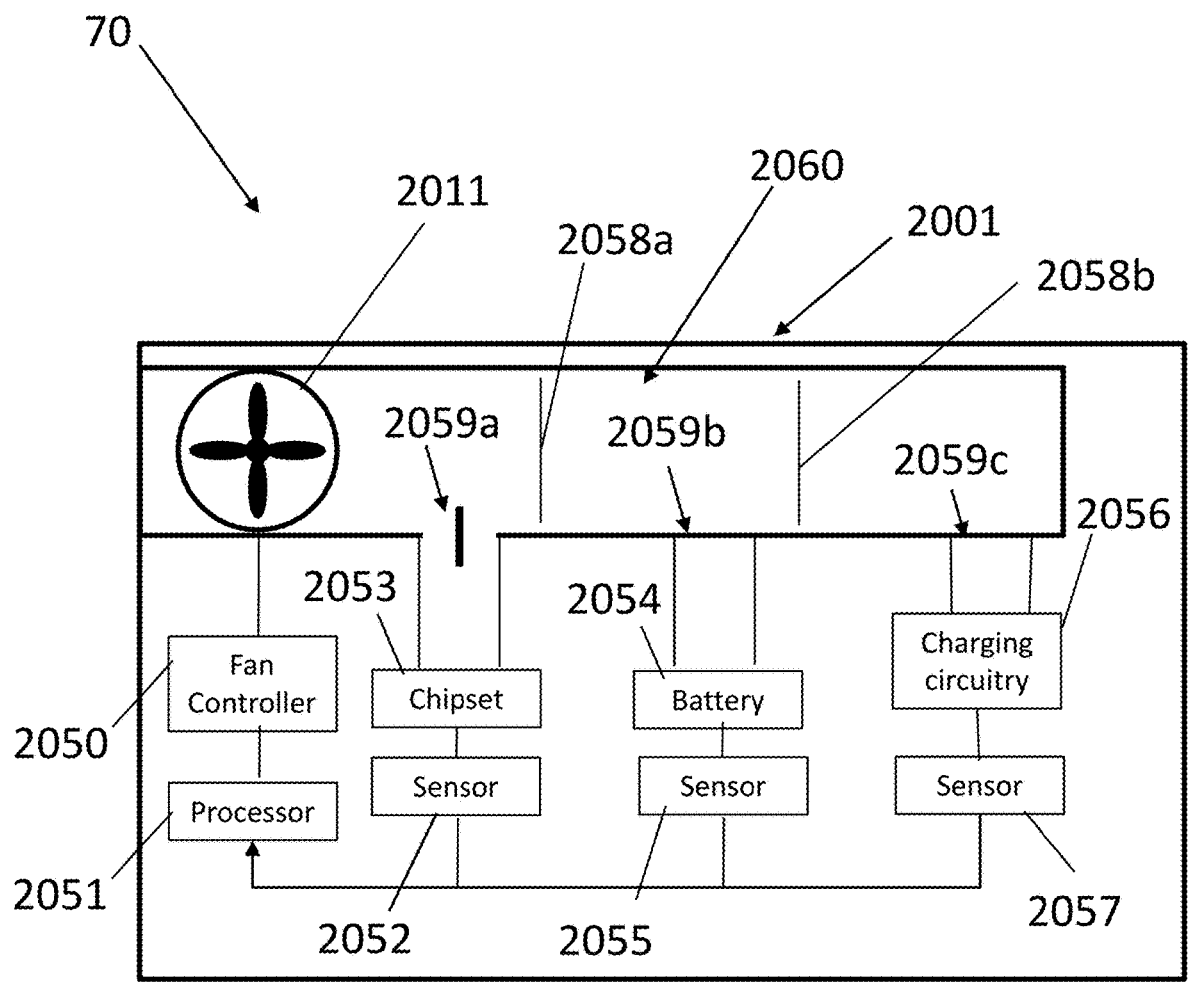
FIGS. 20-22 illustrate various examples for rerouting the flow of air within an enclosure of a local processing and data module, according to various embodiments.
Figure 21:
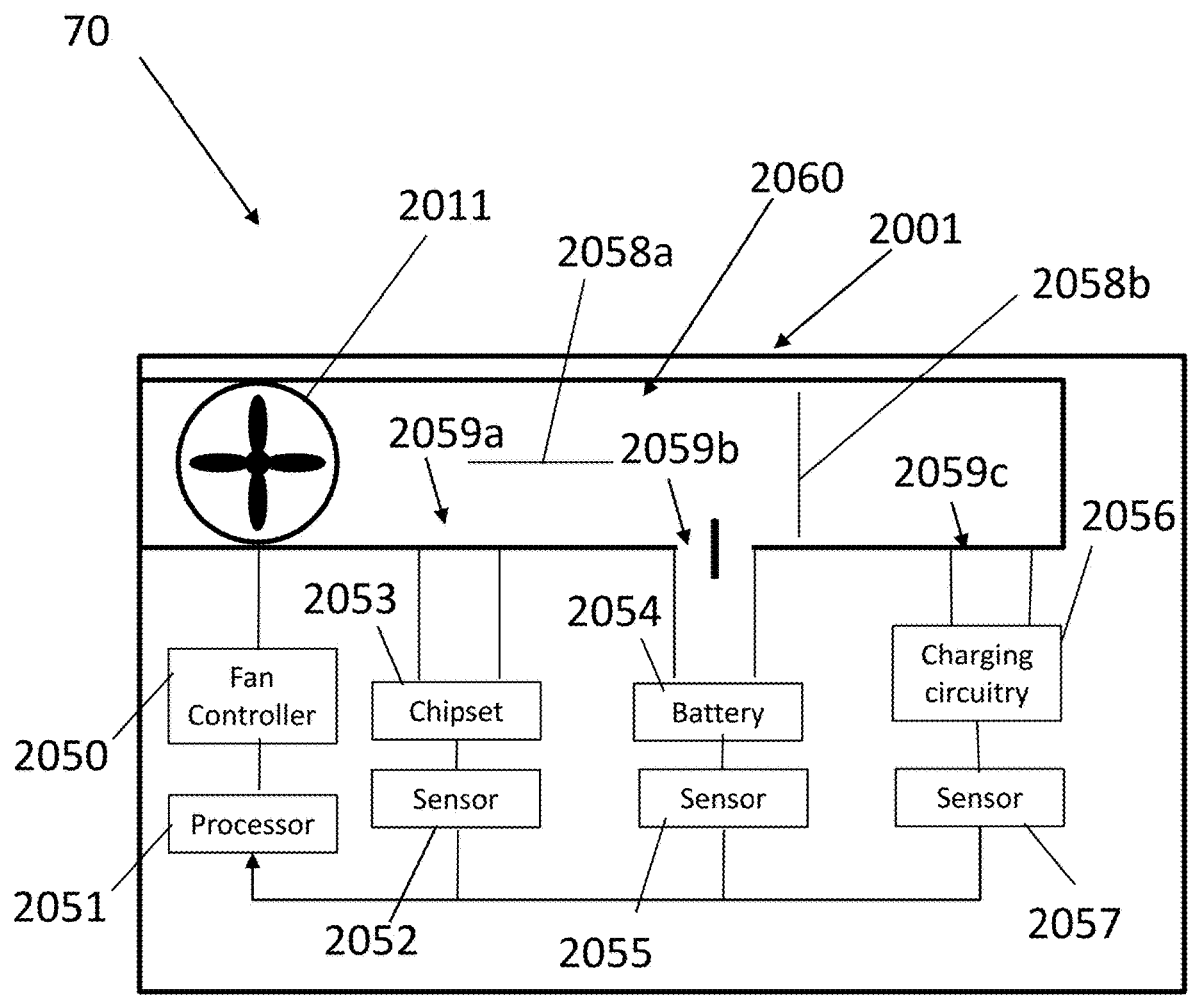
Figure 22:
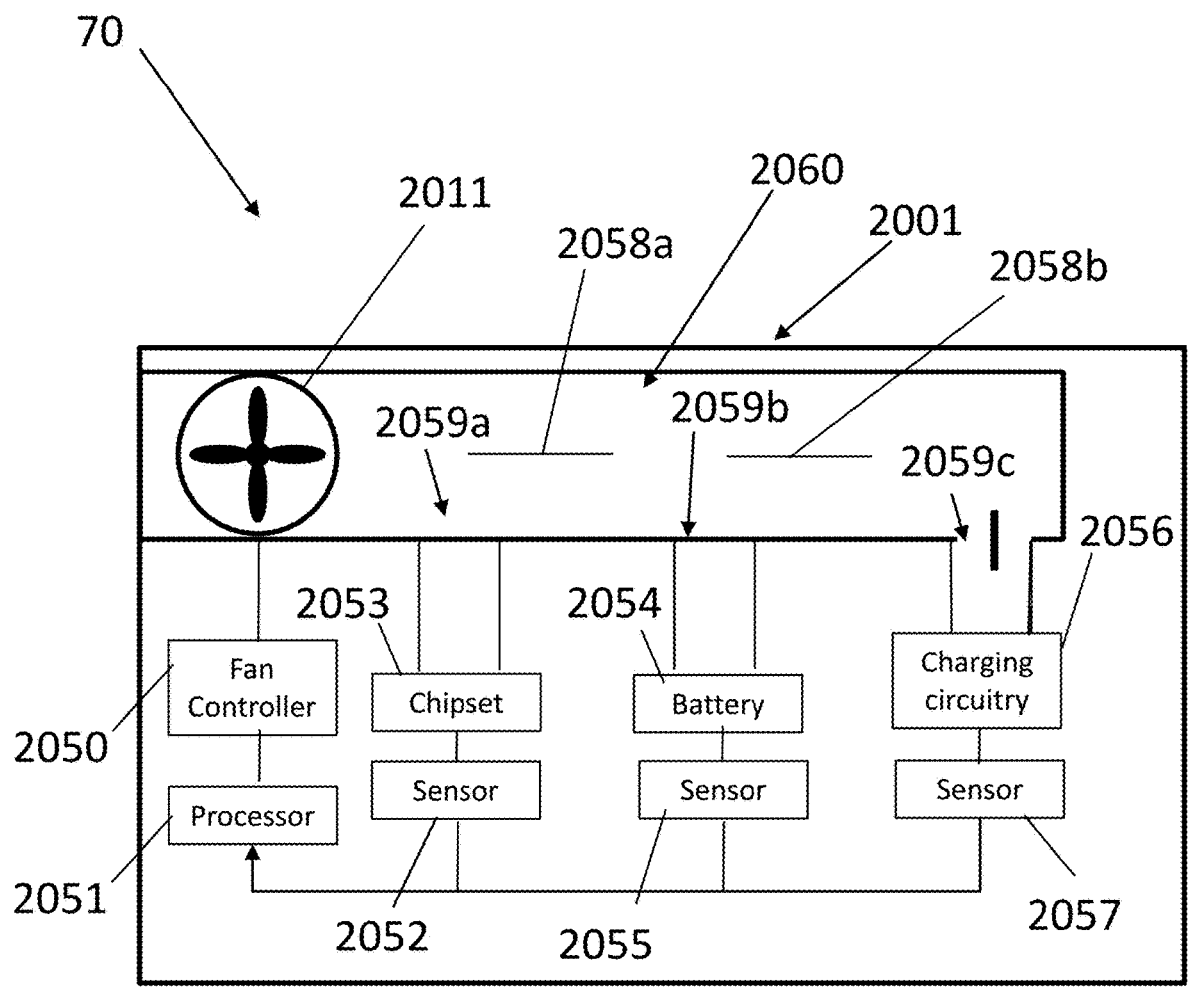

FIGS. 20-22 illustrate various examples for rerouting the flow of air within an enclosure 2001 of a local processing and data module 70, according to various embodiments. The module 70 can comprise a fan 2011, which may be similar to the fan assemblies described above. A fan controller 50 can be configured to control the operation of the fan 2011, e.g., the speed of the fan 2011. A processor 2051 can be configured to control the operation of the fan controller 2050. Further, as shown in FIGS. 20-22, processing electronics comprising a chipset 2053 (which may be similar to the electronic components 109 described herein) can be provided in a chamber or enclosure, along with a first temperature sensor 2052. A power supply or battery 2054 (which may be similar to the battery 118) can be provided in a different chamber or enclosure, along with a second temperature sensor 2055. Charging circuitry 2056 and a third temperature sensor 2057 can be provided in another chamber or enclosure, which can be the same as or different from the chambers or enclosures within which the chipset 2053 and battery 2054 are respectively disposed.

First baffles 2058*a* and 2058*b* can respectively be provided to control the routing of air along a channel 2060 that provides common fluid communication to channels 2059*a*, 2059*b*, and 2059*c*. As shown, channel 2059*a* can comprise a baffle that provides adjustable fluid communication to a chamber in which the chipset 2053 and sensor 2052 are disposed. Similarly, channel 2059*b* can comprise a baffle that provides adjustable fluid communication to a chamber in which the battery 2054 and sensor 2055 are disposed. Channel 2059*c* can comprise a baffle that provides adjustable fluid communication to a chamber in which the charging circuitry 2056 and sensor 2055 are disposed.

The baffles 2058*a*, 2058*b* can be adjusted and the channels 2059*a*-2059*c* can be adjustable opened and/or closed based at least in part on temperature measurements provided by the sensors 2052, 2055, 2057. For example, in FIG. 20, the baffles 2058*a* and 2058*b* can remain closed so as to block (or lower the flow rate of) air flowing to the battery 2054 and the charging circuitry 2056. The channel 2059*a* can be opened so that air can flow into the chamber in which the chipset 2053 and sensor 2052 are located. By contrast, in FIG. 21, the baffles 2058*a* can be opened and the baffle 2058*b* can remain closed. The channels 2059*a* and 2059*c* can also remain closed, but the channel 2059*b* can be opened. In FIG. 21, therefore, air can flow into the chamber with the battery 2054 and may not flow (or may flow by a lesser amount) into the chambers in which the chipset 2053 and charging circuitry 2056 are disposed. In FIG. 22, the baffles 2059*a* and 2059*b* are opened. Channels 2059*a* and 2059*b* are closed, while channel 2059*c* is opened. In FIG. 22, therefore, a majority of air can be routed to the charging circuitry 2056, while a less amount of air can be provided to the other chambers. Accordingly, the embodiment of FIGS. 20-22 can provide controllable routing of air within the enclosure 2001 based on temperature measurements from the sensors 2052, 2055, 2057. Moreover, although three combinations of opening and closing the baffles 2058*a*, 2058*b* and channels 2059*a*-2059*c* are illustrated in FIGS. 20-22, it should be appreciated that other combinations of opening and closing baffles and channels may be suitable. Accordingly, various embodiments disclosed herein can selectively regulate the flow of air within the local processing and data module 70 by selectively opening and closing passageways within the module 70.

Figure 23:
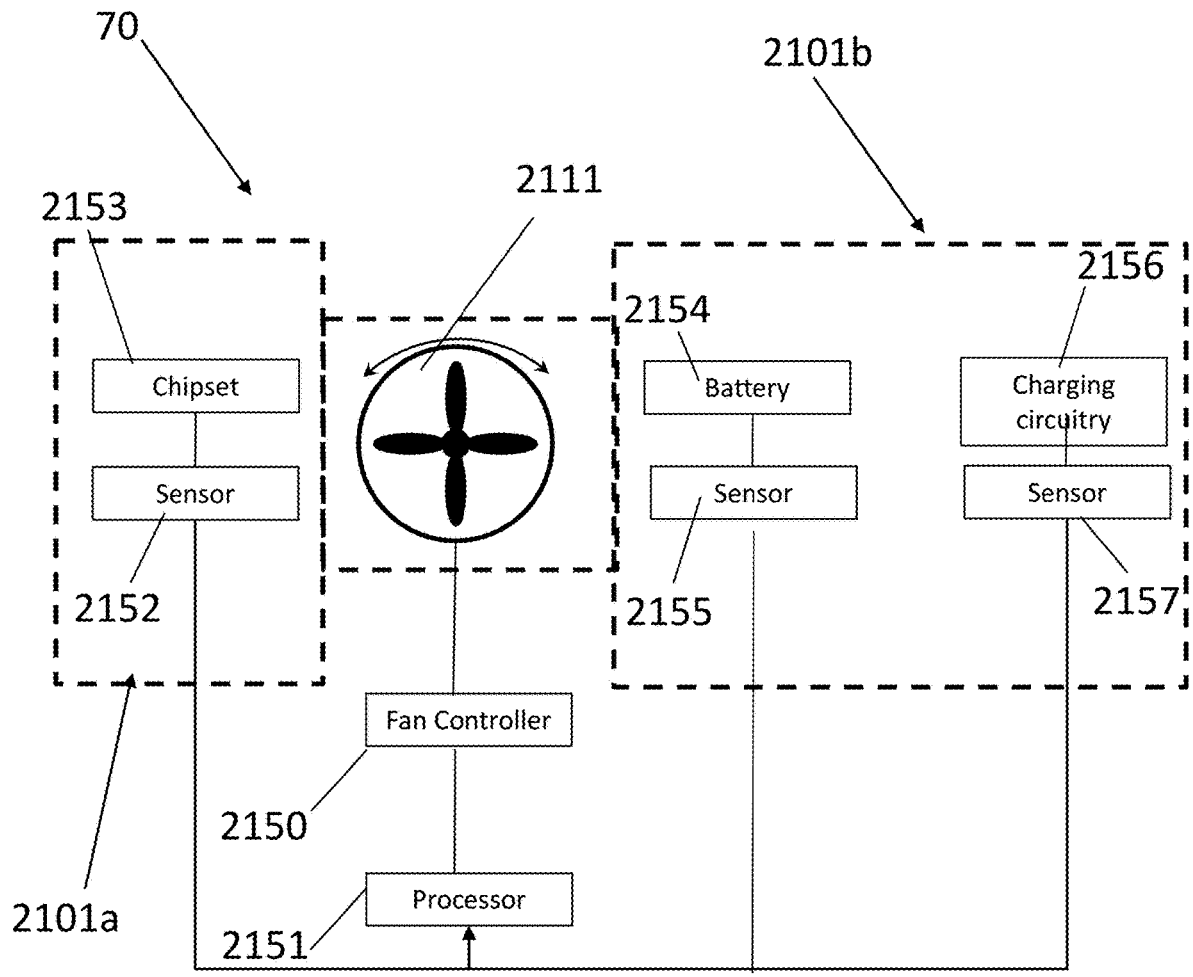
FIG. 23 is schematic system diagram of a local processing and data module having a fan according to another embodiment.

FIG. 23 is schematic system diagram of a local processing and data module 70 having a fan 2111 according to another embodiment. Unless otherwise noted, reference numerals in FIG. 23 represent components that are the same as or generally similar to like-numbered components of FIGS. 20-22, with the reference numerals incremented by 100 relative to the reference numerals of FIGS. 20-22. As shown in FIG. 23, the module 70 can comprise first and second enclosures 2101*a*, 2101*b*. In some embodiments, the chipset 2153 and sensor 2152 can be provided in the first enclosure 2101*a*. The battery 2154 and chipset 2155 can be provided in the second enclosure 2101*b*. The charging circuitry 2156 and sensor 2157 can also be provided in the second enclosure 2101*b*. In other embodiments, however, the charging circuitry 2156 and sensor 2157 can be provided in the first enclosure 2101*a*, or in a different enclosure.

In the embodiment of FIG. 23, the fan 2111 can be configured to rotate in opposite directions, or to otherwise selectively direct flow into the first and second enclosures 2101*a*, 2101*b*, respectively. For example, based on temperature measurements from the sensors 2152, 2155, and 2157, the fan controller 2150 can instruct the fan 2111 to provide more airflow into enclosure 2101*a*, or more airflow into 2101b to provide temperature control for the local processing and data module 70. Thus, the embodiment of FIG. 23 can provide additional techniques for thermal management of the local processing and data module 70.

Figure 24A:
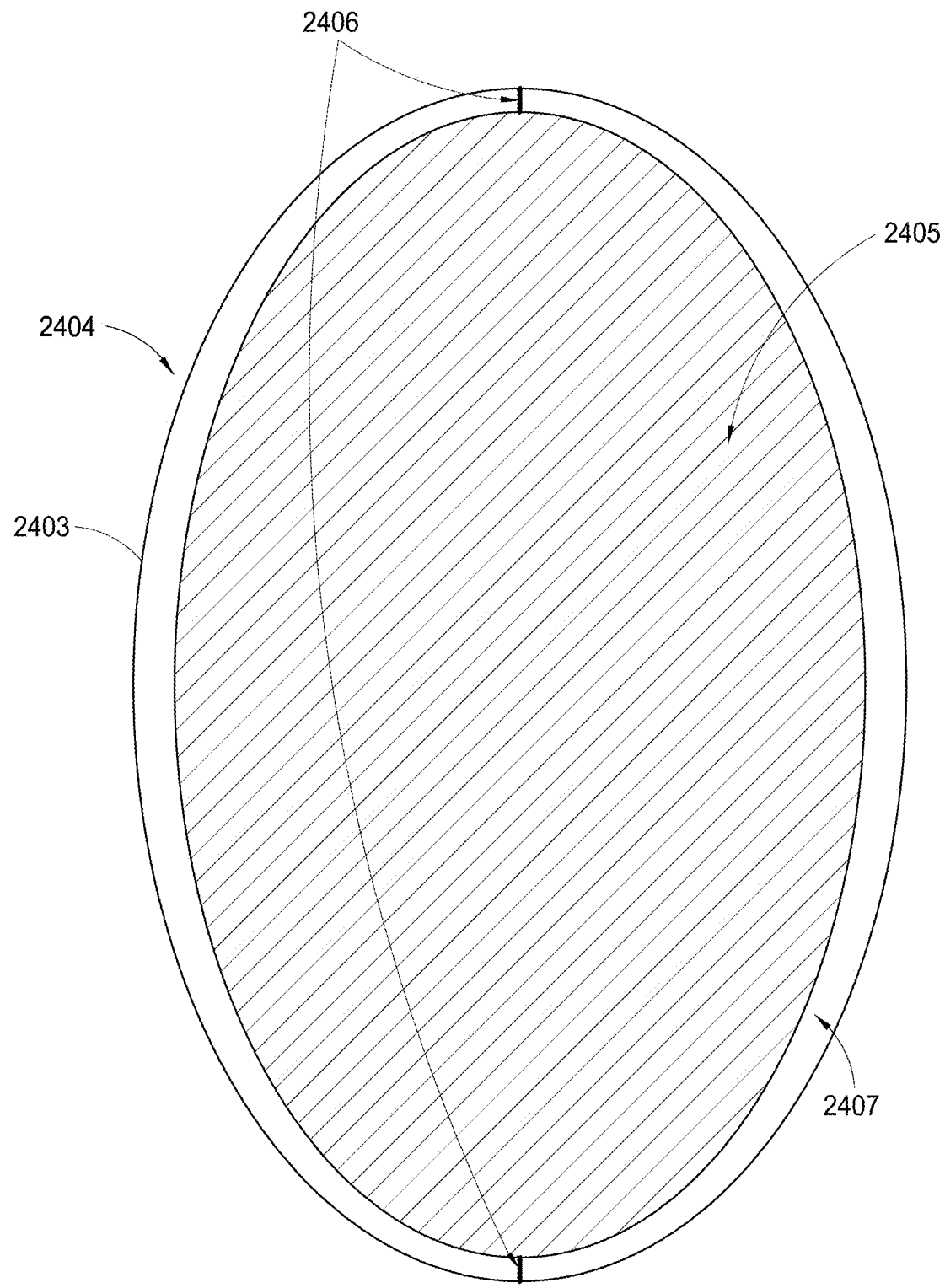
FIG. 24A-24C are schematic diagrams of an adjustable inlet port, in accordance with various embodiments.
Figure 24B:
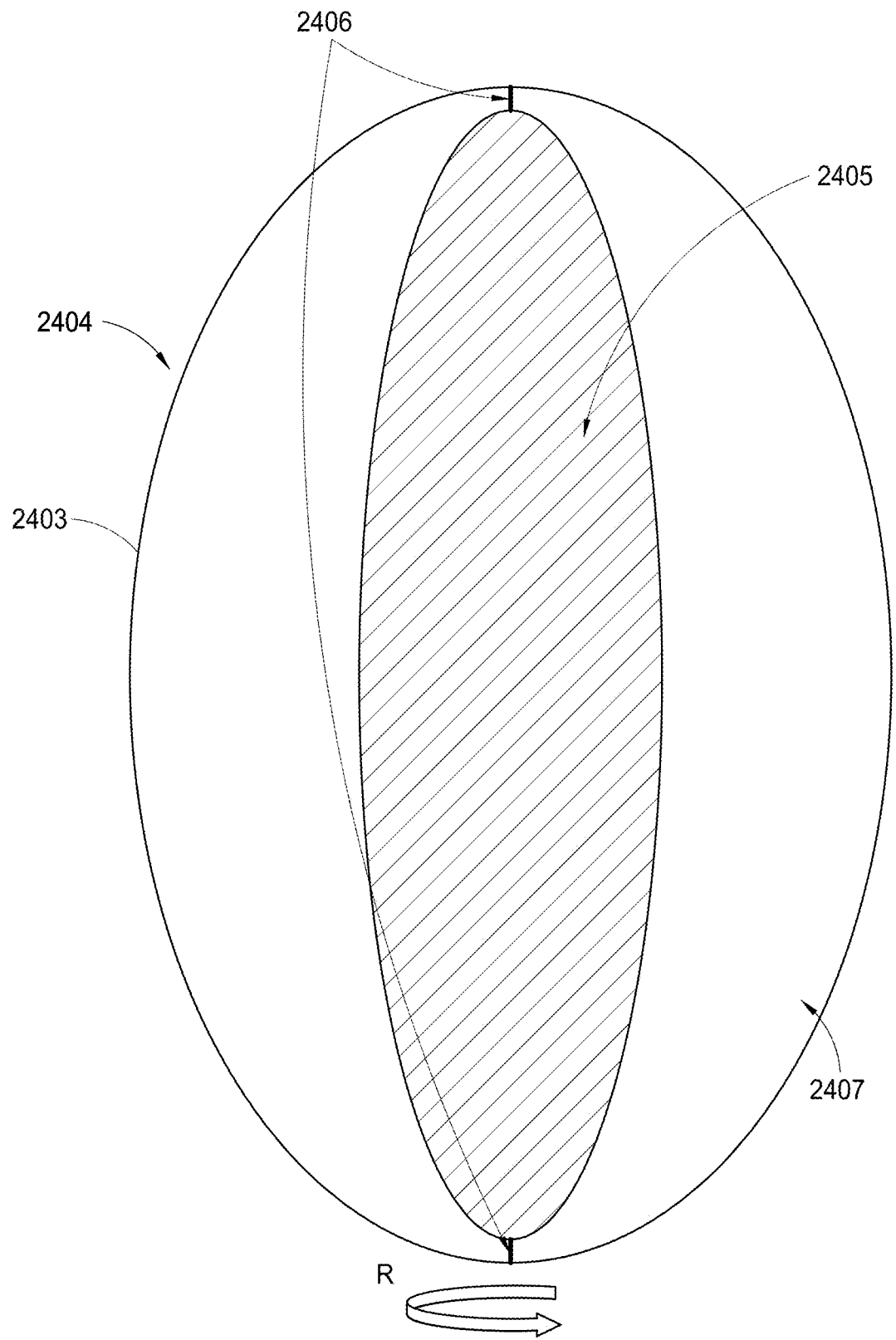
Figure 24C:
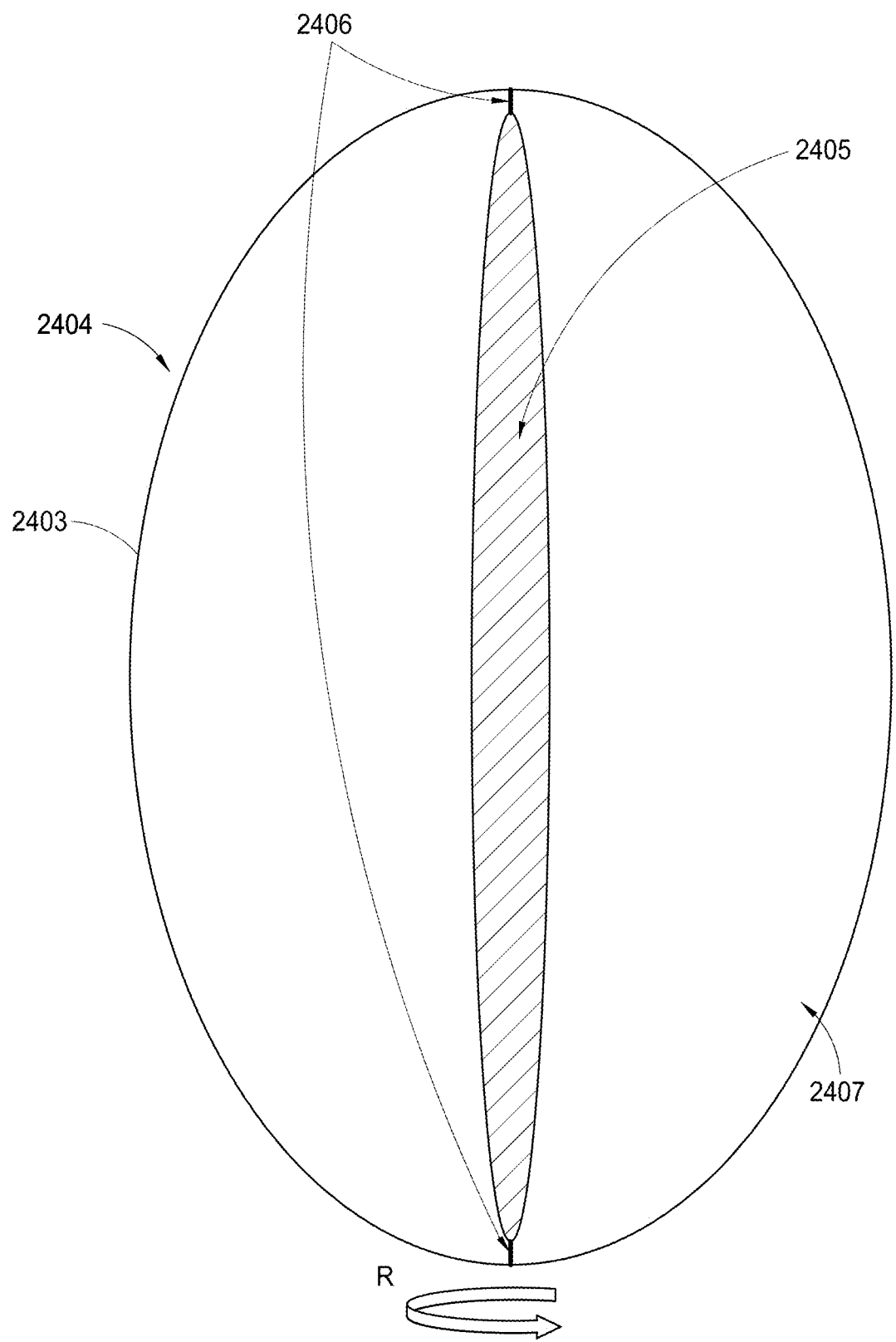

FIG. 24A-24C are schematic diagrams of an adjustable inlet port 2404, in accordance with various embodiments. The inlet port 2404 may be similar to the inlet ports 104a, 104b described herein, and can be configured to enable air to pass within the enclosure(s) of the local processing and data module 70. In some embodiments, as illustrated above in connection with, for example, FIG. 3C, a plurality of inlet ports 104a, 104b, can be provided in the local processing and data unit 70 (for example, in one or both of the enclosures 100, 101 of FIGS. 3A-3D). In other embodiments, only a single inlet port may be provided in the local processing and data module 70. In FIGS. 24A-24C, the adjustable inlet port 2404 can comprise an outer opening 2403 and a movable member 2405 disposed within the outer opening 2403. The movable member 2405 can be mechanically connected to the outer opening 2403 by one or more supports 2406. In the illustrated embodiment, the movable member 2405 can rotate about a rotational direction R to adjust a cross-section of the inlet port 2404 exposed to air. For example, a motor or other actuator can be provided to impart rotation to the movable member 2405. In FIG. 24A, the movable member 2405 may be positioned to block a majority (or the entirety) of the opening 2403 for a reduced airflow pathway 2407 into the device. In FIG. 24B, the movable member 2405 may rotate by a suitable angle so as to enable an increased airflow pathway 2407 through the port 2404. The degree of rotation R can be selected so as to achieve a desired amount of air flow and/or a desired direction of airflow so as to direct a sufficient amount of air to particular components within the enclosure(s) of the module 70. In FIG. 24C, the movable member 2405 may be opened a maximum amount to direct a maximum air flow pathway 2407 into the module 70.

Beneficially, the temperature sensors described herein can measure the temperature of the various processing electronics, batteries, charging circuitry, and other components, and can determine which components should be cooled by increased air flow. The movable member 2405 can be positioned to direct the flow at those components in a desired direction and/or by a sufficient amount so as to improve flow over the hotter components. The movable member 2405 can be adjusted along a range to provide a plurality of flow rates and/or flow directions into the module 70. For example, the movable member 2405 can be adjusted at a plurality of positions between approximately 100% occlusion of the opening 2403 (for minimal air flow) to approximately 0% occlusion of the opening 2403 (or maximal air flow). In some embodiments, the movable member 2405 can be provided at a continuous range of orientations to provide a corresponding continuous range of flow rates through the opening 2403. Furthermore, although the movable member 2405 is illustrated as being rotatable within the opening 2403, in other embodiments, the movable member 2405 can be translated or otherwise moved relative to the opening 2403 to selectively and adjustably tune the air flow pathway 2407 through the inlet port. For example, the movable member 2405 can act as a movable shutter that can be positioned at various positions relative to the opening 2403. In various embodiments, the shutters (e.g., a movable member) can be disposed along a periphery of the local processing and data module 70. In some embodiments, the movable members 2405 can be configured to regulate the outlets or exhaust ports as well. In some embodiments, as explained above, motors can be used to actuate the movable members 2405. In other embodiments, the increase in temperature may cause thermal expansion of the movable member 2405 so as to cause the movable member 2405 to regulate the flow of air through the inlet port 2404. Similarly, cooling of the air can cause the movable member 2405 to contract to regulate the flow of air through the inlet port 2404.

Figure 25A:
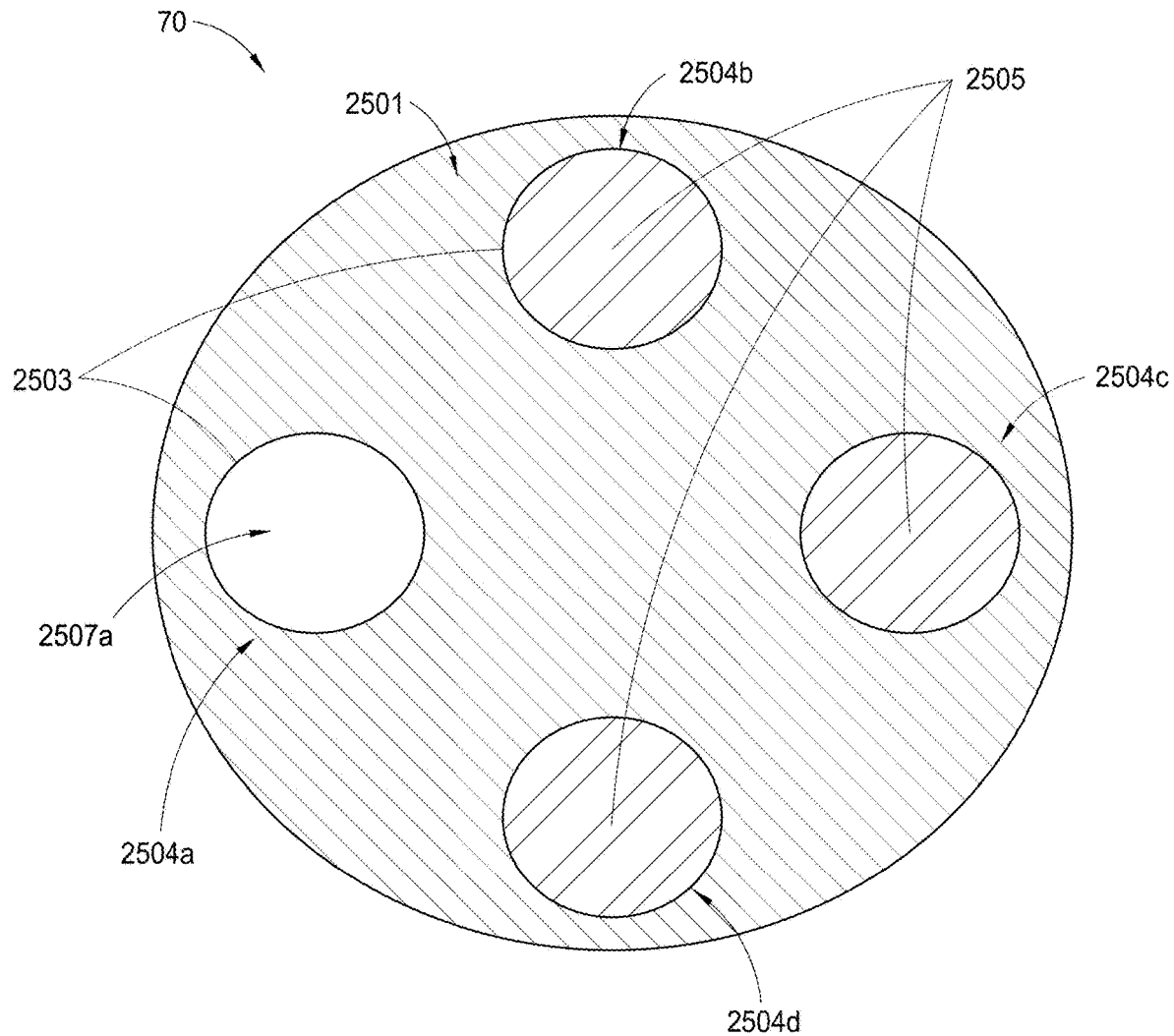
FIGS. 25A-25C are schematic plan views illustrating a local processing and data module having inlet ports configured to adjust air flow into the module, according to various embodiments.
Figure 25B:
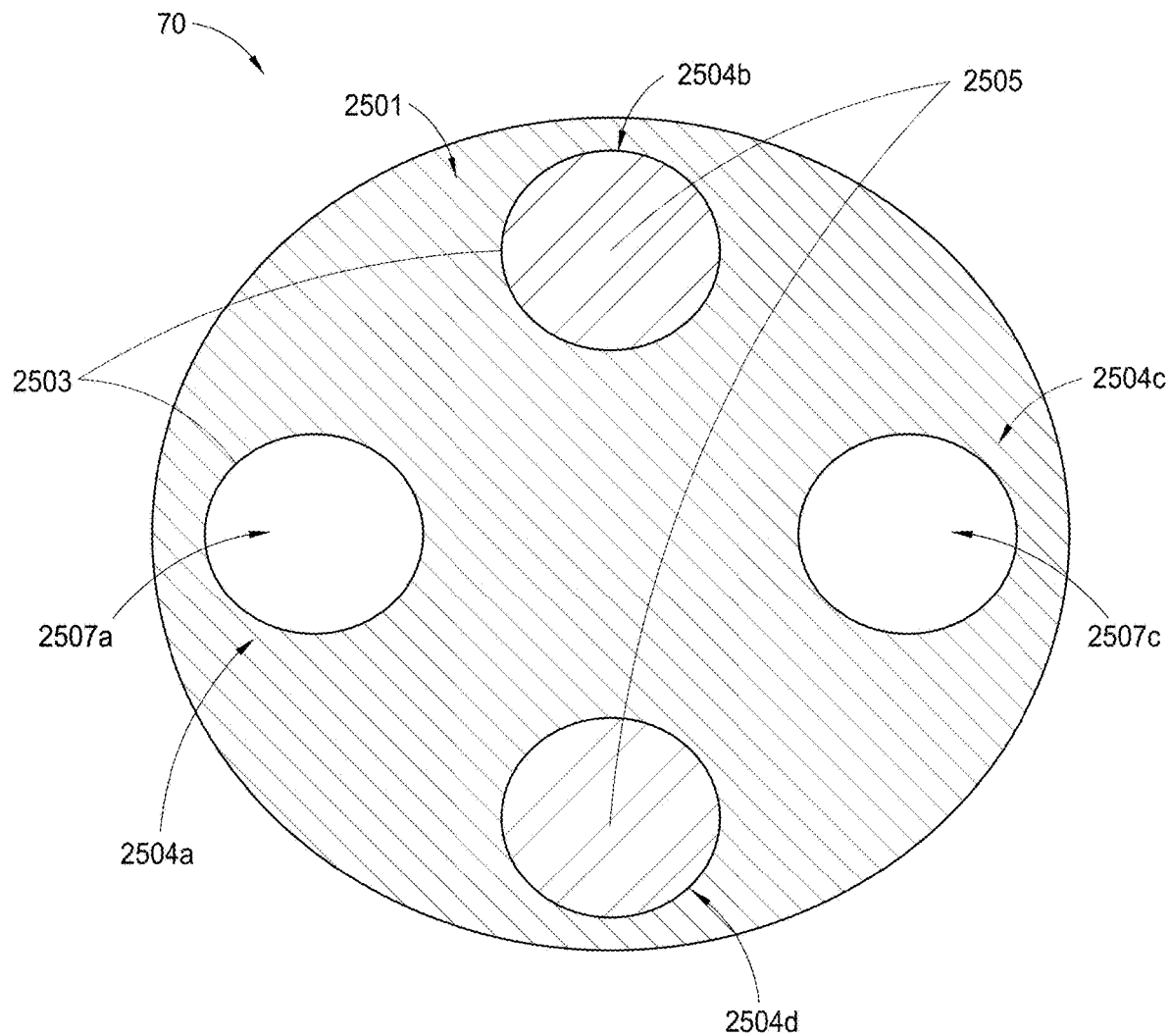
Figure 25C:
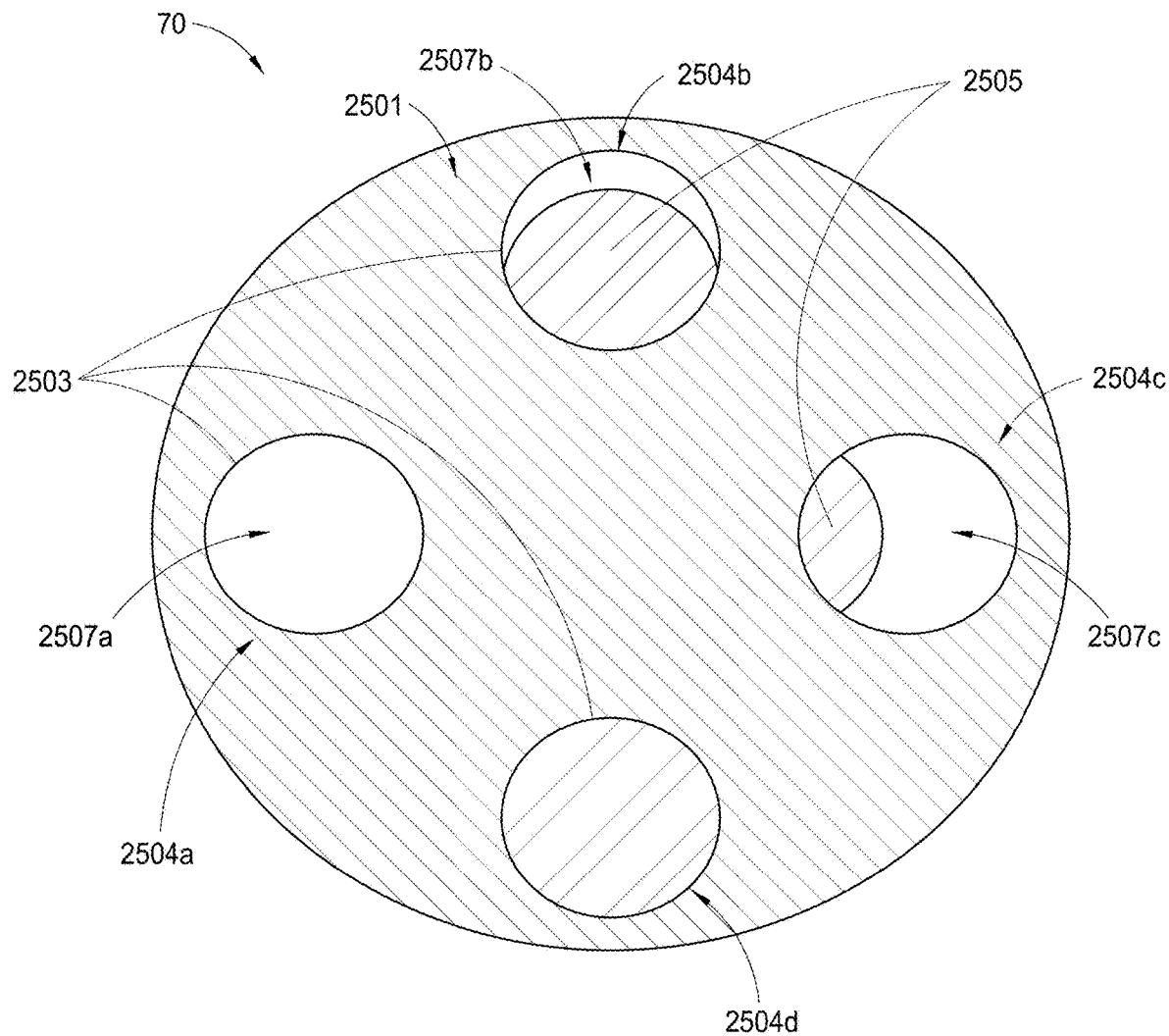

FIGS. 25A-25C are schematic plan views illustrating a local processing and data module 70 having inlet ports 2504a-2504d configured to adjust air flow into the module 70, according to various embodiments. Unless otherwise noted, reference numerals in FIGS. 25A-25C illustrate components that are the same as or similar to like-numbered components of FIGS. 24A-24C, with the reference numerals incremented by 100 relative to FIGS. 24A-24C. Turning to FIG. 25A, the local processing and data module 70 can comprise an enclosure 2501 in which various types of electronic components (e.g., processor, memory device, battery, etc.) may be provided. In some embodiments, for example, the local processing and data module 70 of FIG. 25A can be the same as the local processing and data modules 70 described above in connection with FIGS. 1-24C. For example, in some embodiments, the inlet ports 2504a-2504d may correspond to (or be generally similar to) the inlet ports 104a, 104b described above in connection with FIG. 3C, for example. In some embodiments, the inlet ports 2504a-2504d (and moveable members 2505) may be disposed along a periphery of the local processing and data module 70. In other embodiments, the local processing and data module 70 can be different from the above-described modules 70, and/or may include more or fewer enclosure(s), different types of components, etc. Further, although not illustrated in FIGS. 25A-25C, a fan assembly (which may be similar to or the same as the fan assemblies and fans described herein) can be provided in the enclosure 2501 to draw air into the enclosure 2501. One or more exhaust ports (also not shown in FIGS. 25A-25C can also be provided so that air can exit the enclosure 2501.

The module 70 of FIG. 25A can comprise a plurality of inlet ports 2504a-2504b positioned at various positions along the surface of the enclosure 2501 to provide selective and/or adjustable fluid communication between an interior of the enclosure 2501 (in which various electronic components can be provided) and the outside environs (e.g., ambient air). Although four inlet ports 2504a-2504d are shown in FIGS. 25A-25C, any suitable number of inlet ports may be provided (e.g., one, two, three, or more than four inlet ports). As with FIGS. 24A-24C, the inlet ports 2504a-2504d can comprise corresponding openings 2503 through which air can pass when the ports 2504a-2504d are at least partially open.

As explained herein, it can be desirable to detect portions of the module 70 or components of the module 70 that are at elevated temperatures during operation of the module 70, and to cool those portions or components to suitable operating temperatures. In some embodiments, for example, a temperature sensor (e.g., similar to the temperature sensors described herein in connection with FIGS. 16-24C) may determine that a particular region or component of the module 70 is at a temperature that exceeds a particular threshold. Processing electronics can determine that, based on the region or component that is at the elevated temperature, one or more of the inlet ports 2504a-2504d can be at least partially opened. For example, as shown in FIG. 25A, inlet port 2504a is illustrated as being fully opened (e.g., 0% occluded or otherwise providing maximum airflow) such that air pathway 2507a enables air to be drawn into port 2504a by the fan assembly to cool the region or component at elevated temperature. For example, the processing electronics may determine that components near the inlet port 2504a are at elevated temperatures, and that opening inlet port 2504a can beneficially reduce the temperatures of those components.

Further, as shown in FIG. 25A, movable members 2505 may at least partially occlude the openings 2503 of the inlet ports 2504b-2504d. As illustrated the movable members 2505 may fully occlude the openings 2503 of ports 2504b-2504d, or otherwise provide a minimal air flow through the ports 2504b-2504d. The movable members 2505 shown in FIG. 25A can be moved relative to the openings 2503 in any suitable manner. For example, in some embodiments, the movable members 2505 can be rotated relative to the openings 2503, similar to the embodiment shown and described in connection with FIGS. 24A-24C. In the illustrated embodiment, however, as described below, the movable members 2505 can be translated relative to the openings to selectively occlude the openings 2503. As explained herein, the movable members 2505 can move relative to the openings 2503 in a binary manner in some embodiments, such that the openings 2503 are either fully occluded (or otherwise at minimal airflow) or fully open (or otherwise at maximum airflow). In other embodiments, the movable members 2505 can move relative to the openings 2503 to provide a plurality of air flow cross-sections and flow rates (e.g., a continuous range of flow rates in some embodiments.

Turning to FIG. 25B, in some arrangements, it may be desirable to at least partially open a plurality of selected inlet ports 2504a, 2504c such that air flows along pathways 2507a, 2507c, and to selectively occlude one or more additional inlet ports 2504b, 2504d. For example, in some embodiments, components at or near the ports 2504a, 2504c may be at elevated temperatures such that it may be desirable to open both ports 2504a, 2504c. In some embodiments, the processing electronics can estimate or calculate the air flow profile through the local processing and data module 70 based on the arrangement of components in the module 70 and fluid dynamics concepts. The processing electronics may determine that opening ports 2504a, 2504c and occluding ports 2504b, 2504d results in a flow profile that effectively reduces the temperature of the component(s) at elevated temperature(s). As explained above, in various embodiments, the movable member 2505 can operate in a binary manner (for example, to fully occlude or fully open the port), or in a continuous manner (or otherwise provide for a plurality of flow rates).

FIG. 25C illustrates an arrangement in which port 2504a is fully open to expose air pathway 2507a, and in which port 2504d is fully occluded. Unlike FIGS. 25A-25B, in FIG. 25C, ports 2504b, 2504c can be only partially occluded (or partially open) to expose air pathways 2507b, 2507c. As shown in FIG. 25C, for example, port 2507c can be more open (less occluded) than port 2507b, so as to provide increased air flow as compared with port 2507b. In the embodiment of FIG. 25C, the movable members 2505 are illustrated as being translated relative to the openings 2503, e.g., in a shutter-like manner. For example, in some embodiments, a motor or other actuating mechanism can be configured to cause the movable members 2505 to translate relative to the opening 2503, for example, along a track or other mechanism. In other embodiments, however, the movable members 2505 can rotate relative to the openings 2503, such as in the embodiment of FIGS. 24A-24C.

Beneficially, the embodiments of FIGS. 25A-25C can provide adjustable airflow for one or a plurality of inlet ports. Based on temperature sensor data, selective inlet ports can be at least partially opened or occluded to direct more or less air flow towards particular regions or components of the module 70.

EXAMPLE EMBODIMENTS

Embodiment 1

An electronic device comprising:
a housing comprising:
    a first compartment in which a first electronic component is disposed;
    a second compartment in which a second electronic component is disposed, one or both of the first and second electrical components electrically communicating with another component of the electronic device; and
    a connection portion extending between the first and second compartments,
    wherein the first compartment is separated from the second compartment at a location spaced away from the connection portion by a gap to provide thermal separation between the first and second electronic components.

Embodiment 2

The electronic device of Embodiment 1, wherein the first electronic component comprises a processor.

Embodiment 3

The electronic device of any one of Embodiments 1 to 2, wherein the second electronic component comprises a power supply.

Embodiment 4

The electronic device of Embodiment 3, wherein the power supply comprises a battery.

Embodiment 5

The electronic device of any one of Embodiments 1 to 4, wherein the first compartment, the second compartment, and the connection portion are filled with a gas.

Embodiment 6

The electronic device of any one of Embodiments 1 to 5, wherein the connection portion comprises a channel between the first and second compartments.

Embodiment 7

The electronic device of Embodiment 6, wherein the channel has a side cross-sectional area that is smaller than a cross-sectional area of the first compartment taken along a direction parallel to a maximum dimension of the first compartment.

Embodiment 8

The electronic device of any one of Embodiments 1 to 7, wherein the electronic device comprises an augmented reality device.

Embodiment 9

The electronic device of Embodiment 8, further comprising a connector configured to connect to a headpiece to be worn by a user.

Embodiment 10

The electronic device of any one of Embodiments 1 to 9, wherein the first electronic component electrically communicates with the second electronic component.

Embodiment 11

The electronic device of any one of Embodiments 1 to 10, further comprising a clip disposed in the gap between the first and second compartments.

Embodiment 12

A portable electronic device comprising:
a housing;
a battery disposed in the housing, the battery supplying power for at least a portion of the portable electronic device;
electronic components for operating the portable electronic device, the electronic components disposed in the housing; and
a thermal mitigation assembly comprising a frame assembly, comprising:
  a shaft assembly having a first end and a second end opposite the first end, the first and second ends supported by the frame assembly;
  an impeller having fan blades coupled with a hub, the hub being coupled with the shaft assembly for rotation within the housing about a longitudinal axis of the shaft assembly;
  wherein loading transverse to the longitudinal axis of the shaft assembly is controlled by the frame assembly at the second end of the shaft assembly; and
  wherein the thermal mitigation assembly removes heat generated from one or both of the battery and the electronic components.

Embodiment 13

The power supply assembly of Embodiment 12, wherein the housing comprises a first enclosure and a second enclosure, the electronic components and the thermal mitigation assembly disposed in the first enclosure and the battery disposed in the second enclosure.

Embodiment 14

The power supply assembly of Embodiment 12 or 13, wherein the shaft assembly comprises a first shaft portion connected to a first frame of the frame assembly and a second shaft portion connected to a second frame of the frame assembly, the first and second shaft portions disposed at least partially on opposing sides of the hub.

Embodiment 15

A fan assembly, comprising:
a first support frame;
a shaft assembly having a first end coupled with the first support frame and a second end disposed away from the first end;
a second support frame coupled with the first support frame and disposed at or over the second end of the shaft assembly;
an impeller having fan blades coupled with a hub, the hub being disposed over the shaft assembly for rotation between the first and second support frames about a longitudinal axis;
wherein transverse loading on the shaft assembly is controlled by the first and second support frames.

Embodiment 16

The fan assembly of Embodiment 15, wherein the second support frame comprises an airflow opening disposed about the longitudinal axis which extends between the first and second ends of the shaft assembly.

Embodiment 17

The fan assembly of Embodiment 16, further comprising a shaft support coupled with the second end of the shaft assembly, the shaft support being rigidly attached to the second support frame across the airflow opening.

Embodiment 18

The fan assembly of Embodiment 17, wherein the shaft support is supported at respective first and second portions of the second support frame, the respective first and second portions spaced apart about a periphery of the airflow opening.

Embodiment 19

The fan assembly of Embodiment 18, wherein the first portion of the second support frame is generally on an opposite side of the airflow opening relative to the second portion of the second support frame.

Embodiment 20

The fan assembly of any one of Embodiments 17 to 19, wherein the shaft support is disposed in a rotational position of the airflow opening corresponding to a maximum of air flow when the impeller is operating.

Embodiment 21

The fan assembly of any one of Embodiments 17 to 20, wherein the shaft support comprises an elongate member between first and second ends thereof, the elongate member having an airfoil shape.

Embodiment 22

The fan assembly of any one of Embodiments 17 to 21, wherein the shaft support comprises an elongate member between the first and second ends thereof, the elongate member having varying width along the length thereof.

Embodiment 23

The fan assembly of any one of Embodiments 17 to 22, wherein the shaft support comprises an elongate member between the first and second ends thereof, the elongate member having varying thickness along the length thereof.

Embodiment 24

The fan assembly of any one of Embodiments 15 to 23, wherein the shaft assembly comprises a first shaft portion rotationally fixed to the first support frame and a second portion rotationally fixed to the impeller, the second portion being rotatable over a free end of the first shaft portion of the shaft assembly.

Embodiment 25

The fan assembly of any one of Embodiments 15 to 24, wherein the shaft assembly comprises an elongate member having a first end disposed on a first side of the impeller and a second end disposed on a second side of the impeller, the second side being opposite the first side.

Embodiment 26

The fan assembly of Embodiment 25, further comprising a concave member coupled with the second support frame and configured to rotationally support the second end of the elongate member.

Embodiment 27

The fan assembly of Embodiment 26, further comprising an additional concave member coupled with the first support frame and configured to rotationally support the first end of the elongate member.

Embodiment 28

The fan assembly of any one of Embodiments 16 to 27, wherein an airflow pathway of the fan assembly extends between the airflow opening disposed about the longitudinal axis and a second airflow opening having a face disposed about an axis non-parallel to the longitudinal axis.

Embodiment 29

The fan assembly of Embodiment 28, wherein the axis non-parallel to the longitudinal axis is disposed generally perpendicular to the longitudinal axis and along a radial-extending axis of the impeller.

Embodiment 30

A fan assembly, comprising:
an enclosure supporting a shaft assembly at a first end, the shaft having a second end opposite the first end;
an impeller having fan blades coupled with a hub, the hub being coupled with the shaft for rotation within the enclosure about a longitudinal axis;
wherein transverse loading on the shaft assembly is controlled by the enclosure at the second end of the shaft assembly.

Embodiment 31

A fan assembly comprising:
a housing comprising a shaft support and a shaft assembly supported by the shaft support;
an impeller disposed in the housing and coupled with the shaft assembly, the impeller configured to rotate about a longitudinal axis of the shaft assembly;
a first airflow opening disposed about the longitudinal axis;
a second airflow opening having a face disposed about an axis non-parallel to the longitudinal axis; and
an airflow pathway of the fan assembly extending between the first airflow opening and the second airflow opening,
wherein the shaft support comprises an elongate member extending across at least a portion of the first airflow opening, the elongate member angularly positioned across the first airflow opening at an angle relative to the non-parallel axis that permits at least a local maximum of airflow through the first airflow opening.

Embodiment 32

The fan assembly of Embodiment 31, wherein the angle relative to the non-parallel axis is acute.

Embodiment 33

The fan assembly of Embodiment 32, wherein the angle relative to the non-parallel axis is in a range of −45° to 45°.

Embodiment 34

The fan assembly of Embodiment 33, wherein the angle relative to the non-parallel axis is in a range of −30° to 30°.

Embodiment 35

A method of manufacturing a fan assembly, the method comprising:
providing a fan assembly comprising:
a housing;
an impeller disposed in the housing and coupled with a shaft assembly, the impeller configured to rotate about a longitudinal axis of the shaft assembly;
a first airflow opening disposed about the longitudinal axis; and
a second airflow opening having a face disposed about an axis non-parallel to the longitudinal axis, wherein an airflow pathway of the fan assembly extends between the first airflow opening and the second airflow opening;
computing an airflow profile through the fan assembly; and
based on the computing, providing a shaft support to support an end of the shaft assembly, the shaft support comprising an elongate member extending across at least a portion of the first airflow opening.

Embodiment 36

The method of Embodiment 35, further comprising, based on the computing, angularly positioning the elongate member at least partially across the first airflow opening at an angle relative to the non-parallel axis that permits at least a local maximum of airflow through the first airflow opening.

Embodiment 37

The method of Embodiment 36, wherein angularly positioning comprises orienting the angle relative to the non-parallel axis at an acute angle.

Embodiment 38

The method of Embodiment 37, wherein angularly positioning comprises orienting the angle relative to the non-parallel axis in a range of −45° to 45°.

Embodiment 39

The method of Embodiment 38, wherein angularly positioning comprises orienting the angle relative to the non-parallel axis in a range of −30° to 30°.

Embodiment 40

An electronic device comprising:
a temperature sensor configured to detect an over-temperature condition of the electronic device, the temperature sensor comprising an alert output terminal;
a power supply that supplies electrical power to a power input of the temperature sensor; and
a first transistor in electrical communication with the alert output terminal such that, when the alert output signal is activated by the temperature sensor, the first transistor causes the electronic device to shut down.

Embodiment 41

The electronic device of Embodiment 40, wherein the first transistor has an on state and an off state, and wherein the first transistor is configured to cause the electronic device to shut down when a signal from the alert output terminal places the first transistor in the off state.

Embodiment 42

The electronic device of Embodiment 40, wherein the on state of the first transistor comprises a high voltage at its gate, and wherein the off state comprises a low voltage at its gate.

Embodiment 43

The electronic device of any one of Embodiments 40 to 41, wherein the first transistor comprises a gate electrically connected to the alert output terminal, a source terminal connected to electrical ground, and a drain terminal connected to the power supply via a resistor.

Embodiment 44

The electronic device of any one of Embodiments 40 to 42, further comprising a second transistor having a gate electrically connected with the drain terminal of the first transistor and the power supply via the resistor, a source terminal connected to electrical ground, and a drain terminal.

Embodiment 45

The electronic device of Embodiment 44, further comprising a power management integrated circuit (PMIC) in electrical communication the drain terminal of the second transistor.

Embodiment 46

The electronic device of Embodiment 45, wherein the PMIC comprises a voltage output for supplying power to the electronic device, and a power management enable terminal having a low voltage state and a high voltage state.

Embodiment 47

The electronic device of Embodiment 46, further comprising a third transistor having a gate connected to a system shutdown signal, a source terminal connected to electrical ground, and a drain terminal electrically connected to the power management enable terminal of the PMIC.

Embodiment 48

The electronic device of Embodiment 47, wherein, when the power management enable terminal of the PMIC is in the low voltage state, the voltage output to the electronic device is shut down.

Embodiment 49

The electronic device of any one of Embodiments 40 to 48, wherein the electronic device comprises an augmented reality (AR) or virtual reality (VR) device.

Embodiment 50

An electronic device comprising:
a housing comprising processing electronics and an energy storage device;
a fan disposed in or coupled to the housing, the fan configured to cool the processing electronics and/or the energy storage device; and
one or a plurality of temperature sensors disposed in or on the housing, the one or a plurality of temperature sensors configured to measure a corresponding one or plurality of temperatures at or near one or more of the processing electronics and the energy storage device,
wherein a portion of the processing electronics is configured to compare the corresponding one or plurality of temperatures to predetermined temperature threshold(s) and, in response, to adjust a distribution of output flow of the fan.

Embodiment 51

The electronic device of Embodiment 50, further comprising a thermistor coupled to the housing, wherein if a temperature detected by the thermistor exceeds a predetermined threshold, the processing electronics causes the electronic device to shut down.

Embodiment 52

The electronic device of any one of Embodiments 50 to 51, wherein, based on the comparison, unsaved data is saved to a memory device, and the processing electronics causes the electronic device to shut down.

Embodiment 53

The electronic device of any one of Embodiments 50 to 51, further comprising a hardware thermal monitoring system configured to shut down the electronic device when a temperature measured by at least one temperature sensor exceeds a predetermined threshold.

Embodiment 54

The electronic device of any one of Embodiments 50 to 53, further comprising an adjustable inlet port, the output flow of the fan provided by adjusting an inlet size of the adjustable inlet port.

Embodiment 55

The electronic device of any one of Embodiments 50 to 54, wherein the electronic device comprises an augmented reality (AR) or virtual reality (VR) device.

Embodiment 56

The electronic device of any one of Embodiments 50 to 55, further comprising a controller configured to control a speed of the fan, the output flow of the fan provided by adjusting the speed of the fan.

Embodiment 57

The electronic device of any one of Embodiments 50 to 56 further comprising a plurality of inlet ports disposed along the electronic device.

Embodiment 58

The electronic device of Embodiment 57, wherein a portion of the processing electronics is configured to selectively and at least partially occlude one or more inlet ports of the plurality of inlet ports to adjust airflow through the electronic device.

Embodiment 59

The electronic device of Embodiment 58, further comprising a movable member configured to selectively and at least partially occlude the one or more inlet ports.

Embodiment 60

The electronic device of Embodiment 59, wherein the movable member is configured to rotate relative to an opening of the one or more inlet ports.

Embodiment 61

The electronic device of Embodiment 59, wherein the movable member is configured to translate relative to an opening of the one or more inlet ports.

Embodiment 62

An electronic device comprising:
an enclosure;
processing electronics within the enclosure; and
an inlet port in the enclosure to provide fluid communication between the processing electronics and the outside environs, wherein a portion of the processing electronics is configured to selectively and at least partially occlude one or more inlet ports of the plurality of inlet ports to adjust airflow through the electronic device.

Embodiment 63

The electronic device of Embodiment 62, further comprising a plurality of inlet ports disposed along the enclosure, the plurality of inlet ports comprising the inlet port.

Embodiment 64

The electronic device of Embodiment 63, wherein the processing electronics is configured to open different inlet ports by different amounts to selectively adjust the air flow into the enclosure.

Embodiment 65

The electronic device of Embodiment 64, further comprising one or more temperature sensors configured to detect corresponding one or more temperatures at one or more locations in the electronic device.

Embodiment 66

The electronic device of Embodiment 65, wherein the processing electronics is configured to selectively and at least partially occlude one or more inlet ports of the plurality of inlet ports based at least in part on the detected one or more temperatures.

Embodiment 67

The electronic device of any one of Embodiments 62 to 66, further comprising a movable member configured to selectively and at least partially occlude the inlet port.

Embodiment 68

The electronic device of Embodiment 67, wherein the movable member is configured to rotate relative to an opening of the inlet port.

Embodiment 69

The electronic device of Embodiment 67, wherein the movable member is configured to translate relative to an opening of the inlet port.

Additional Considerations

Any processes, methods, and algorithms described herein and/or depicted in the attached figures may be embodied in, and fully or partially automated by, code modules executed by one or more physical computing systems, hardware computer processors, application-specific circuitry, and/or electronic hardware configured to execute specific and particular computer instructions. For example, computing systems can include general purpose computers (e.g., servers) programmed with specific computer instructions or special purpose computers, special purpose circuitry, and so forth. A code module may be compiled and linked into an executable program, installed in a dynamic link library, or may be written in an interpreted programming language. In some implementations, particular operations and methods may be performed by circuitry that is specific to a given function.

Further, certain implementations of the functionality of the present disclosure are sufficiently mathematically, computationally, or technically complex that application-specific hardware or one or more physical computing devices (utilizing appropriate specialized executable instructions) may be necessary to perform the functionality, for example, due to the volume or complexity of the calculations involved or to provide results substantially in real-time. For example, a video may include many frames, with each frame having millions of pixels, and specifically programmed computer hardware is necessary to process the video data to provide a desired image processing task or application in a commercially reasonable amount of time.

Code modules or any type of data may be stored on any type of non-transitory computer-readable medium, such as physical computer storage including hard drives, solid state memory, random access memory (RAM), read only memory (ROM), optical disc, volatile or non-volatile storage, combinations of the same and/or the like. The methods and modules (or data) may also be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). The results of the disclosed processes or process steps may be stored, persistently or otherwise, in any type of non-transitory, tangible computer storage or may be communicated via a computer-readable transmission medium.

Any processes, blocks, states, steps, or functionalities in flow diagrams described herein and/or depicted in the attached figures should be understood as potentially representing code modules, segments, or portions of code which include one or more executable instructions for implementing specific functions (e.g., logical or arithmetical) or steps in the process. The various processes, blocks, states, steps, or functionalities can be combined, rearranged, added to, deleted from, modified, or otherwise changed from the illustrative examples provided herein. In some embodiments, additional or different computing systems or code modules may perform some or all of the functionalities described herein. The methods and processes described herein are also not limited to any particular sequence, and the blocks, steps, or states relating thereto can be performed in other sequences that are appropriate, for example, in serial, in parallel, or in some other manner. Tasks or events may be added to or removed from the disclosed example embodiments. Moreover, the separation of various system components in the implementations described herein is for illustrative purposes and should not be understood as requiring such separation in all implementations. It should be understood that the described program components, methods, and systems can generally be integrated together in a single computer product or packaged into multiple computer products. Many implementation variations are possible.

The processes, methods, and systems may be implemented in a network (or distributed) computing environment. Network environments include enterprise-wide computer networks, intranets, local area networks (LAN), wide area networks (WAN), personal area networks (PAN), cloud computing networks, crowd-sourced computing networks, the Internet, and the World Wide Web. The network may be a wired or a wireless network or any other type of communication network.

The invention includes methods that may be performed using the subject devices. The methods may comprise the act of providing such a suitable device. Such provision may be performed by the end user. In other words, the "providing" act merely requires the end user obtain, access, approach, position, set-up, activate, power-up or otherwise act to provide the requisite device in the subject method. Methods recited herein may be carried out in any order of the recited events which is logically possible, as well as in the recited order of events.

The systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure. Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. No single feature or group of features is necessary or indispensable to each and every embodiment.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Except as specifically defined herein, all technical and scientific terms used herein are to be given as broad a commonly understood meaning as possible while maintaining claim validity.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y and at least one of Z to each be present.

Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted can be incorporated in the example methods and processes that are schematically illustrated. For example, one or more additional operations can be performed before, after, simultaneously, or between any of the illustrated operations. Additionally, the operations may be rearranged or reordered in other implementations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A local processing and data module of an augmented reality or virtual reality system, the local processing and data module comprising:
    a portable housing comprising processing electronics and an energy storage device, the portable housing configured to be worn or carried by a user of the augmented reality or virtual reality system, the portable housing comprising a first chamber and a second chamber separate from the first chamber, the portable housing comprising a wall separating the first and second chambers, a channel extending through the wall to provide fluid communication between the first and second chambers, the processing electronics including an electronic component disposed in the first chamber, the energy storage device disposed in the second chamber;
    an inlet port provided in a periphery of the portable housing which opens directly to the outside environs of local processing and data module;
    a fan disposed in the portable housing within the first chamber of the portable housing remote from the inlet port, the fan configured to draw air into the portable housing from the outside environs via the inlet port to selectively cool the electronic component disposed in the first chamber and the energy storage device disposed in the second chamber;
    a movable member configured to move relative to the inlet port and further configured to selectively and at least partially occlude the inlet port to adjust airflow entering from the outside environs directly into the first chamber of the portable housing via the inlet port and proceeding through the local processing and data module; and
    one or a plurality of temperature sensors disposed in or on the portable housing, the one or a plurality of temperature sensors configured to measure a corresponding one or plurality of temperatures that are elevated due to operation of one or more of the processing electronics and the energy storage device,
    wherein a portion of the processing electronics is configured to compare the corresponding one or plurality of temperatures to one or a plurality of predetermined temperature thresholds and, in response, to adjust a distribution of output flow of the fan.

2. The local processing and data module of claim 1, further comprising a controller configured to control a speed of the fan, the output flow of the fan provided by adjusting the speed of the fan.

3. The local processing and data module of claim 1, further comprising a plurality of inlet ports disposed along the periphery of the electronic device, the plurality of inlet ports comprising the inlet port.

4. A local processing and data module of an augmented reality or virtual reality system, the local processing and data module comprising:
    a portable housing comprising an enclosure, the portable housing configured to be worn or carried by a user of the augmented reality or virtual reality system;
    processing electronics within the enclosure;
    an inlet port provided in a periphery of the enclosure which opens directly to the outside environs of the local processing and data module to provide fluid communication between the processing electronics within the enclosure and the outside environs;
    a movable member configured to move relative to the inlet port and further configured to selectively and at least partially occlude the inlet port; and
    a fan disposed in the enclosure of the portable housing remote from the inlet port and within a same chamber of the enclosure as at least one electronic component of the processing electronics, the fan configured to draw air into the enclosure of the portable housing from the outside environs via the inlet port to cool the at least one electronic component of the processing electronics that is in the same chamber of the enclosure as the fan.

5. The local processing and data module of claim 4, further comprising a plurality of inlet ports disposed along the periphery of the enclosure, the plurality of inlet ports comprising the inlet port.

6. The local processing and data module of claim 5, further comprising one or more temperature sensors configured to detect corresponding one or more temperatures at one or more locations in the local processing and data module, wherein the processing electronics is configured to open different inlet ports by different amounts to selectively adjust the air flow into the enclosure.

7. The local processing and data module of claim 6, wherein the processing electronics is configured to selectively and at least partially occlude one or more inlet ports of the plurality of inlet ports based at least in part on the detected one or more temperatures.

8. The local processing and data module of claim 2, wherein the controller is configured to activate the fan at a first speed when a first measured temperature of the one or plurality of temperatures exceeds a first threshold of the one or the plurality of predetermined temperature thresholds.

9. The local processing and data module of claim 8, wherein the controller is configured to activate the fan at a second speed less than the first speed when the first measured temperature is less than a second threshold different from the first threshold.

10. The local processing and data module of claim 8, wherein the controller is configured to activate the fan at a third speed greater than the first speed when a second measured temperature of the one or plurality of temperatures exceeds a third threshold of the one or the plurality of predetermined temperature thresholds.

11. The local processing and data module of claim 10, wherein the controller is configured to activate the fan at a fourth speed greater than the first speed but less than the third speed when a third measured temperature of the one or plurality of temperatures exceeds a fourth threshold of the one or the plurality of predetermined temperature thresholds.

12. The local processing and data module of claim 8, wherein the first measured temperature comprises a maximum temperature measured by the one or the plurality of temperature sensors.

13. The local processing and data module of claim 8, wherein the first measured temperature comprises an average temperature measured by the one or the plurality of temperature sensors.

14. The local processing and data module of claim 1, wherein the one or the plurality of temperature sensors comprises a thermistor.

15. The local processing and data module of claim 1, further comprising a first channel in fluid communication with the first chamber, a second channel in fluid communication with the second chamber, and at least one baffle to controllably direct airflow to the first and second channels.

16. The local processing and data module of claim 15, further comprising a common channel providing fluid communication between the fan and the first and second channels and at least one additional baffle that controls airflow through the common channel.

17. The local processing and data module of claim 1, wherein the fan is configured to selectively direct airflow into at least one of the first and second chambers.

18. The local processing and data module of claim 17, wherein the fan is moveable between a first position that directs the airflow into the first chamber and a second position that directs the airflow into the second chamber.

19. The local processing and data module of claim 1, wherein the portable housing comprises a first compartment including the first chamber and a second compartment comprising the second chamber, the first compartment separated from the second compartment by a gap.

20. The local processing and data module of claim 19, wherein the portable housing further comprises a connection portion extending between the first and second compartments, the connection portion comprising a channel that connects the first and second chambers.

* * * * *